(12) United States Patent
Kato

(10) Patent No.: US 9,842,842 B2
(45) Date of Patent: Dec. 12, 2017

(54) SEMICONDUCTOR MEMORY DEVICE AND SEMICONDUCTOR DEVICE AND ELECTRONIC DEVICE HAVING THE SAME

(71) Applicant: Semiconductor Energy Laboratory Co., Ltd., Atsugi-shi, Kanagawa-ken (JP)

(72) Inventor: Kiyoshi Kato, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/659,714

(22) Filed: Mar. 17, 2015

(65) Prior Publication Data
US 2015/0270270 A1 Sep. 24, 2015

(30) Foreign Application Priority Data
Mar. 19, 2014 (JP) .................... 2014-056150

(51) Int. Cl.
*H01L 27/108* (2006.01)
*H01L 29/786* (2006.01)
*G11C 11/403* (2006.01)

(52) U.S. Cl.
CPC ...... *H01L 27/10897* (2013.01); *G11C 11/403* (2013.01); *H01L 27/10811* (2013.01);
(Continued)

(58) Field of Classification Search
CPC ......... H01L 27/10897; H01L 27/10894; H01L 27/10811; H01L 29/78696; H01L 29/7869;
(Continued)

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2226847 A 9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Julio J Maldonado
*Assistant Examiner* — Stanetta Isaac
(74) *Attorney, Agent, or Firm* — Fish & Richardson P.C.

(57) ABSTRACT

A memory cell includes a node and first transistor to third transistors. The third transistor and the second transistor are electrically connected to a fourth wiring and a third wiring in series, respectively. A gate of the third transistor is electrically connected to a second wiring. A gate of the second transistor is electrically connected to the node. In the first transistor, a gate is electrically connected to a first wiring, one of a source and a drain is electrically connected to the fourth wiring, and the other of the source and the drain is electrically connected to the node. The first transistor includes an oxide semiconductor layer where a channel is formed and a channel length and a channel width thereof are each shorter than 100 nm. A maximum potential of the first wiring is lower than or equal to 2 V.

16 Claims, 28 Drawing Sheets

(52) U.S. Cl.
CPC .... *H01L 27/10894* (2013.01); *H01L 29/7869* (2013.01); *H01L 29/78648* (2013.01); *H01L 29/78696* (2013.01)

(58) Field of Classification Search
CPC ........... H01L 29/78648; H01L 27/1225; H01L 29/242; H01L 2924/1067; H01L 21/16; G11C 11/403
See application file for complete search history.

(56) References Cited

U.S. PATENT DOCUMENTS

| | | | |
|---|---|---|---|
| 5,977,562 A | 11/1999 | Hirakata et al. | |
| 6,268,617 B1 | 7/2001 | Hirakata et al. | |
| 6,294,274 B1 | 9/2001 | Kawazoe et al. | |
| 6,314,017 B1 | 11/2001 | Emori et al. | |
| 6,563,174 B2 | 5/2003 | Kawasaki et al. | |
| 6,621,102 B2 | 9/2003 | Hirakata et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,375,399 B2 | 5/2008 | Ishii et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,289,753 B2 | 10/2012 | Yamazaki et al. | |
| 8,659,934 B2 | 2/2014 | Yamazaki et al. | |
| 8,710,749 B2 | 4/2014 | Kimura | |
| 8,811,067 B2 | 8/2014 | Yamazaki et al. | |
| 8,860,108 B2 | 10/2014 | Yamazaki et al. | |
| 8,896,042 B2 | 11/2014 | Yamazaki et al. | |
| 8,901,828 B2 | 12/2014 | Kimura | |
| 9,082,670 B2 | 7/2015 | Kimura | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0101351 A1 | 5/2011 | Yamazaki | |
| 2012/0294070 A1* | 11/2012 | Matsuzaki | G11C 11/404 365/149 |
| 2013/0292671 A1 | 11/2013 | Yamazaki et al. | |
| 2013/0293263 A1* | 11/2013 | Kurokawa | H03K 19/094 326/41 |
| 2014/0326999 A1 | 11/2014 | Yamazaki et al. | |
| 2015/0179810 A1* | 6/2015 | Yamazaki | H01L 29/78606 257/43 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-093988 A | 4/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-012878 A | 1/2006 |

(56) References Cited

FOREIGN PATENT DOCUMENTS

JP            2011-119675 A     6/2011
WO    WO-2004/114391            12/2004

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and SC2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

(56) References Cited

OTHER PUBLICATIONS

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Pasivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

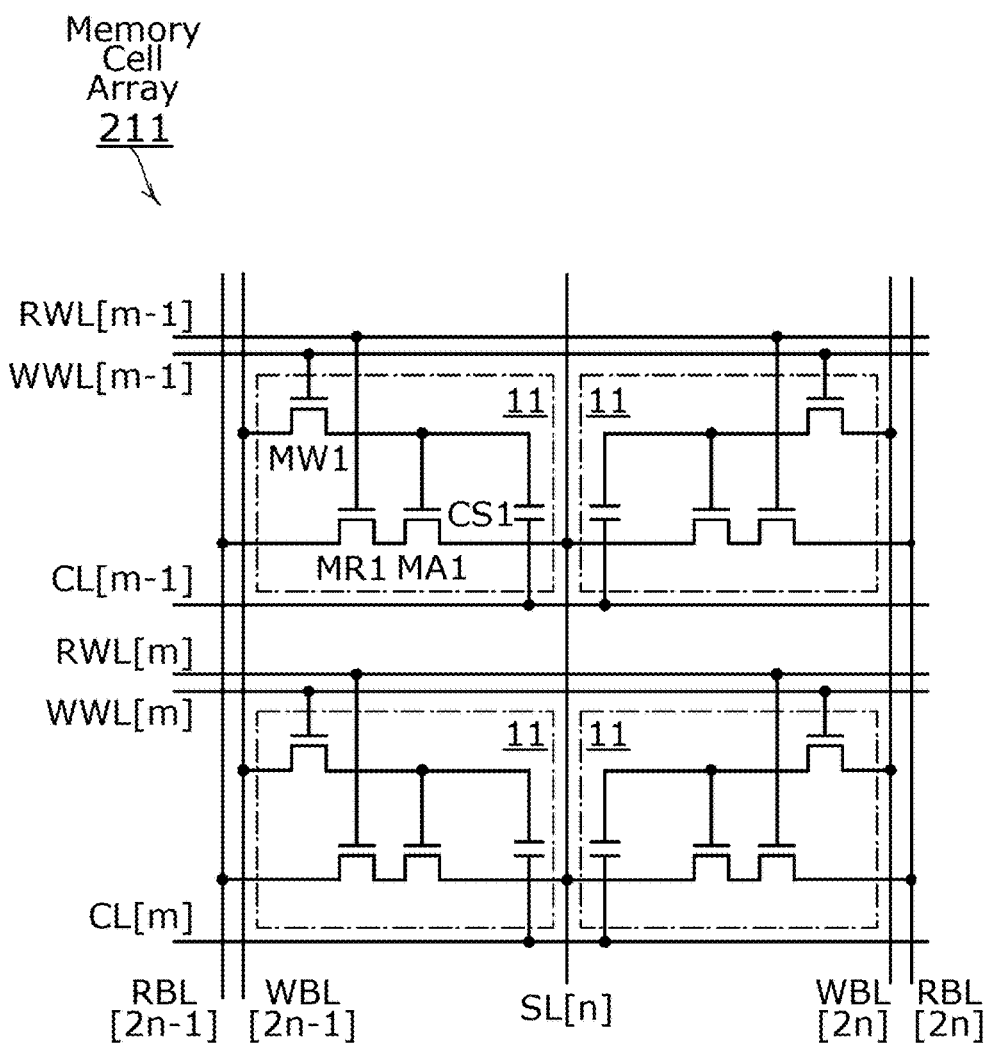

[WRITING]

[READING]

[WRITING]

[READING]

SEMICONDUCTOR MEMORY DEVICE AND SEMICONDUCTOR DEVICE AND ELECTRONIC DEVICE HAVING THE SAME

BACKGROUND OF THE INVENTION

1. Field of the Invention

One embodiment of the present invention relates to a semiconductor memory device including a semiconductor or another semiconductor device, a driving method thereof, a manufacturing method thereof, and the like.

Note that one embodiment of the present invention is not limited to the above technical field. The technical field of one embodiment of the invention disclosed in the specification, the drawings, and the claims (hereinafter referred to as "this specification and the like") relates to an object, a method, or a manufacturing method. Furthermore, one embodiment of the present invention relates to a process, a machine, manufacture, or a composition of matter. Specifically, examples of the technical field of one embodiment of the present invention disclosed in this specification and the like include a semiconductor device, a display device, a liquid crystal display device, a light-emitting device, a lighting device, a power storage device, a storage device, a method of driving any of them, and a method of manufacturing any of them.

2. Description of the Related Art

In a general dynamic random access memory (DRAM), a memory cell includes one transistor (1T) and one capacitor (1C). Such a 1T1C DRAM is a memory capable of retaining data by accumulating electric charge in a capacitor and thus has no limit on the number of times of writing in principle. As a high-capacity memory device, the DRAM is incorporated in a number of electronic devices because of writing and reading at relatively high speed and a small number of memory cells, which easily enable high integration. The 1T1C DRAM performs data reading in such a manner that electric charge accumulated in the capacitor is released to a bit line and a change in a potential is measured; therefore, the electrostatic capacitance of the capacitor needs to be kept at a certain value or more. As a result, miniaturization of its memory cell makes it more and more difficult to keep necessary electrostatic capacitance.

Besides the 1TC1C memory cell, a memory cell called a gain cell including two or three transistors has been proposed (e.g., Patent Document 1 and 2). In the gain cell, the amount of electric charge can be amplified by a read transistor and the electric charge can be supplied to a bit line; therefore, it is possible to reduce the capacitance of the capacitor.

It has been also proposed to use a transistor including an oxide semiconductor layer having a region where a channel is formed (hereinafter referred to as an "OS transistor") as a write transistor in a gain cell (e.g., Patent Document 3). In Patent Document 3, even when power is not supplied, stored data can be retained by utilizing a characteristic of extremely small off-state current of the OS transistor.

REFERENCE

Patent Document

[Patent Document 1] Japanese Published Patent Application No. 2001-093988
[Patent Document 2] Japanese Published Patent Application No. 2006-012878
[Patent Document 3] Japanese Published Patent Application No. 2011-119675

SUMMARY OF THE INVENTION

An object of one embodiment of the present invention is to provide a novel semiconductor device or a novel method of driving or manufacturing the semiconductor device. For example, an object of one embodiment of the present invention is to provide a semiconductor memory device or another semiconductor device with reduced power consumption or a method of driving or manufacturing these devices; a semiconductor memory device or another semiconductor device capable of improving writing speed or a method of driving or manufacturing these devices; or a semiconductor memory device or another semiconductor device capable of lengthening a retention time or a method of driving or manufacturing these devices.

Note that other objects will be apparent from the description of the specification and the like, and other objects of embodiments of the present invention can be derived from the description of the specification and the like. One embodiment of the present invention does not necessarily achieve all the objects.

One embodiment of the present invention is a semiconductor memory device including a first wiring, a second wiring, a third wiring, and a fourth wiring; and a memory cell. The memory cell includes a node; and a first transistor, a second transistor, and a third transistor. The third transistor and the second transistor are electrically connected to the fourth wiring and the third wiring in series, respectively. A gate of the third transistor is electrically connected to the second wiring. A gate of the second transistor is electrically connected to the node. A gate of the first transistor is electrically connected to the first wiring, one of a source and a drain of the first transistor is electrically connected to the fourth wiring, and the other of the source and the drain is electrically connected to the node. The first transistor includes an oxide semiconductor layer where a channel is formed. A channel length and a channel width of the first transistor are each shorter than 100 nm. A maximum potential which is lower than or equal to 2 V is applied to the first wiring.

In this specification and the like, ordinal numbers such as first, second, and third are used to avoid confusion among components, and the terms do not limit the components numerically.

Note that in this specification and the like, a semiconductor device refers to a device that utilizes semiconductor characteristics, and means a circuit including a semiconductor element (e.g., a transistor or a diode), a device including the circuit, and the like. The semiconductor device also means any device that can function by utilizing semiconductor characteristics. For example, an integrated circuit and a chip including an integrated circuit are all semiconductor devices. Moreover, a storage device, a display device, a light-emitting device, a lighting device, an electronic device, and the like include a semiconductor device in some cases.

A transistor includes three nodes (terminals) called a gate, a source, and a drain. A gate is a node that controls the conduction state of a transistor. Depending on the channel type of the transistor or levels of potentials applied to the nodes (terminals), one of nodes (an input node and an output node) functions as a source and the other functions as a drain. In general, in an n-channel transistor, a node to which a low potential is applied is referred to as a source, and a node to which a high potential is applied is referred to as a drain. In contrast, in a p-channel transistor, a node to which a low potential is applied is referred to as a drain, and a node to which a high potential is applied is referred to as a source.

In this specification and the like, to clarify a circuit configuration and circuit operation, one of two nodes (an input node and an output node) of a transistor is fixed as a source and the other is fixed as a drain in some cases. It is needless to say that, depending on a driving method, the magnitude relationship between potentials applied to three terminals of the transistor might be changed, and the source and the drain might be interchanged. Thus, in one embodiment of the present invention, the distinction between the source and drain of the transistor is not limited to that described in this specification and the drawings.

Note that information about description in this specification and the like such as information about a source and drain of a transistor is added in Example 1.

A novel semiconductor device or a novel method of driving or manufacturing the semiconductor device can be provided. For example, a semiconductor memory device or another semiconductor device with reduced power consumption or a method of driving or manufacturing these devices; a semiconductor memory device or another semiconductor device capable of improving writing speed or a method of driving or manufacturing these devices; or a semiconductor memory device or another semiconductor device capable of lengthening a retention time or a method of driving or manufacturing these devices can be provided.

Note that the description of these effects does not disturb the existence of other effects. In one embodiment of the present invention, there is no need to achieve all the effects described above. In one embodiment of the present invention, an object other than the above objects, an effect other than the above effects, and a novel feature will be apparent from the description of the specification and the drawings.

BRIEF DESCRIPTION OF THE DRAWINGS

FIG. 2 is a circuit diagram illustrating an example of a memory cell array configuration.

DETAILED DESCRIPTION OF THE INVENTION

Figure 1:
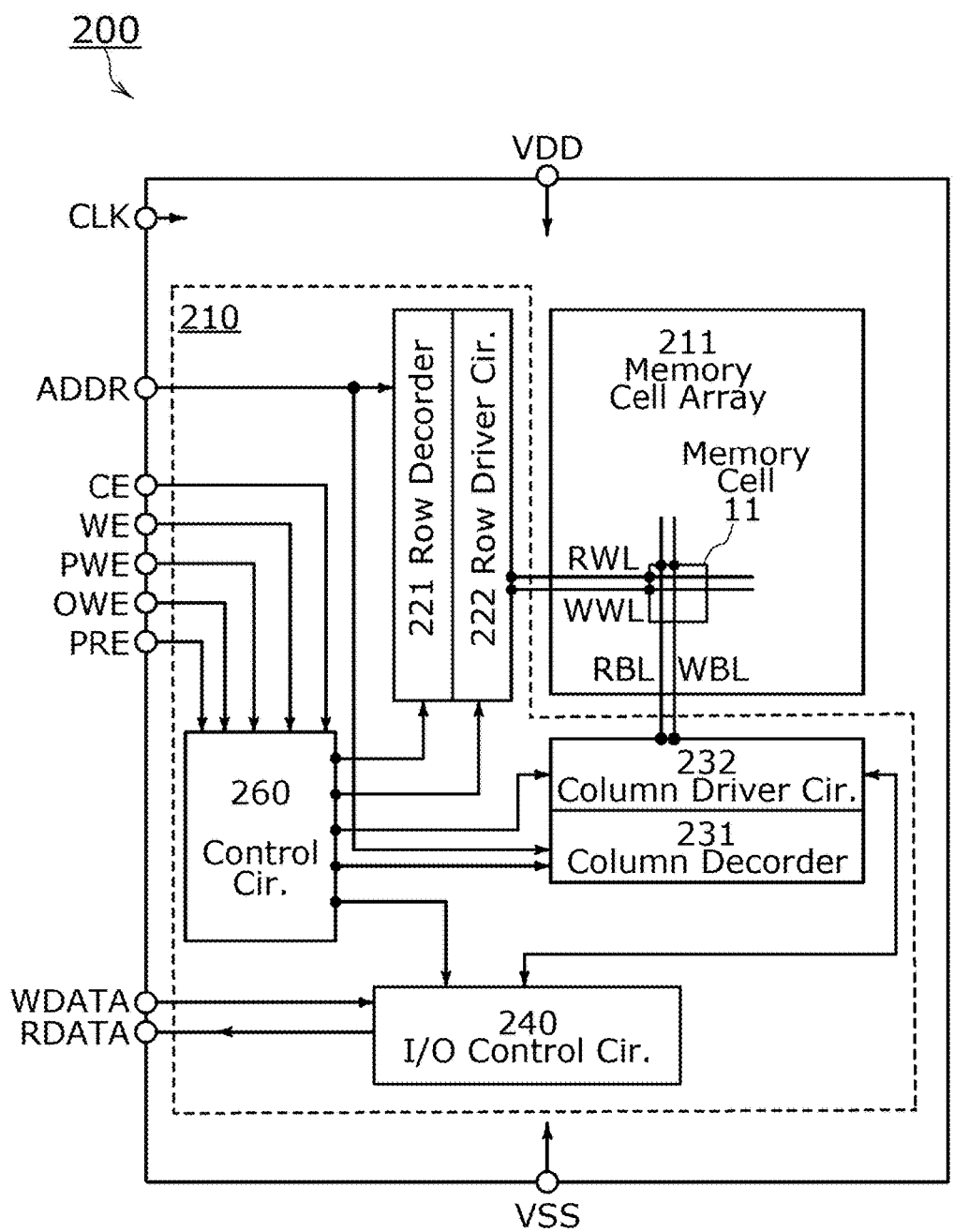
FIG. 1 is a block diagram illustrating an example of a semiconductor memory device configuration.

Embodiments and an example of the present invention will be described below. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments and example.

The same elements or elements having similar functions, elements formed using the same material, elements formed at the same time, or the like in the drawings are denoted by the same reference numerals, and the description thereof is not repeated in some cases. When the same reference numerals need to be distinguished from each other, "_1", "_2", "[n]", "[m, n]", or the like is added to the reference numerals in some cases. For example, in the case where a plurality of wirings WWL in a memory cell array are individually distinguished from each other, the wiring WWL in the second row is described as WWL[2] using an address number (row number) of the memory cell array.

In this specification, for example, clock signal CLK is abbreviated to a "signal CLK", "CLK", or the like in some cases. The same applies to other components (e.g., signal, voltage, potential, circuit, element, electrode, and wiring).

Embodiments and an example of the present invention are described below, and any of the embodiments and example can be combined as appropriate. In addition, in the case where some structure examples are given in one embodiment or example, any of the structure examples can be combined as appropriate.

Embodiment 1

In this embodiment, a semiconductor memory device will be described as an example of a semiconductor device.

<<Structure Example of Semiconductor Memory Device>>

FIG. 1 is a block diagram illustrating a configuration example of the semiconductor memory device. A semiconductor memory device 200 illustrated in FIG. 1 can be used as a RAM.

The semiconductor memory device 200 includes a peripheral circuit 210 and a memory cell array 211. In the memory cell array 211, a plurality of memory cells 11 are arranged in an array. The memory cell 11 is connected to a wiring WWL, a wiring RWL, a wiring WBL, and a wiring RBL. The peripheral circuit 210 includes, for example, a row decoder 221, a row driver circuit 222, a column decoder 231, a column driver circuit 232, an input/output (I/O) control circuit 240, and a control circuit 260.

As power supply potentials, a low power supply potential VSS and a high power supply potential VDD are input to the semiconductor memory device 200 from the outside. Furthermore, a clock signal CLK, control signals CE, WE, PWE, OWE, and PRE, an address signal ADDR, and a data signal WDATA are input to the semiconductor memory device 200 from the outside. The address signal ADDR is input to the row decoder 221 and the column decoder 231, and WDATA is input to the I/O control circuit 240.

The I/O control circuit 240 has functions of controlling writing of the data signal WDATA to the memory cell array 211, controlling reading of data from the memory cell array 211, and generating and outputting a data signal RDATA from data read from the memory cell array 211, for example.

The row decoder 221 has a function of generating a signal that selects a row of the memory cell array 211, to which data is written and from which data is read. Specifically, the row driver circuit 222 has a function of generating a signal that drives or selects the wiring WWL and the wiring RWL in accordance with the selection signal generated in the row decoder 221. That is, the potentials of the wiring WWL and the wiring RWL are controlled by the row driver circuit 222.

The column decoder 231 has a function of generating a signal that selects a column of the memory cell array 211, to which data is written and from which data is read. The column driver circuit 232 has a function of selecting a row of the memory cell array 211, to which data is written and from which data is read, in accordance with control by the I/O control circuit 240. Specifically, the column driver circuit 232 has functions of generating a signal that drives the wiring WBL, bringing the wiring RBL into an electrically floating state, generating a signal that drives a wiring SL, temporarily retaining data read from the memory cell array 211, and retaining a data signal output from the I/O control circuit 240.

The control circuit 260 is a circuit for controlling the whole semiconductor memory device 200. The control circuit 260 processes the signals CE, WE, PWE, OWE, and PRE input from the outside and generates control signals of circuits included in the peripheral circuit 210. A chip enable signal is referred to as CE, and write enable signals are referred to as WE, PWE, and OWE. The write enable signal WE allows data to be written from the I/O control circuit 240 to the column driver circuit 232. The write enable signal PWE allows data to be written from the column driver circuit 232 to the memory cell array 211. The write enable signal OWE allows data to be written from the column driver circuit 232 to the I/O control circuit 240. A read enable signal, which is referred to as PRE, allows data to be read from the memory cell array 211 to the column driver circuit 232. The signals that the control circuit 260 processes are not limited to them. If necessary, another control signal may be input to the control circuit 260, or the above signals are not necessarily input.

<<Memory Cell Array>>

FIG. 2 is a block diagram illustrating a configuration example of the memory cell array 211.

As illustrated in FIG. 2, the memory cell array 211 includes a plurality of memory cells 11 and a plurality of wirings WWL, RWL, WBL, RBL, SL, and CL. In the memory cell array 211, a plurality of memory cells 11 are arranged in an array. In FIG. 2, the memory cells 11 at 2 rows×2 columns are typically illustrated. Symbols such as [m] and [2n−1] which are given to the reference numerals in FIG. 2 indicate a row number (row address) or a column number (column address). Here, m is an integer greater than or equal to 2 and n is an integer greater than or equal to 1.

In accordance with the arrangement of the memory cells 11, the memory cell array 211 is provided with the wiring WWL, the wiring RWL, and the wiring CL in each row and with the wiring WBL, the wiring RBL, and the wiring SL in each column. The memory cells 11 in the same row are electrically connected to the row driver circuit 222 by the wiring WWL and the wiring RWL in the same row, and the memory cells 11 in the same column are electrically connected to the column driver circuit 232 by the wiring WBL, the wiring RBL, and the wiring SL in the same column. In FIG. 2, an example in which one wiring SL is shared by adjacent two columns is illustrated.

In the case where the potential of the wiring CL is changed in accordance with the operation of the semiconductor memory device 200, for example, the wiring CL may be electrically connected to the row driver circuit 222, and a signal output to the wiring CL is generated in the row driver circuit 222. In the case where a constant potential is supplied to the wiring CL at the operation of the semiconductor memory device 200, all of the wirings CL in the memory cell array 211 is electrically connected to a wiring for supplying a predetermined constant potential (potential supply line). In the case where the potential of the wiring SL is changed in accordance with the operation of the semiconductor memory device 200, for example, the wiring SL is electrically connected to the column driver circuit 232, and a signal output to the wiring SL is generated in the column driver circuit 232. In the case where the potential of the wiring SL is kept constant at the operation of the semiconductor memory device 200, all of the wirings SL in the memory cell array 211 may be electrically connected to a wiring for supplying a predetermined fixed potential (potential supply line).

<<Configuration Example 1 of Memory Cell>>

Figure 3A:
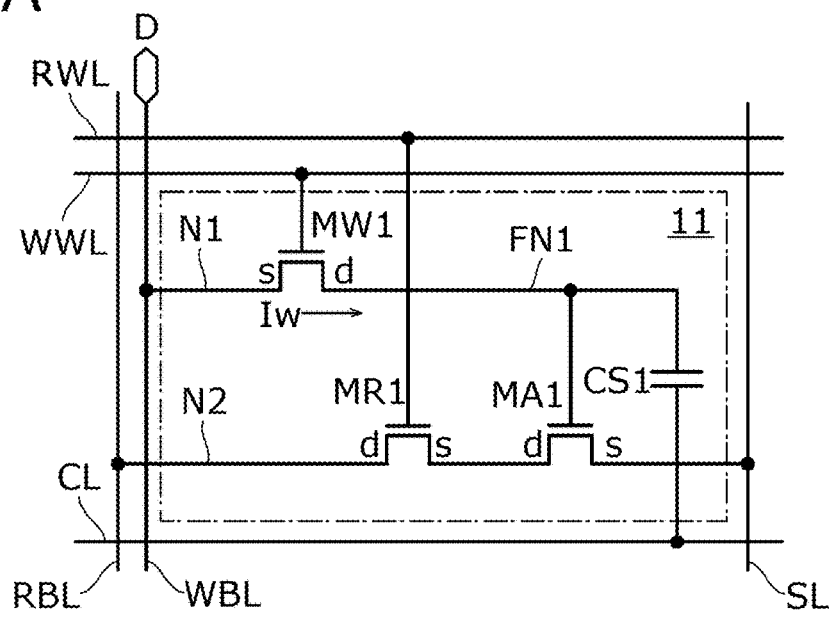
FIG. 3A is a circuit diagram illustrating an example of a memory cell configuration.

FIG. 3A is a circuit diagram illustrating a configuration example of the memory cell 11. As illustrated in FIG. 3A, the memory cell 11 is electrically connected to the wirings WWL, RWL, WBL, RBL, SL, and CL. The memory cell 11 includes a transistor MW1, a transistor MR1, a transistor MA1, a capacitor CS1, a node N1, a node N2, and a node FN1. As illustrated in FIG. 3A, a source (s) and a drain (d) of each of the transistors MW1, MR1, and MA1 are distinguished from each other in the following description.

A data signal D written to the memory cell 11 is input to the wiring WBL. The node FN1 can function as a storage node that retains a potential corresponding to the data signal D and is electrically connected to a gate of the transistor MA1. The node N1 functions as an input node of the data signal D written to the memory cell 11 and is electrically connected to the wiring WBL. The node N2 functions as an output node from which data retained in the memory cell 11 is output and is electrically connected to the wiring RBL.

The wiring WWL can function as a writing word line, and a signal that controls the conduction state of the transistor MW1 (a writing control signal) is input to the wiring WWL. The wiring RWL can function as a reading word line, and a signal that controls the conduction state of the transistor MR1 (a reading control signal) is input to the wiring RWL. A signal that controls the potential of a source of the transistor MA1 is input to the wiring SL. With the potential of the wiring SL, a gate-source voltage of the transistor MA1 can be adjusted. Note that in this specification, a constant potential such as a power supply potential is included in the category of a signal.

The transistor MW1 can function as a writing transistor. The transistor MR1 and the transistor MA1 can function as reading transistors. The transistor MR1 can function as a switch, and the transistor MA1 can function as an amplifying transistor that amplifies the voltage retained in the node FN1.

A gate of the transistor MW1 is electrically connected to the wiring WWL, the source thereof is electrically connected to the wiring WBL, and the drain thereof is electrically connected to the node FN1. In accordance with a signal (potential) input from the wiring WWL, the transistor MW1 can function as a switch that controls the conduction state between the node N1 and the node FN1. In accordance with a signal (potential) input from the wiring WWL, the transistor MW1 can function as a current source that supplies electric charge to the node FN1. A gate of the transistor MR1 is electrically connected to the wiring RWL, the drain thereof is electrically connected to the node N2 (wiring BL), and the source thereof is electrically connected to a drain of the transistor MA1. In accordance with a signal (potential) input from the wiring RWL, the transistor MR1 can function as a switch that controls the conduction state between the node N2 and the node FN1. The transistor MA1 is electrically connected to the transistor MR1 in series, the gate thereof is electrically connected to the node FN1, and the source thereof is electrically connected to the wiring SL.

The capacitor CS1 can function as a storage capacitor for retaining the potential of the node FN1. In a pair of terminals (nodes) of the capacitor CS1, one terminal is electrically connected to the node FN1 and the other terminal is electrically connected to the wiring CL. As illustrated in FIG. 3A, the wiring CL and the node FN1 are capacitively coupled to each other via the capacitor CS1; therefore, the potential of the node FN1 can be changed in accordance with the potential of the wiring CL. That is, the capacitor CS1 can function as a capacitive capacitor, and the wiring CL can function as a signal supply line (potential supply line) for supplying a signal (potential) to one terminal of the capacitor CS1.

Figure 3B:
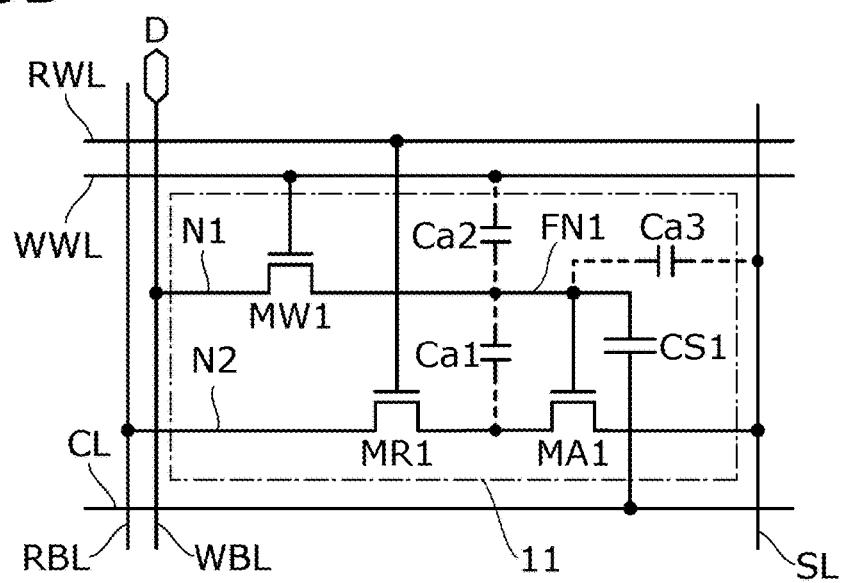
FIG. 3B is a circuit diagram illustrating coupling capacitance of storage nodes in a memory cell.

The capacitance of the capacitor coupled with the node FN1 is combined capacitance of the capacitor CS1 which is intentionally provided and parasitic capacitance of the node FN1. As illustrated in FIG. 3B, parasitic capacitance Ca1 (gate capacitance of the transistor MA1), parasitic capacitance Ca2 between the wiring WWL and the node FN1, and parasitic capacitance Ca3 between the wiring SL and the node FN1 can be given as the parasitic capacitance of the node FN1. In the example of FIG. 3B, the electrostatic capacitance (hereinafter referred to as capacitance) of coupling capacitance CCfn1 of the node FN1 corresponds to the sum of the capacitance of the capacitor CS1, and parasitic capacitance Ca1, Ca2, and Ca3.

Thus, even without the capacitor CS1, the potential of the node FN1 can be retained during a predetermined period (e.g., one second or longer) by electric charge which is accumulated in the parasitic capacitance through the writing operation. When the node FN1 is capacitively coupled to the wiring CL to write, read, or retain data and there is no need to change the potential of the node FN1, the capacitor CS1 and the wiring CL can be omitted. This will be described later.

(Writing Operation)

Data is written to the memory cell 11 in such a manner that the transistor MR1 is turned off, the transistor MW1 is turned on, and the node FN1 is connected to the node N1 (wiring WBL). The data signal D is input to the wiring WBL. A drain-source current 1w (hereinafter referred to as a drain current in some cases) flows through the transistor MW1 in accordance with the data signal D; therefore, the node FN1 is charged. After the transistor MW1 is on for a certain period, the potential of the wiring WWL is controlled to turn off the transistor MW1. Accordingly, the node FN1 is brought into an electrically floating state and thus its potential corresponds to the potential of the data signal D. After that, the potential of the wiring WBL is set to the value in a data retention state. Accordingly, the writing operation is terminated, and the memory cell 11 is brought into a retention state in which the potential of the WBL is retained in the node FN1.

(Reading Operation)

Data is read in such a manner that the transistor MW1 is turned off and the transistor MR1 is turned on. First, the potentials of the wirings RBL and SL are controlled. Precharge operation is performed on the wiring RBL to make the potential constant and then the wiring RBL is brought into an electrically floating state. At this time, a drain current corresponding to a potential difference between the node FN1 and the wiring SL flows through the transistor MA1. Then, the potential of the wiring RWL is controlled, the transistor MR1 is turned on, and a portion between the node N2 (wiring RBL) and the source is brought into conduction. Accordingly, the amount of electric charge accumulated in the wiring BL is changed in accordance with the drain current of the transistor MA1 and the potential of the wiring BL is changed. The value of data read from the memory cell 11 is detected in such a manner that the transistor MR1 is turned off, the column driver circuit 232 is electrically connected to the wiring RBL, and the potential (or the amount of potential change) of the wiring RBL is measured.

To reduce the frequency of refresh operation of the memory cell 11, it is preferable that a drain current in an off state (off-state current) of the transistor MW 1 be low as much as possible. To achieve a transistor with an extremely low off-state current, a semiconductor layer where a channel is formed may have a band gap greater than or equal to 2.5 eV and a carrier concentration less than or equal to $1 \times 10^{14}$ $cm^{-3}$, for example. A semiconductor layer having such characteristics is, for example, an oxide semiconductor layer. It is extremely effective to use an OS transistor as the transistor MW1 because the frequency of refresh operation of the memory cell 11 can be reduced. In the OS transistor, a normalized off-state current per micrometer of a channel width at a source-drain voltage of 10 V can be less than or equal to $10 \times 10^{-21}$ A (10 zA (zeptoampere)).

In an OS transistor used in the semiconductor memory device 200, an oxide semiconductor (OS) layer including a region where a channel is formed may be formed using a single oxide semiconductor film or two or more oxide semiconductor films. The oxide semiconductor film included in the OS layer is preferably formed with an oxide semiconductor containing at least one element selected from In, Ga, Sn, and Zn. As such an oxide, an In—Sn—Ga—Zn oxide, an In—Ga—Zn oxide, an In—Sn—Zn oxide, an In—Al—Zn oxide, a Sn—Ga—Zn oxide, an Al—Ga—Zn oxide, a Sn—Al—Zn oxide, an In—Zn oxide, a Sn—Zn oxide, an Al—Zn oxide, a Zn—Mg oxide, a Sn—Mg oxide, an In—Mg oxide, an In—Ga oxide, an In oxide, a Sn oxide, a Zn oxide, or the like can be used. Furthermore, any of the above oxides may contain an element other than In, Ga, Sn, and Zn, for example, $SiO_2$.

In the semiconductor memory device 200, a semiconductor layer where a channel is formed in a transistor other than the transistor MW1, such as the transistor MR1 and the transistor MA1, can be formed using a semiconductor material containing one or more of, for example, a Group 14 element (such as Si, C, and Ge); and a transistor formed using a semiconductor substrate (a bulk-type or SOI-type substrate) can be used as the transistor MR1 and the transistor MA1. For example, the transistor MA1 can be a Si transistor formed over a bulk-type single crystal silicon substrate or a Si transistor formed over an SOI-type single crystal silicon substrate. Note that a Si transistor is a transistor in which a semiconductor layer where a channel is formed is a silicon layer.

Note that a semiconductor substrate for manufacturing the semiconductor memory device 200 is not limited to a single crystal silicon substrate, and the semiconductor substrate can be, for example, a single-material semiconductor substrate of silicon, germanium, or the like or a compound semiconductor substrate of silicon carbide, silicon germanium, gallium arsenide, gallium nitride, indium phosphide, zinc oxide, gallium oxide, or the like. The crystallinity of the semiconductor substrate is preferably single crystal but not limited thereto and may be amorphous, polycrystalline, or microcrystalline.

In the case where the transistors MR1 and MA1 are manufactured using a semiconductor substrate, the transistor MW1 for which an OS transistor is used can be stacked thereon. The semiconductor memory device 200 can be a combined memory incorporated in the same IC chip as a logic circuit (e.g., a CPU core) with such a device configuration of the memory cell 11 (memory cell array 211). This enables reduction of the memory cell 11 in size; therefore, capacity of the memory cell array 211 can be increased easily. Note that the device configuration of the memory cell 11 will be described in Embodiment 3.

In a general 1T1C DRAM, a high power supply potential ranges from 1 V to 1.5 V, whereas a potential higher than the high power supply potential, which ranges from 2 V to 3 V, is applied to the gate of the writing transistor. A capacitor whose capacitance is greater than or equal to 20 fF/cell and less than or equal to 30 fF/cell is used, and the refresh operation is performed every 64 ms. In the memory cell 11, the writing transistor MW1 is an OS transistor, whereby the frequency of refresh operation of the memory cell 11 can be reduced and writing time can be 10 nanoseconds (ns) or shorter while a writing operation potential (the maximum potential of the wiring WWL) is set to 2 V or less. Description thereof is made below.

<<Characteristics of Writing Transistor MW1>>

To operate the memory cell 11 properly, it is required for characteristics of the transistor MW1 that a certain amount of a drain current Iw (on-state current $Iw_{on}$) flow by application of a writing operation potential to the gate and that the drain current Iw have a certain on/off ratio (hereinafter the on/off ratio of the drain current Iw is simply referred to as an on/off ratio in some cases). As the on-state current $Iw_{on}$ becomes lower, much time is needed to write data to the memory cell 11; therefore, it is required that a certain amount of a drain current Iw flow through the transistor MW1 in the writing operation so that the memory cell 11 can operate normally as a memory circuit. By increasing the on/off ratio, retention time can lengthened much longer than writing time. Regarding the retention time, as the on/off ratio of the transistor MW1 becomes smaller, the frequency of refresh operation increases and thus power consumption of the memory cell 11 is increased. Although the retention time can be lengthened by increasing the capacitance of the capacitor CS1, an increase of the capacitor CS1 in size hinders high integration and high capacity of the memory cell array 211. In addition, the amount of electric charge accumulated in the capacitor CS1 is increased to raise the potential of the node FN1 to a predetermined value, resulting in a low writing speed. In the case where a manufacturing process of the capacitor CS1 with high capacity is added or depending on the device configuration of the capacitor CS1 or the like, it might be difficult to achieve a combined memory.

In view of the foregoing, an object of this embodiment is to provide a semiconductor memory device capable of reducing power consumption as compared to the case of a general 1T1C DRAM, a memory cell capable of shortening writing time, a memory cell capable of writing data with a potential that does not exceed a power supply potential of a semiconductor memory device, or a memory cell having a device configuration capable of achieving a combined memory easily. Described below is that, with the use of a gain cell with two transistors (2T cell) or a gain cell with three transistors (3T cell) using an OS transistor as a writing transistor, a memory cell with high performance which is not achieved by a gain cell using a Si transistor can be provided.

Here, description is made using the memory cell 11 having a 3T cell configuration in FIG. 3A as a typical example. The capability of the memory cell 11 in which the transistor MW1 is a Si transistor is compared with that of the memory cell 11 in which the transistor MW1 is an OS transistor. For this purpose, design specifications A shown in Table 1 and design specifications B shown in Table 2 are determined Note that a writing transistor and a storage capacitor are mainly described below; therefore, the same applies to the memory cell having a 2T cell, or a 3T cell and a 2T cell in each of which a reading transistor is a p-channel transistor.

TABLE 1

(Design specifications A)

| | | |
|---|---|---|
| Wiring WBL | Potential of data signal | 0 V/1 V |
| Memory cell 11 | Coupling capacitance (CCfn1) | $30 \times 10^{-15}$ F (30 fF) |
| | Transistor MW1 | On-state current $Iw_{on}$ 10 μA |
| | | On/off ratio $1 \times 10^8$ |
| | Writing time | 3 ns |
| | Retention time | 60 ms |

TABLE 2

| (Design specifications B) | | |
|---|---|---|
| Wiring WBL | Potential of data signal | 0 V/1 V |
| Memory cell 11 | Coupling capacitance (CCfn1) | $30 \times 10^{-18}$ F (30 aF) |
| | Transistor MW1 | On-state current $Iw_{on}$ 3 nA |
| | | On/off ratio $1 \times 10^8$ |
| | Writing time | 3 ns |
| | Retention time | 60 ms |

Figure 4A:
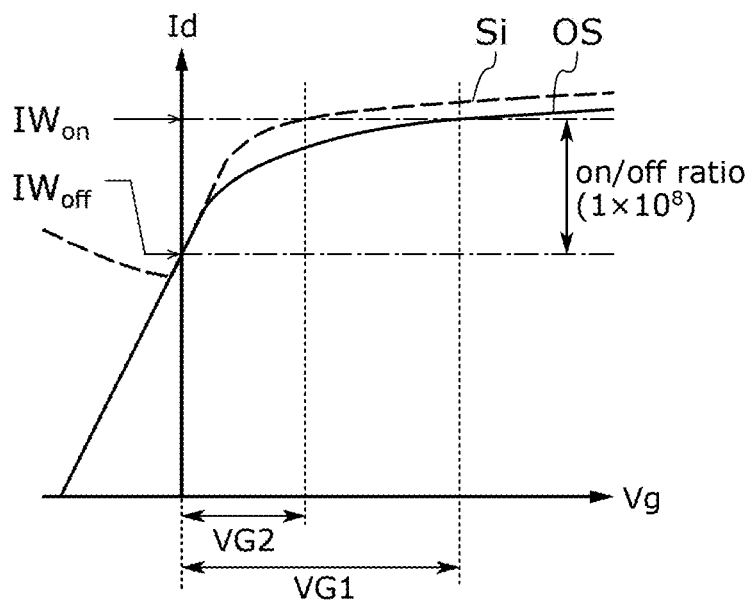
FIGS. 4A and 4B are graphs each showing drain current-gate voltage (Id-Vg) characteristics of an OS transistor (solid curve) and a Si transistor (dotted curve).
Figure 4B:
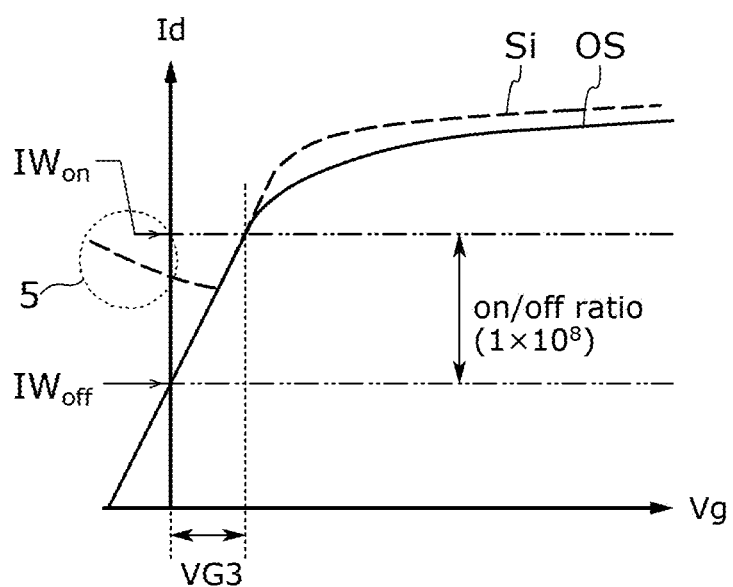
Figure 16A:
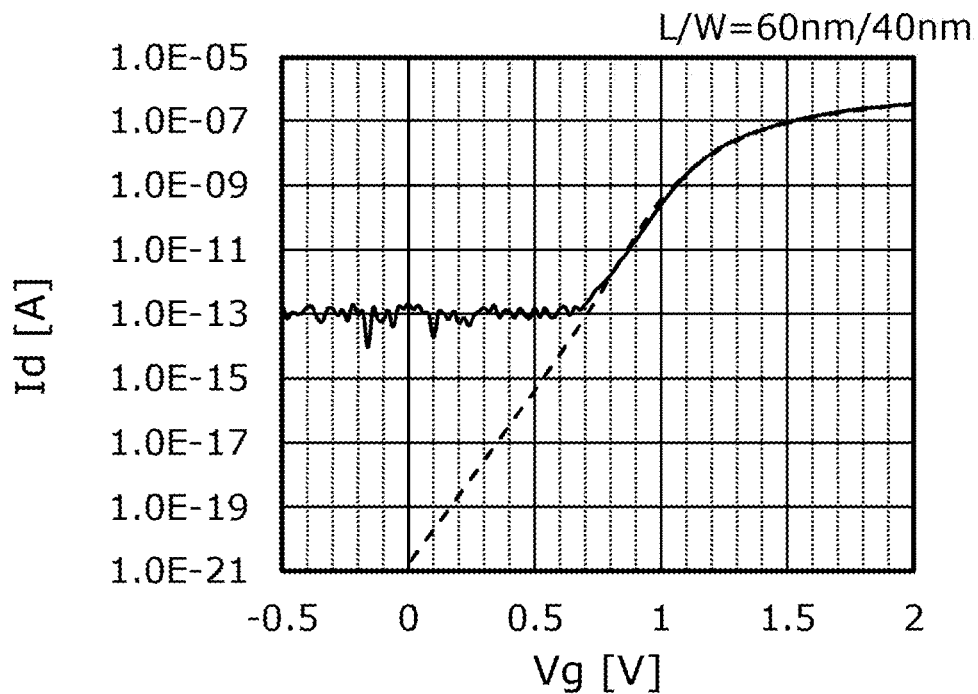
FIG. 16A is a graph showing an Id-Vg curve of an OS transistor (solid curve: measured value, dotted curve: calculated value)
Figure 16B:
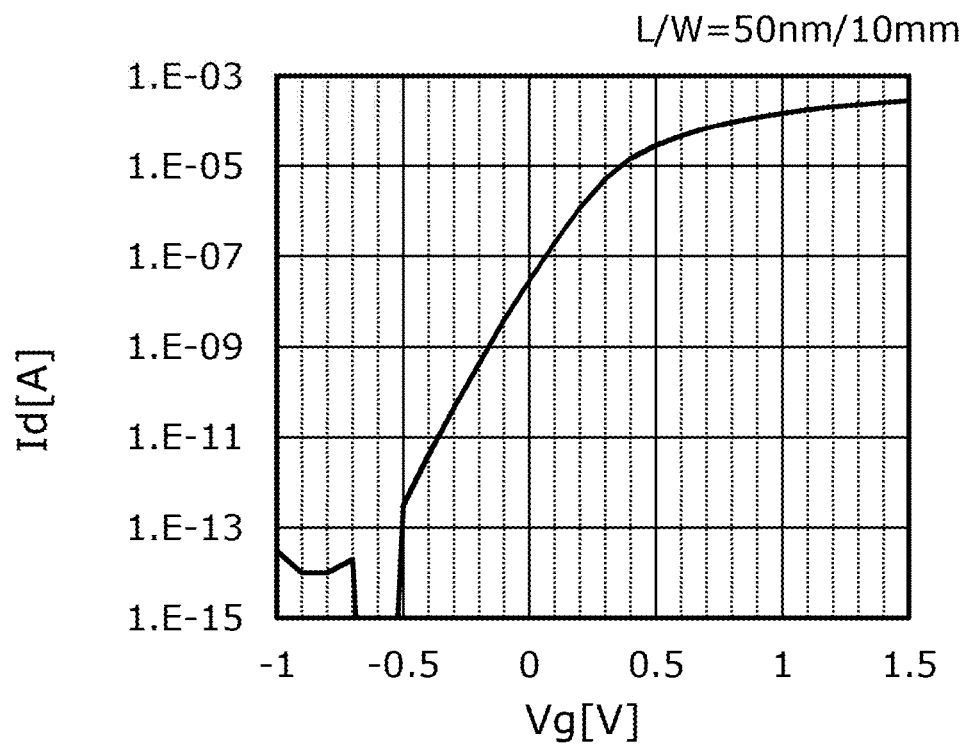
FIG. 16B is a graph showing an Id-Vg curve of an OS transistor (measured value).

FIGS. 4A and 4B are graphs each showing drain current-gate voltage Id-Vg curves of an OS transistor (solid curve) and a Si transistor (dotted curve). FIG. 4A corresponds to Id-Vg characteristics of the transistor MW1 in the design specifications A, and FIG. 4B corresponds to Id-Vg characteristics of the transistor MW1 in the design specifications B. The Id-Vg characteristics, such as an on-state current, an off-state current, a subthreshold swing value (S value), of an OS transistor in FIGS. 16A and 16B (Example 1) and a general Si transistor are used as references for the Id-Vg characteristics in FIGS. 4A and 4B. For example, as shown in FIGS. 16A and 16B (Example 1), the S value of the OS transistor is 77 mV/dec, which is small and preferable. A Si transistor with favorable characteristics has a similar S value.

(Design Specifications A)

In the design specifications A, the values of the on-state current and the storage capacitor of the writing transistor correspond to those of a general 1T1C DRAM. Here, the storage capacitor is equivalent to the coupling capacitance CCfn1 of the node FN1. In the design specifications A, the on-state current $Iw_{on}$ of the transistor MW1 is set to 10 μA so that data can be written to the storage capacitor with capacitance of 30 fF within 3 ns with a potential of the wiring WBL of 1 V, and the on/off ratio is set to $1 \times 10^8$ so that the data can be retained for 60 ms or longer.

Since the on-state current $Iw_{on}$ is 10 μA and the on/off ratio is $1 \times 10^8$, the off-state current $Iw_{off}$ of the transistor MW1 can be calculated to be 0.1 pA. Thus, the driving potential (writing operation potential) of the transistor MW1 can be obtained from a difference between a gate voltage Vg when the drain current is 10 μA and a gate voltage Vg when the drain current is 0.1 pA. As shown in FIG. 4A, a driving potential VG2 in the case where the transistor MW1 is a Si transistor is estimated to be approximately 2.5 V, whereas a driving potential VG1 in the case of an OS transistor needs to be higher than the VG2.

(Design Specifications B)

In the design specifications B, the size of the storage capacitor is $1 \times 10^{-3}$ times as small as that in the design specifications A, and the on-state current $Iw_{on}$ is approximately $3 \times 10^{-2}$ times as low as that in the design specifications A. When the writing time is constant, the on-state current $Iw_{on}$ which is necessary for writing operation decreases as the storage capacitor becomes small. Thus, the storage capacitor can be reduced in size with miniaturization of the transistor MW1. That is, the design specifications B show a specification example of a gain cell in which a small storage capacitor is charged with a low on-state current $Iw_{on}$. Specifically, in the design specifications B, the on-state current $Iw_{on}$ is set to 3 nA so that data can be written to the storage capacitor with capacitance of 30 aF within 3 ns with a potential of the wiring WBL of 1 V, and the on/off ratio is set to $1 \times 10^8$ so that the data can be retained for 60 ms or longer. Accordingly, in the design specifications B, it is required that the off-state current $Iw_{off}$ be 1 aA ($1 \times 10^{-21}$ A).

The driving potential of the transistor MW1 can be obtained from a difference between a gate voltage Vg when the drain current is 3 nA and a gate voltage Vg when the drain current is 1 aA. As shown in FIG. 4B, the driving potential in the case where the transistor MW1 is an OS transistor is VG3. However, in the case of a Si transistor, a required on/off ratio cannot be achieved because the off-state current becomes too high as shown in a region 5. This indicates that the memory cell 11 including a Si transistor as the transistor MW1 does not have capability required for a memory cell (design specifications B).

As shown in FIG. 4B, the OS transistor has favorable subthreshold characteristic (a large S value) and the on-state current $Iw_{on}$ in the writing operation is located in a subthreshold region or becomes a drain current in the vicinity of a threshold voltage; therefore, the driving potential VG3 of the OS transistor (MW1) can be lower than the driving potential VG2 (e.g., 2.5 V) of the Si transistor (MW1). As a result, the driving potential of the transistor MW1 can be lower than or equal to 2 V. The driving potential of the transistor MW1 is preferably lower than or equal to 1.9 V, lower than or equal to 1.8 V, or lower than or equal to 1.7 V. As will be described below, the driving potential of the transistor MW1 is set in accordance with the potential of the node FN1 during the writing operation, the required writing speed, or the like, and the driving potential thereof can be set to be greater than or equal to 1 V, greater than or equal to 1.2 V, or greater than or equal to 1.5 V. It is preferable that the power supply system of the semiconductor memory device 200 be simplified by setting the driving potential of the transistor MW1 to the same potential as the high power supply potential VDD when VDD of the semiconductor memory device 200 is lower than or equal to 2 V.

In the case where the transistor MW1 is an OS transistor, the off-state current is extremely low; therefore, the on/off ratio of the transistor MW1 can be set to be higher than or equal to $1 \times 10^8$; for example, higher than or equal to $1 \times 10^9$. A high on/off ratio lengthens the retention time, so that the frequency of refresh operation of the memory cell 11 is reduced and thus power consumption in data retention can be reduced. Thus, the on/off ratio of the transistor MW1 (writing transistor) is set to be higher than or equal to $1 \times 10^8$. The on/off ratio is preferably higher than or equal to $1 \times 10^9$, higher than or equal to $1 \times 10^{11}$, higher than or equal to $1 \times 10^{12}$, or higher than or equal to $1 \times 10^n$.

Unlike the threshold voltage of the Si transistor, the threshold voltage of the OS transistor is not largely changed by a temperature rise. Thus, a change in retention time due to a temperature rise can be suppressed by using the OS transistor for the memory cell 11; accordingly, an increase in power consumption of the semiconductor memory device 200 caused by a temperature rise can be suppressed.

As described above, it is difficult for a gain cell with the design specifications B in which data is written with a low on-state current $Iw_{on}$ to have capability required for a memory cell when the writing transistor is a Si transistor. In contrast, when an OS transistor is used as the writing transistor, the writing transistor can be driven in a subthreshold region or at a gate potential of the threshold voltage; therefore, the driving potential of the writing transistor can be lowered. With such a configuration, data can be retained for an extremely long time (e.g. one second or longer) as compared with a 1T1C DRAM. That is, application of the memory cell of this embodiment allows data writing with low power consumption at high speed and can provide a random access memory having extremely favorable data retention characteristics.

The on/off ratio of the OS transistor is changed slightly even when the channel length and the channel width are shortened. Therefore, in the OS transistor used as the writing transistor, the on-state current $Iw_{on}$ (e.g., 0.5 nA or higher) may flow only when a potential lower than or equal to 2 V, preferably lower than or equal to 1.9 V, or further preferably lower than or equal to 1.8 V is applied to the gate. Accordingly, a technology node of the transistor MW1 (OS transistor) may be shorter than 100 nm. The technology node is preferably shorter than or equal to 60 nm, shorter than or equal to 40 nm, or shorter than or equal to 30 nm. A channel length L of the transistor MW1 is shorter than 100 nm. The channel length L is preferably shorter than or equal to 60 nm, shorter than or equal to 40 nm, or shorter than or equal to 30 nm. A channel width W of the transistor MW1 is shorter than 100 nm. The channel width W is preferably shorter than or equal to 60 nm, shorter than or equal to 40 nm, or shorter than or equal to 30 nm. The lower limits of the channel length and the channel width of the transistor MW1 depend on the manufacturing technique of the OS transistor, which can be longer than or equal to 15 nm and longer than or equal to 18 nm, respectively.

(Channel Length and Channel Width)

The channel length and the channel width of a transistor are described. The channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

A channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the top view.

In contrast to a planar transistor, three-dimensional transistors (hereinafter referred to as 3D transistors) such as a Tri-gate type transistor and a fin-type transistor are known. In the 3D transistor, in some cases, it is difficult to measure an effective channel width. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like. The value of the channel width of the above-described transistor MW1 can be the value of an apparent channel width.

Note that in the case where field-effect mobility, a current value per channel width, and the like of a transistor are obtained by calculation, a surrounded channel width may be used for the calculation. In that case, a value different from one in the case where an effective channel width is used for the calculation is obtained in some cases.

The larger the capacitance of the coupling capacitance CCfn1 is, the longer writing time is taken; however, the retention time can be lengthened. The capacitance of the coupling capacitance CCfn1 can be reduced without lowering the retention characteristics by using an OS transistor having an extremely low off-state current as the writing transistor. The coupling capacitance CCfn1 can be greater than or equal to 5 aF ($5 \times 10^{-12}$ F) and less than or equal to 300 aF. To shorten the writing time, the capacitance of the coupling capacitance CCfn1 is preferably reduced as much as possible. The capacitance can be less than or equal to 100 aF, less than or equal to 60 aF, or less than or equal to 50 aF. In the case where the capacitor CS1 is intentionally provided, the capacitance of the capacitor CS1 may be greater than or equal to 5 aF so that the coupling capacitance CCfn1 does not exceed 300 aF; for example, the capacitance of the capacitor CS1 can be greater than or equal to 5 aF and less than or equal to 200 aF. The capacitance of the capacitor CS1 is preferably greater than or equal to 5 aF and less than or equal to 100 aF, or further preferably greater than or equal to 5 aF and less than or equal to 40 aF.

<<Driving Method Example 1 of Memory Cell>>

Figure 5:
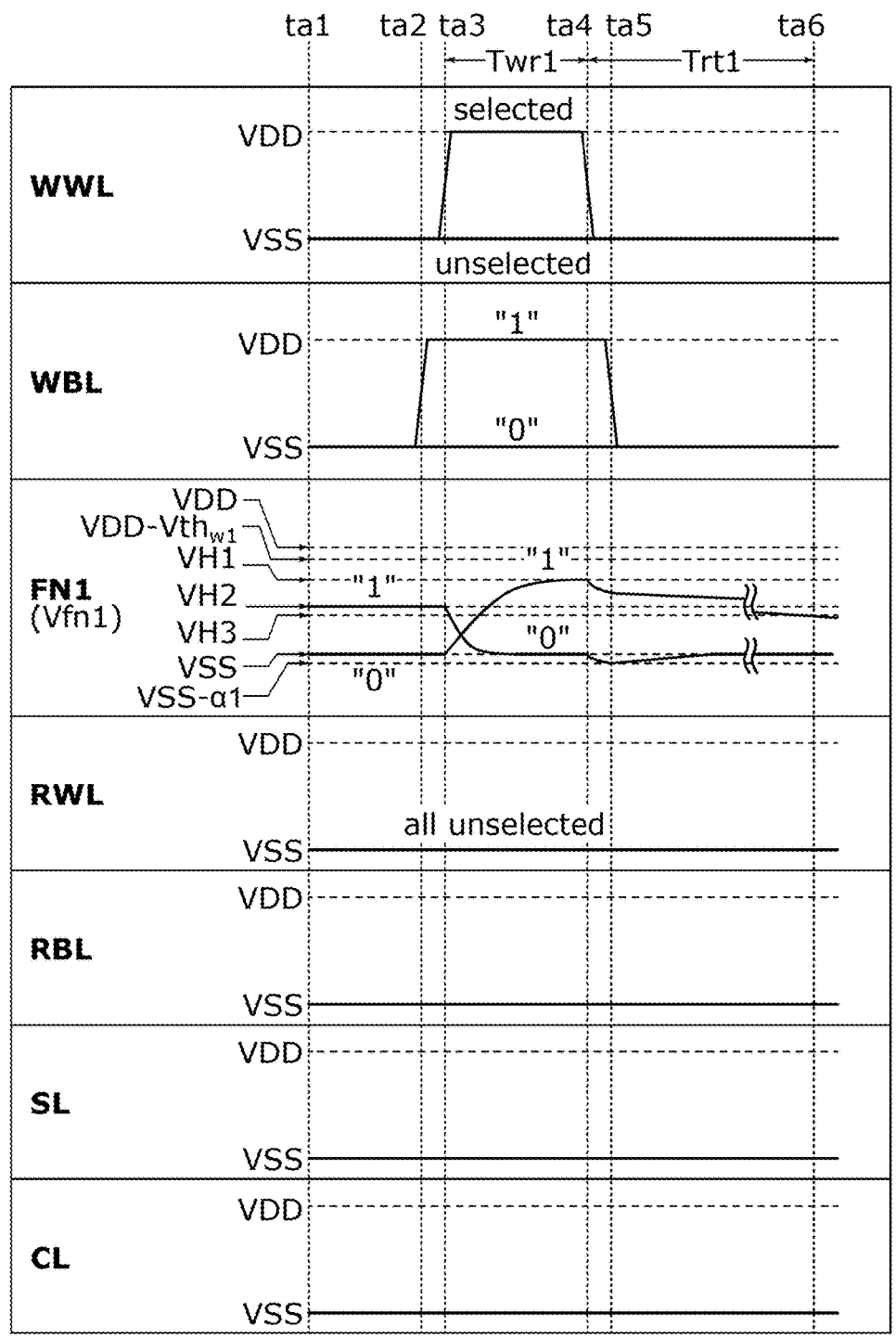
FIG. 5 is a timing chart illustrating an example of writing operation of a memory cell.
Figure 6:
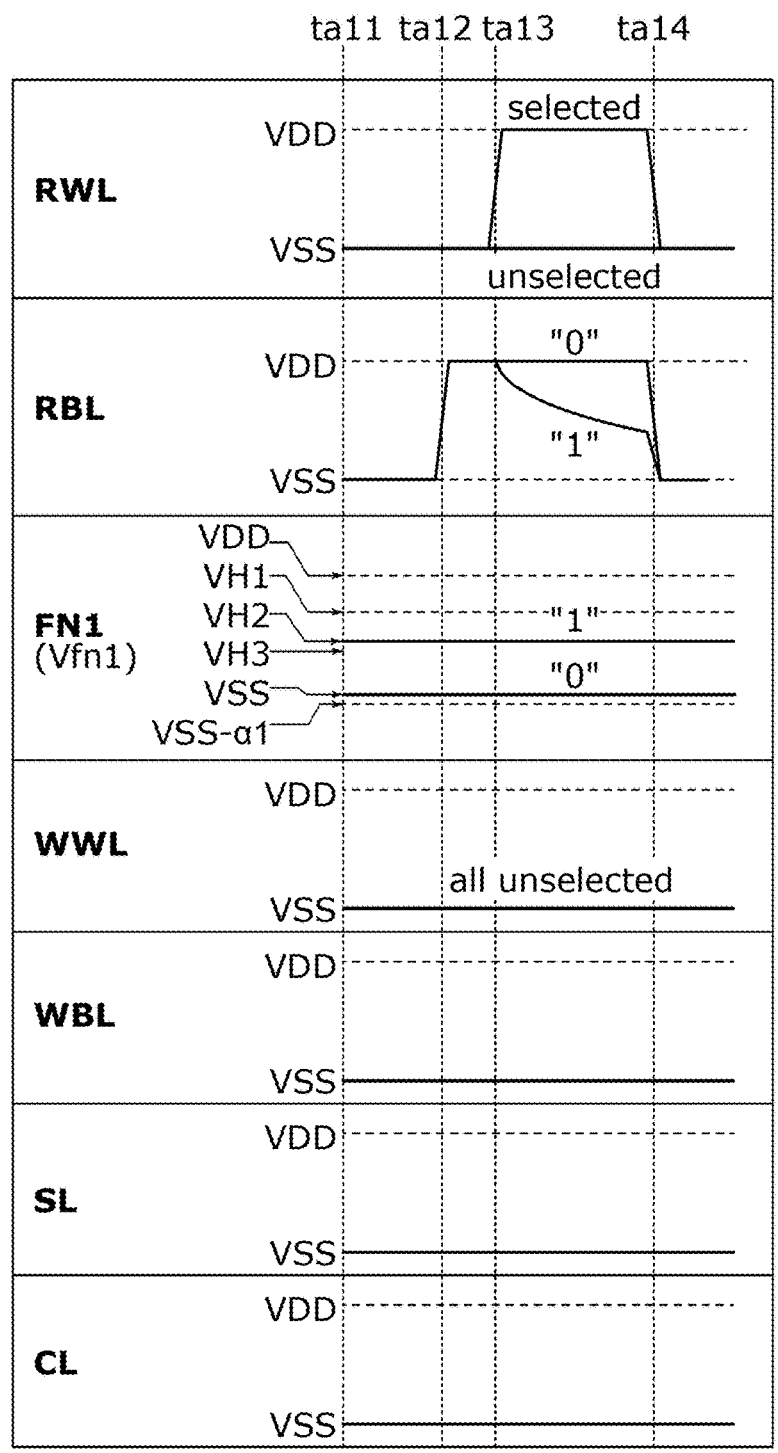
FIG. 6 is a timing chart illustrating an example of reading operation of a memory cell.

An example of a method of driving the memory cell 11 (memory cell array 211) is described with reference to FIG. 5 and FIG. 6. FIG. 5 and FIG. 6 are each a timing chart of the memory cell 11 (memory cell array 211) in the case where the transistors MW1, MR1, and MA1 are n-channel transistors. FIG. 5 shows an example of writing operation, and FIG. 6 shows an example of reading operation. FIG. 5 and FIG. 6 each show changes in the potentials of the wirings WWL, RWL, WBL, RBL, SL, and CL and a change in the potential of the node FN1 (a potential Vfn1). High level (H level) driving potentials of the wirings WWL, RWL, WBL, RBL, SL, and CL are referred to as VDD and low level (L level) driving potentials thereof are referred to as VSS. For example, VDD can be higher than or equal to 1 V and lower than or equal to 2V, and VSS can be 0 V.

<<Writing Operation>>

Capability of writing data in the memory cell 11 at high speed is described with reference to FIG. 5. In FIG. 5, ta1 to ta6 represent time.

The memory cell 11 is in a data retention state in a period from ta1 to ta2. The potentials of the wirings WWL, WBL, RWL, RBL, SL, and CL are each an L level. In the case where data "1" is written to the memory cell 11, the potential Vfn1 of the node FN1 is VH2 which is lower than VDD and higher than VSS, and in the case where data "0" is written, the potential Vfn1 is VSS.

A period from ta3 to ta4 in which the potential of the wiring WWL becomes an H level corresponds to writing time Twr1. Before the potential of the wiring WWL is set to the H level, the potential of the wiring WBL is set to a potential corresponding to a value of data to be written. In the case where data "1" is written to the memory cell 11, VDD is applied to the wiring WBL, and in the case where data "0" is written, VSS is applied thereto. After the potential of the wiring WBL is set to a predetermined potential, at the time ta3, a potential of the selected wiring WWL is changed from the L level to the H level and a potential of the unselected wiring WWL is kept at the L level.

In the memory cell 11 selected in the period from ta3 to ta4, the transistor MW1 is turned on, and the node FN1 is electrically connected to the node N1 (wiring WBL). When the potential of the wiring WBL is VSS, the capacitor CS1 (coupling capacitance CCfn1) is discharged by the on-state current $Iw_{on}$ of the transistor MW1; therefore, the potential Vfn1 is lowered to VSS. When the potential of the wiring WBL is VDD, the capacitor CS1 (coupling capacitance CCfn1) is charged by the on-state current $Iw_{on}$ and the potential Vfn1 is raised. In the writing operation of a general gain cell, the potential of the wiring WWL is kept at the H level until the potential Vfn1 is fixed to an allowable maximum value (specifically, the maximum value corresponds to VDD−$Vth_{w1}$, where $Vth_{w1}$ represents the threshold voltage of the transistor MW1). In contrast, in the memory cell array 211, writing can be terminated at the time when the potential Vfn1 becomes a potential VH1, which is lower than the potential VDD−$Vth_{w1}$, by changing the potential of the wiring WWL to the L level.

The potential of a gate-source voltage $Vgs_{w1}$ of the transistor MW1 in the writing period from ta3 to ta4 corresponds to VDD−Vfn1; therefore, a rise of the potential Vfn1 lowers the gate-source voltage $Vgs_{w1}$ and the on-state current $Iw_{on}$. Power loss is large even when writing is performed with a low on-state current $Iw_{on}$. Accordingly, the potential is set to VH1 in the writing period so that the on-state current $Iw_{on}$ flows constantly with a value higher than the current value in the design specifications. For example, in the above design specifications B (Table 2), the potential VH1 can be determined from the gate-source voltage $Vgs_{w1}$ at which the on-state current $Iw_{on}$ becomes 3 nA.

Therefore, the writing time Twr1 (time needed to change the potential of the wiring WWL to the H level) can be set on the basis of time needed to raise the potential Vfn1 from VSS to VH1. As described above, by using an OS transistor as the transistor MW1, the coupling capacitance CCfn1 of the node FN1 can be charged with a low on-state current $Iw_{on}$ as in the design specifications B; therefore, data writing can be terminated at the time when the potential Vfn1 is raised to the potential VH1 which is lower than VDD. That is, the time Twr1 can be shortened. In this manner, according to this embodiment, a memory cell (semiconductor memory device) capable of writing data at high speed can be provided.

The potential of the wiring WWL is changed from the H level to the L level at the time ta4, whereby the node FN1 is brought into an electrically floating state and the wiring operation is terminated. The memory cell 11 is in a data retention state after the time ta4. The potential of the wiring WBL is VSS at the time ta5. After the node FN1 is brought into an electrically floating state, the potential of the wiring WBL is changed to VSS (L level), whereby a change of the potential Vfn1 at data retention can be suppressed.

When the potential of the wiring WWL is changed from the H level to the L level, coupling capacitance between the wiring WWL and the node FN1 lowers the potential Vfn1 by α1. In the case where data "0" is written, the potential Vfn1 is lowered to VSS−α1. Note that α1 is a positive potential determined by the coupling capacitance CCfn1. In the case where the potential of the node FN1 is lower than VSS, the gate-source voltage $Vgs_{w1}$ of the transistor MW1 rises; therefore, the off-state current $Iw_{off}$ of the transistor MW1 becomes higher. Thus, in the case where data "0" is written to the memory cell 11, the potential Vfn1 of the node FN1 rises to the vicinity of VSS within a relatively short period after the time ta4. That is, the relation of VSS−α1<Vfn1<VSS is satisfied. Here, the potential Vfn1 rises to VSS for convenience to avoid complexity of the drawing. Accordingly, the potential Vfn1 in the case where data "0" is written in the period from ta1 to ta2 is set to VSS.

In the case where data "1" is written, the potential Vfn1 is lowered by α1 and further lowered gradually by the influence of the off-state current $Iw_{off}$ of the transistor MW1. The potential Vfn1 is allowed to lower to VH3. The potential VH3 is set in accordance with the driving characteristics of the transistor MA1. The potential VH3 can be set by the gate potential of the transistor MA1 which is required to read data "1" from the memory cell 11. In the case where a Si transistor is used as the read transistor MA1, for example, VDD can be set to 1.8 V and VH3 can be set to 0.3 V. To make the time Twr1 shorter than 5 ns in this example, VH1 becomes 0.5 V in the case where the gate-source voltage $Vgs_{w1}$ of the transistor MW1 (OS transistor) in the writing operation is required to be greater than or equal to 1.3 V. A specific example of the design specifications of such a memory cell 11 will be described in Example 1.

Time ta4 to ta6 needed to lower the potential Vfn1 from VH2 to VH3 corresponds to retention time Trt1 of the memory cell 11. Refresh operation of the memory cell 11 may be performed during a period in which the potential Vfn1 is VH3 or higher. With the use of an OS transistor as the transistor MW1, the time Trt1 can be one second or longer (e.g., several minutes to several hours). Accordingly, each of the memory cells 11 in the memory cell array 211 can be substantially refresh free in such a manner that the semiconductor memory device 200 is operated so that interval between writing requirement is kept shorter than the time Trt1 in the memory cell 11. That is, the semiconductor memory device 200 may be driven so that data of all the memory cells 11 in the memory cell array 211 are rewritten in a cycle shorter than the time Trt1 (the cycle may be constant or not). As application examples of the semiconductor memory device 200, a semiconductor memory device (RAM) incorporated in a graphic processor (GPU) and a semiconductor memory device incorporated in a monitoring device, and a sensing device can be given. In a monitoring device or the like, data may be obtained periodically and data of the semiconductor memory device 200 may be rewritten with the obtained data.

<<Reading Operation>>

The reading operation of the memory cell 11 is described with reference to FIG. 6. In FIG. 6, ta11 to ta14 represent time.

The memory cell 11 is in a data retention state (non-selected state) in a period from ta11 to ta12. The potentials of the wirings WWL, WBL, RWL, RBL, SL, and CL are each an L level. In the case where data "1" is written, the potential Vfn1 is VH2, and in the case where data "0" is written, the potential is VSS.

Precharge operation is performed on the wiring RBL in a period from ta12 to ta13. After the potential of the wiring RBL is set to VDD, the wiring RBL is brought into an electrically floating state. The potential of the wiring RWL is set to an H level at the time ta13. The transistor MR1 is turned on, and the node N2 (wiring RBL) and the transistor MA1 are electrically connected to each other. An on-state current flows through the transistor MA1 when the potential Vfn1 is VH2; therefore, the potential of the wiring RBL lowers. On the other hand, the transistor MA1 is off when the potential Vfn1 is VSS; therefore, the potential of the wiring RBL is kept at VDD. Thus, the potential of the wiring RBL or its amount of change is detected in the column driver circuit 232 in the period from ta13 to ta14, so that the value of data retained in the memory cell 11 can be detected. The memory cell 11 returns to a data retention state by setting the potential of the wiring RWL to the L level at the time ta14.

<<Other Configuration Examples of Memory Cell>>

Configuration examples of a memory cell having a 3T cell configuration, a memory cell having a 2T cell configuration, and a memory cell array which can be used for the semiconductor memory device 200 are shown below. These configuration examples can be combined with the above-described memory cell 11 and memory cell array 211 as appropriate.

<Configuration Example 2: 3T Cell>

Figure 7:
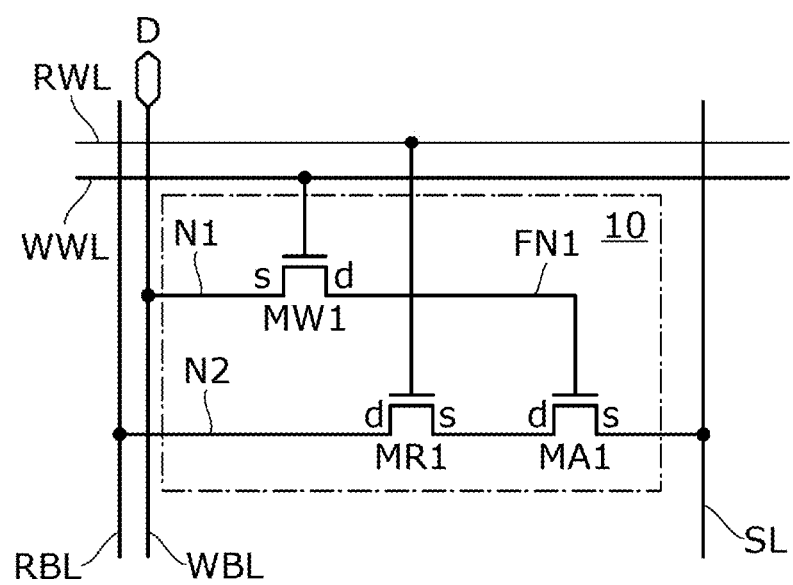
FIG. 7 is a circuit diagram illustrating an example of a memory cell configuration.

In the example of the driving method illustrated in FIG. 5 and FIG. 6, the potential of the wiring CL is not controlled; therefore, a memory cell 10 in which the capacitor CS1 is not provided as shown in FIG. 7 can be used. In this case, the wiring CL is not necessarily provided either. In the memory cell 10, the coupling capacitance CCfn1 of the node FN1 is mainly composed of the gate capacitance of the transistor MA1.

<Configuration Example 3: 3T Cell>

Figure 8A:
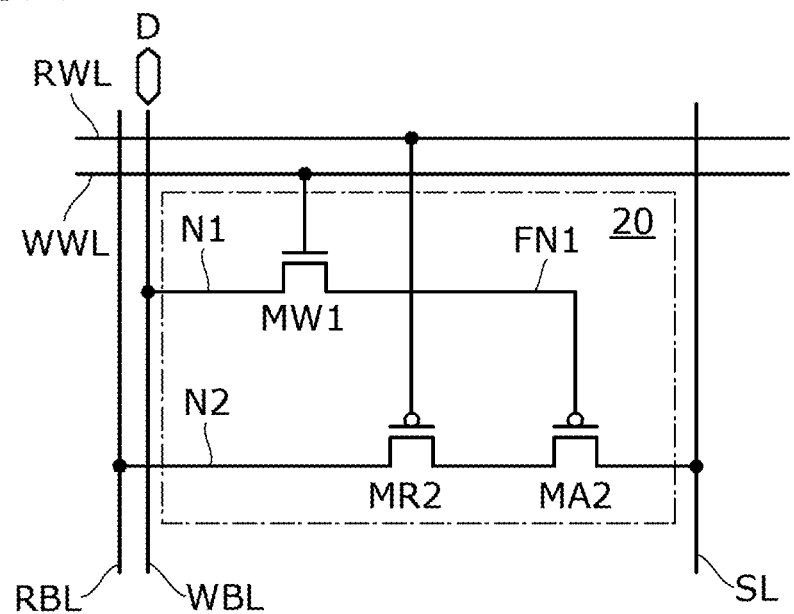
FIGS. 8A and 8B are each a circuit diagram illustrating an example of a memory cell configuration.
Figure 8B:
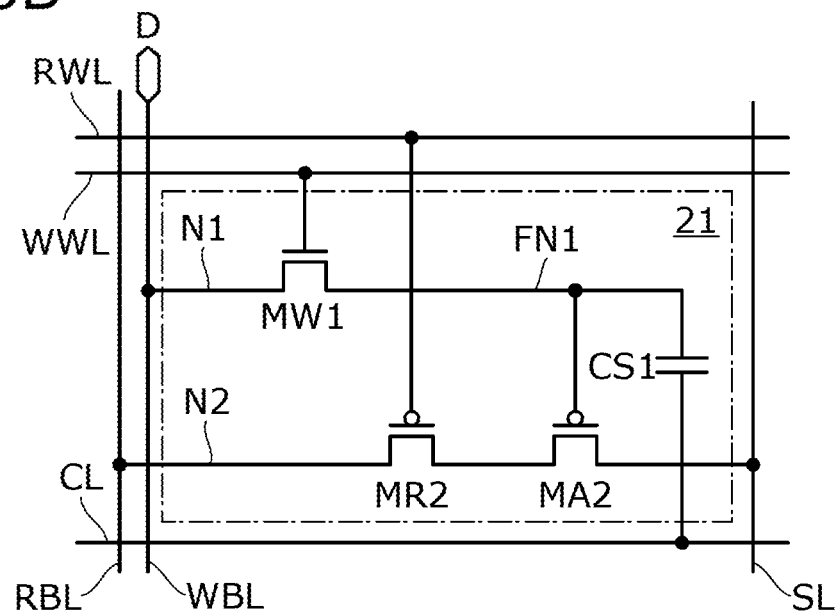

In the memory cell 10 and the memory cell 11, each of the reading transistors MR1 and MA1 can be a p-channel transistor. FIGS. 8A and 8B illustrate examples of such a memory cell. In a memory cell 20 of FIG. 8A, a p-channel transistor MR2 and a p-channel transistor MA2 are used as the reading transistor MR1 and the reading transistor MA1 of the memory cell 10, respectively. In a memory cell 21 of FIG. 8B, the p-channel transistor MR2 and the p-channel transistor MA2 are used as the reading transistor MR1 and the reading transistor MA1 of the memory cell 11, respectively. The driving methods of the memory cells 20 and 21 are similar to the driving method of the memory cell 11 (FIG. 5 and FIG. 6). A difference therebetween lies in setting the potential of the wiring SL to an H level in the writing operation and precharging the potential of the wiring RBL to VSS in the period from ta12 to ta13 in the reading operation (FIG. 6), for example.

<Configuration Example 4: 3T Cell>

Figure 9:
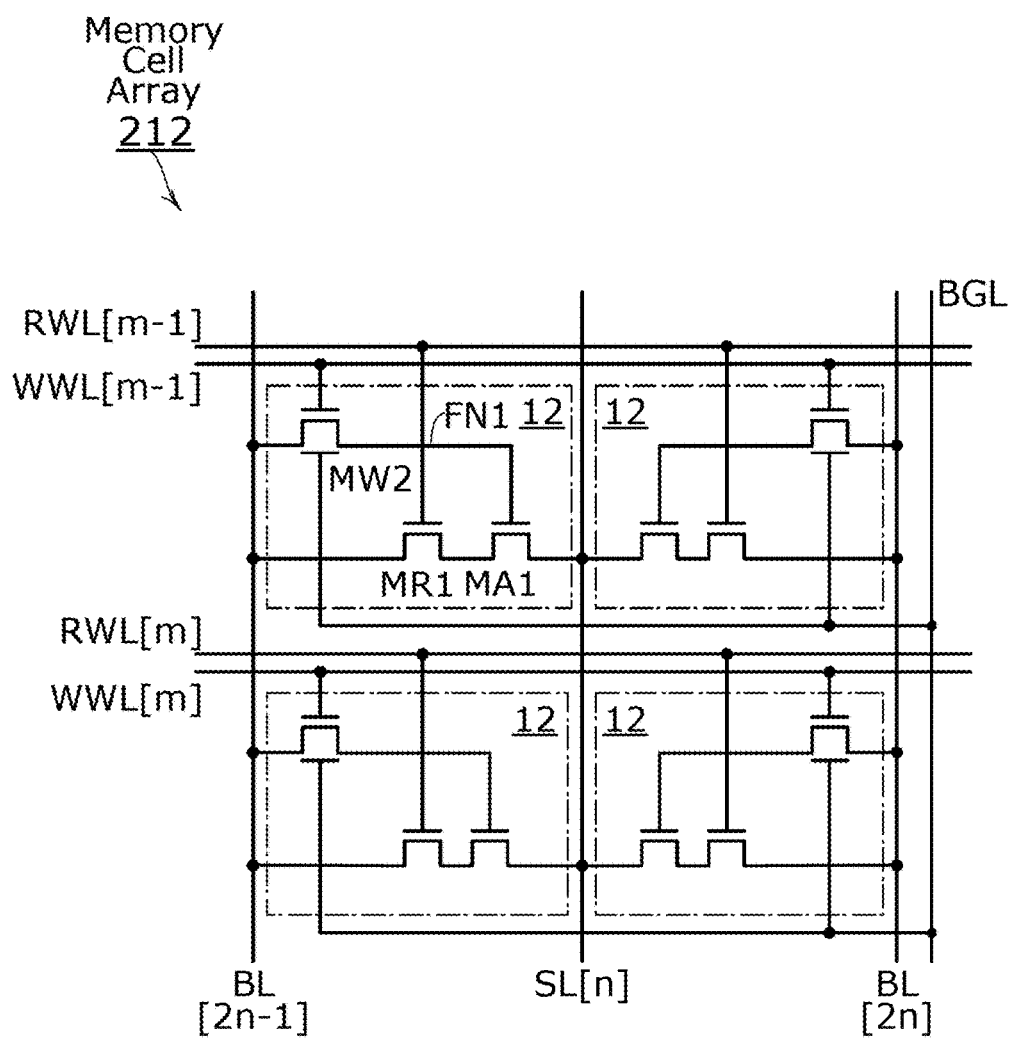
FIG. 9 is a circuit diagram illustrating an example of a memory cell array configuration.

In each of the memory cells 10, 11, 20, and 21, the node N1 and the nod N2 may be connected to a common wiring BL. FIG. 9 illustrates an example of a memory cell array having such a connection configuration. A memory cell array 212 of FIG. 9 has a circuit configuration similar to a circuit configuration of the memory cell array 211 (FIG. 2) and includes a plurality of memory cells 12. In FIG. 9, the memory cells 12 at 2 rows×2 columns are typically illustrated. Here, n and m are each an integer greater than or equal to 2. In the memory cell array 212, the memory cell 12 is electrically connected to the wirings WWL, RWL, BL, and SL, and a common wiring BGL. The memory cell 12 is a modification example of the memory cell 10, in which a transistor MW2 including a back gate is used as a writing transistor. The back gates of the transistors MW2 in the memory cells 12 are each electrically connected to the wiring BGL.

The potential of the wiring BGL can adjust the threshold voltage of each transistor MW2. For example, the potential of the wiring BGL is adjusted so that an on-state current value and an on/off ratio which are required for the transistor MW2 under driving conditions of the writing operation can be obtained. The transistor MW2 can be used as a writing transistor also in a memory cell of another configuration example.

The memory cell 12 (memory cell array 212) can be driven in a manner similar to that of the memory cell 11 (memory cell array 211). In the writing operation, the potential of the wiring BL is controlled in a manner similar to that of the wiring WBL (FIG. 5), and in the reading operation, the potential of the wiring BL is controlled in a manner similar to that of the wiring RBL (FIG. 6).

<Configuration Example 5: 2T Cell>

Figure 10A:
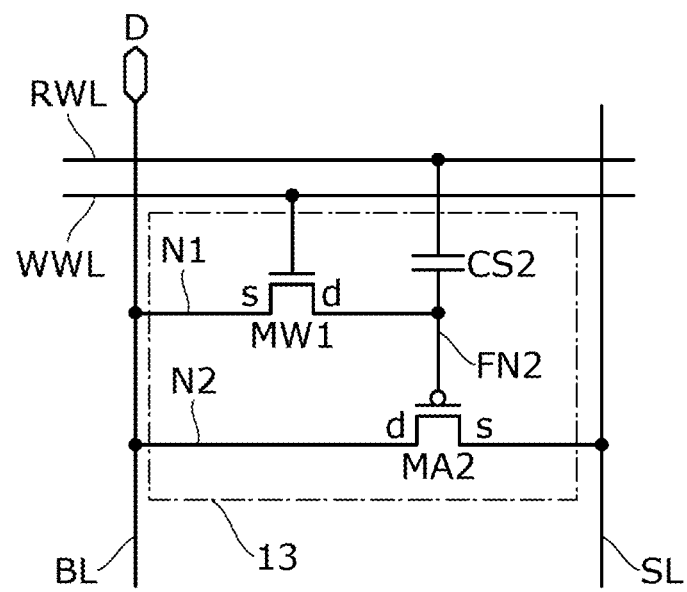
FIG. 10A is a circuit diagram illustrating an example of a memory cell configuration.

FIG. 10A illustrates an example of a memory cell having a 2T cell configuration. As illustrated in FIG. 10A, a memory cell 13 has a 2T cell configuration and includes the transistor MW1, the transistor MA2, a capacitor CS2, the node N1, the node N2, and a node FN2 which are connected to the wirings WWL, RWL, BL, and SL. As illustrated in FIG. 10A, a source (s) and a drain (d) of each of the transistors MW1 and MA2 are distinguished from each other in the following description.

The gate of the transistor MW1 is electrically connected to the wiring WWL, the source thereof is electrically connected to the node N1 (wiring BL), and the drain thereof is electrically connected to the node FN2. The gate of the transistor MA2 is electrically connected to the node FN2, the drain thereof is electrically connected to the node N2 (wiring BL), and the source thereof is electrically connected to the wiring SL. The capacitor CS2 can function as a storage capacitor for retaining the potential of the node FN2. In a pair of terminals (nodes) of the capacitor CS2, one terminal is electrically connected to the node FN2 and the other terminal is electrically connected to the wiring RWL.

Figure 10B:
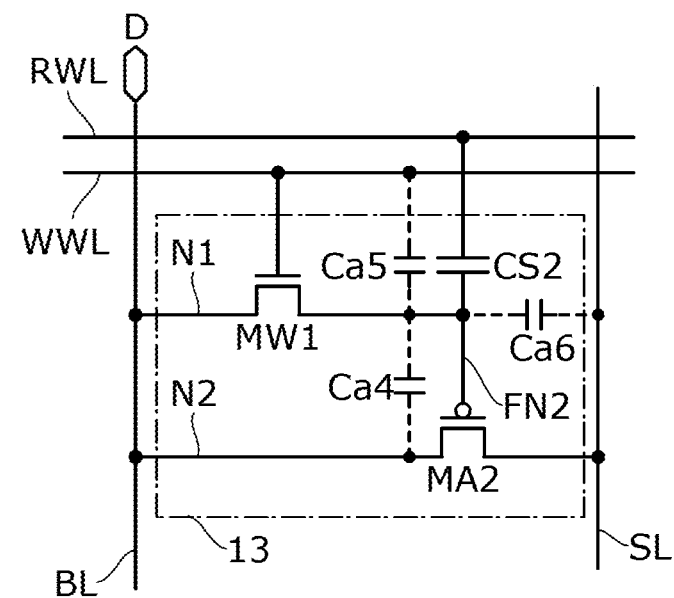
FIG. 10B is a circuit diagram illustrating coupling capacitance of storage nodes in a memory cell.

The node FN2 can function as a storage node that retains a potential corresponding to the data signal D, and corresponds to the gate of the transistor MA2. Coupling capacitance CCfn2 of the node FN2 is combined capacitance of the capacitor CS2 which is intentionally provided in the memory cell 13 and parasitic capacitance of the other node FN2. As illustrated in FIG. 10B, capacitance Ca4 (gate capacitance of the transistor MA2), capacitance Ca5 between the wiring WWL and the node FN2, and capacitance Ca6 between the wiring SL and the node FN2 can be given as the parasitic capacitance of the node FN2. The capacitance of the coupling capacitance CCfn2 corresponds to the sum of the capacitance of the capacitor CS2, and capacitance Ca4, Ca5, and Ca6.

Figure 11:
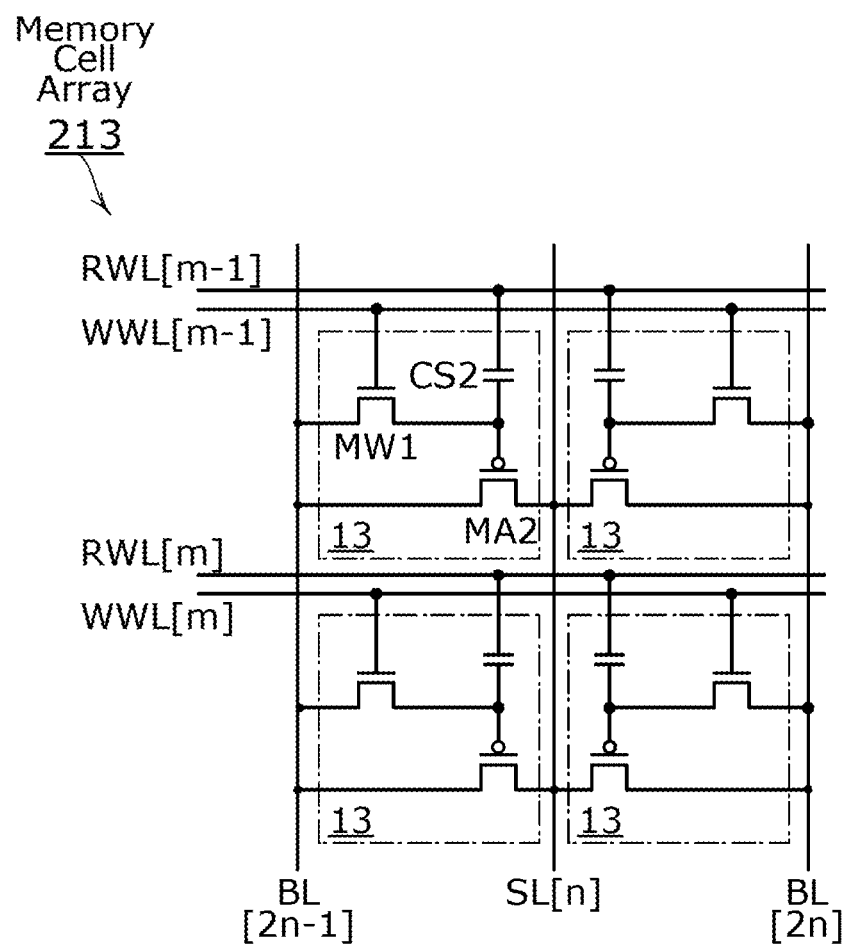
FIG. 11 is a circuit diagram illustrating an example of a memory cell array configuration.

FIG. 11 illustrates a configuration example of a memory cell array in which the memory cell 13 is used. A memory cell array 213 of FIG. 11 has a circuit configuration similar to a circuit configuration of the memory cell array 212 (FIG. 9).

<Operation Example: 2T Cell>

Figure 12:
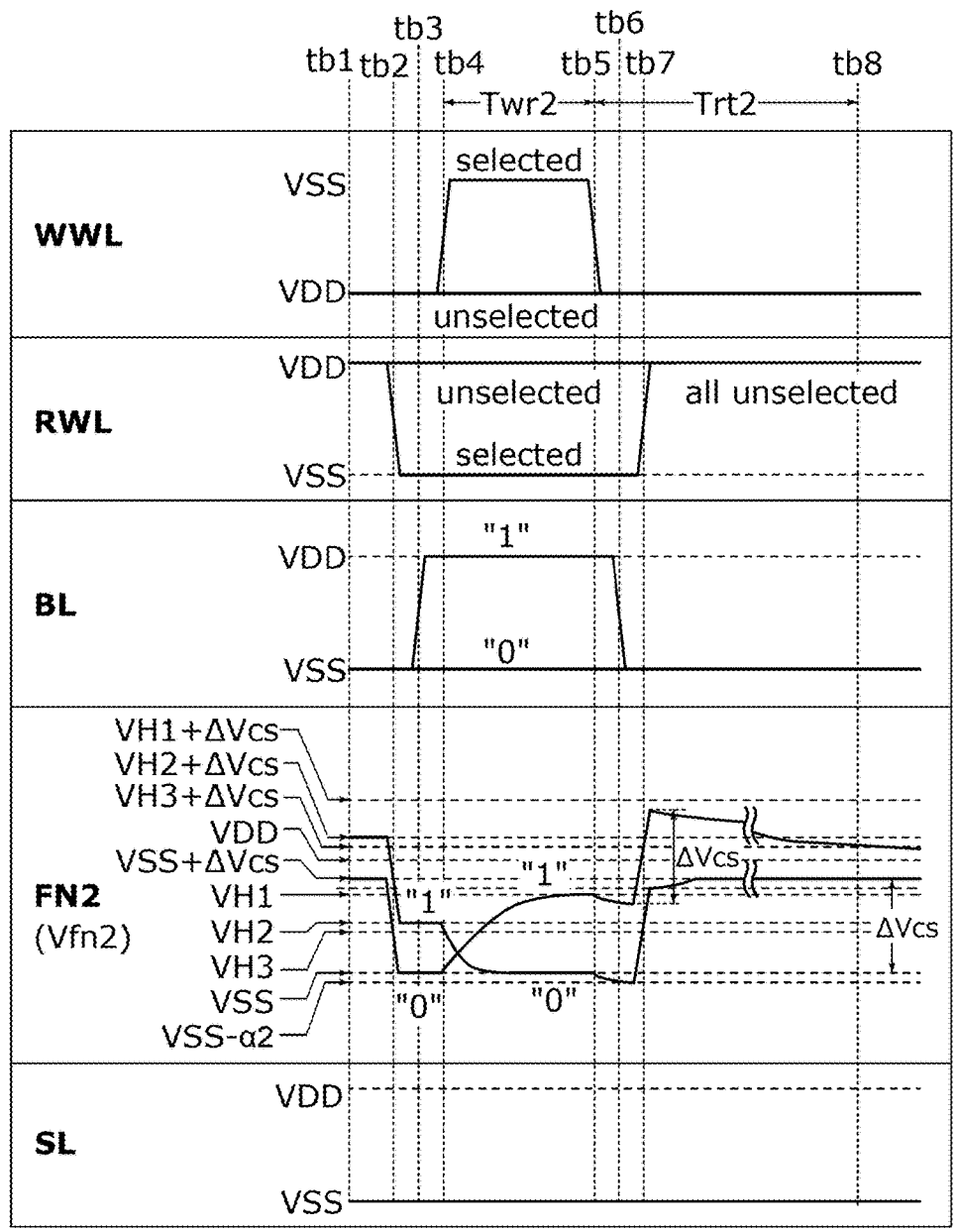
FIG. 12 is a timing chart illustrating an example of writing operation of a memory cell.
Figure 13:
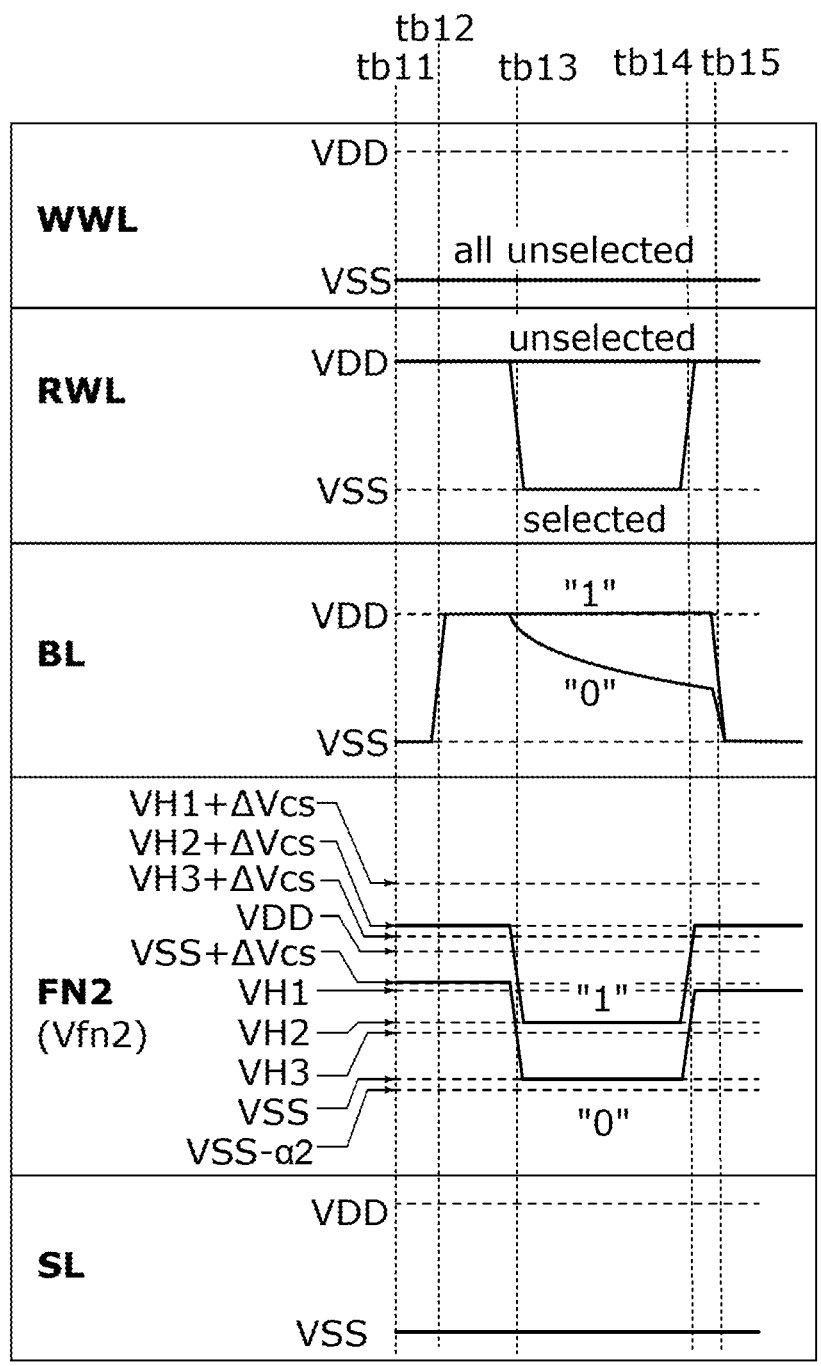
FIG. 13 is a timing chart illustrating an example of reading operation of a memory cell.

An operation example of the memory cell 13 (memory cell array 213) is described with reference to FIG. 12 and FIG. 13. The memory cell 13 can be driven in a manner similar to that of the memory cell 11 (FIG. 5 and FIG. 6). FIG. 12 and FIG. 13 are each a timing chart in the case where the transistor MW1 is an n-channel transistor and the transistor MA2 is a p-channel transistor, and each show changes in the potentials of the wirings WWL, RWL, BL, and SL and a change in the potential of the node FN2 (a potential Vfn2). H level driving potentials of the wirings WWL, RWL, BL, and SL are referred to as VDD and L level driving potentials thereof are referred to as VSS. For example, VDD can be higher than or equal to 1 V and lower than or equal to 2 V, and VSS can be 0 V. The memory cell 13 can be driven in a manner similar to that of the memory cell 11; therefore, the description with reference to FIG. 5 and FIG. 6 is referred to.

(Writing Operation)

FIG. 12 is a timing chart illustrating an example of writing operation of the memory cell 13, and tb1 to tb8 represent time.

The memory cell 13 is in a data retention state in a period from tb1 to tb2, and the potential of the wiring RWL is set to an H level. Therefore, the potential Vfn2 is higher than the potential at data writing (time tb4) by the influence of the coupling capacitance CCfn2. In the case where data "1" is written, the potential Vfn2 is VH2+$\Delta$Vcs, and in the case where data "0" is written, the potential Vfn2 is VSS+$\Delta$Vcs. Note that $\Delta$Vcs is a positive potential determined by CCfn2 and CS2, which is obtained by $\Delta$Vcs=(VDD−VSS)CS2/CCfn2. A gate-source voltage of the transistor MA2 is raised by setting the potential of the wiring RWL to the H level, so that the transistor MA2 can be kept off in a data retention state (non-selected state).

A potential corresponding to a value of data to be written is applied to the wiring BL in a period from tb3 to tb6. In the case where data "1" is written, VDD is applied to the wiring BL, and in the case where data "0" is written, VSS is applied thereto. A period from tb4 to tb5 corresponds to writing time Twr2. The potential of the wiring WWL in the row in which data is written (a selected row) is set to the H level, and the potential of the wiring WWL in the non-selected row is kept at the L level.

Before the potentials of the wiring WWL and BL are controlled, the potential of the wiring RWL is controlled at the time tb2. The potential of the selected wiring RWL is set to the L level, and the potential of the non-selected wiring RWL is kept at the H level. The potential Vfn2 of the node FN2 in the selected memory cell 13 lowers. Here, in the case where data "0" is written, the potential Vfn2 is VSS, and in the case where data "1" is written, the potential is VH2.

In the memory cell 13 selected in the period from tb4 to tb5, the transistor MW1 is turned on, and the node FN2 is electrically connected to the node N1 (wiring BL). When the potential of the wiring BL is VSS, the potential Vfn2 is VSS, and when the potential of the wiring BL is VDD, the capacitor CS2 (coupling capacitance CCfn2) is charged by the on-state current Iw$_{on}$ of the transistor MW1; therefore, the potential Vfn2 is raised gradually. Also in this operation example, the potential Vfn2 at the time tb5 when the potential of the wiring WWL becomes the L level can be set to VH1. That is, in the memory cell 13, the writing time Twr2 can be shortened in a manner similar to that of the memory cell 11. The node FN2 is brought into an electrically floating state at the time tb5. When the potential of the wiring WWL is changed from the H level to the L level, coupling capacitance between the wiring WWL and the node FN2 lowers the potential Vfn2. The amount of the reduction in potential is $\alpha$2. Note that $\alpha$2 is a positive potential determined by the coupling capacitance CCfn2.

The potential of the wiring RWL in the selected row is also set to the H level at the time tb7. The node FN2 and the wiring RWL are capacitively coupled to each other by the capacitor CS2; therefore, the potential Vfn2 rises by $\Delta$Vcs. In the case where data "0" is written, the potential Vfn2 rises to a potential close to VH2+$\Delta$Vcs in a relatively short period after the time tb7. Here, the potential Vfn2 is set to VSS+$\Delta$Vcs for convenience for a reason similar to that of the above potential Vfn1 (FIG. 5). In the case where data "1" is written, the potential Vfn2 is lowered gradually by the influence of the off-state current Iw$_{off}$ of the transistor MW1 after the time tb7. Also in this operation example, the allowable amount of decrease in the potential Vfn2 is VH1−VH3, and the time between the time tb5 and time tb8 in which the potential Vfn2 becomes VH3+$\Delta$Vcs corresponds to a retention time Trt2 of the memory cell 13.

<<Reading Operation>>

The reading operation of the memory cell 13 is described with reference to FIG. 13. In FIG. 13, tb11 to tb15 represent time.

The memory cell 13 is in a data retention state in a period from tb11 to tb12 as in the period from tb1 to tb2 in FIG. 12. After the potential of the wiring BL is precharged to VDD in a period from tb12 to tb13, the wiring BL is brought into an electrically floating state. At the time tb13, the potential of the wiring RWL in the selected row is set to the L level, and the potential of the wiring RWL in the non-selected row is kept at the H level. The node NF2 of the memory cell 13 in the selected row is capacitively coupled to the wiring RWL; therefore, the potential Vfn2 is lowered. In the case where data "1" is written, the potential Vfn2 is VH2, and in the case where data "0" is written, the potential Vfn2 is VSS.

In the case where data "0" is written, an on-state current flows through the transistor MA2; therefore, the potential of the wiring BL lowers gradually from VDD. In the case where data "1" is written, the transistor MA2 is off; therefore, the potential of the wiring BL is kept at VDD. The potential of the wiring BL or its amount of change is detected in the column driver circuit 232 in a period from tb13 to tb14, so that the value of data retained in the memory cell 13 can be detected. The memory cell 13 returns to a data retention state by setting the potential of the wiring RWL in the selected row to the H level at the time tb14 and setting the potential of the wiring BL to the L level at the time tb15.

<Configuration Example 6: 2T Cell>

In the memory cell 13, the node N1 and the node N2 are electrically connected to the common wiring BL; however, the node N1 can be electrically connected to the wiring WWL and the node N2 can be electrically connected to the wiring RWL as in the memory cell 11.

<Configuration Example 7: 2T Cell>

Figure 14:
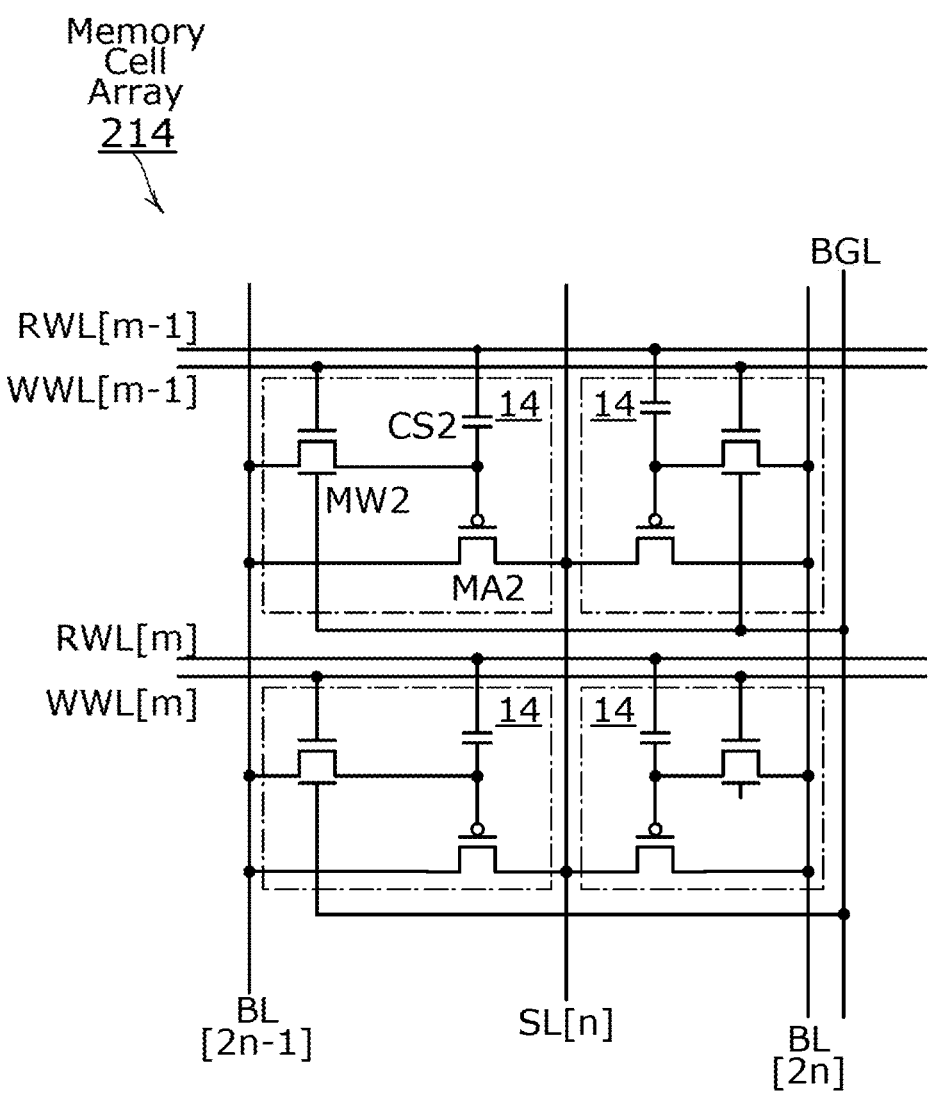
FIG. 14 is a circuit diagram illustrating an example of a memory cell array configuration.

In the memory cell 13, the transistor MW1 can be provided with a back gate as in the memory cell 12 (FIG. 9). FIG. 14 illustrates an example of a memory cell array configured with such memory cells.

As illustrated in FIG. 14, a memory cell array 214 has a configuration similar to a configuration of the memory cell array 213 (FIG. 11); therefore, the description of FIG. 11 can be referred to. A memory cell 14 differs from the memory cell 13 in that a writing transistor is the transistor MW2 including a back gate.

<Configuration Example 8: 2T Cell>

Figure 15:
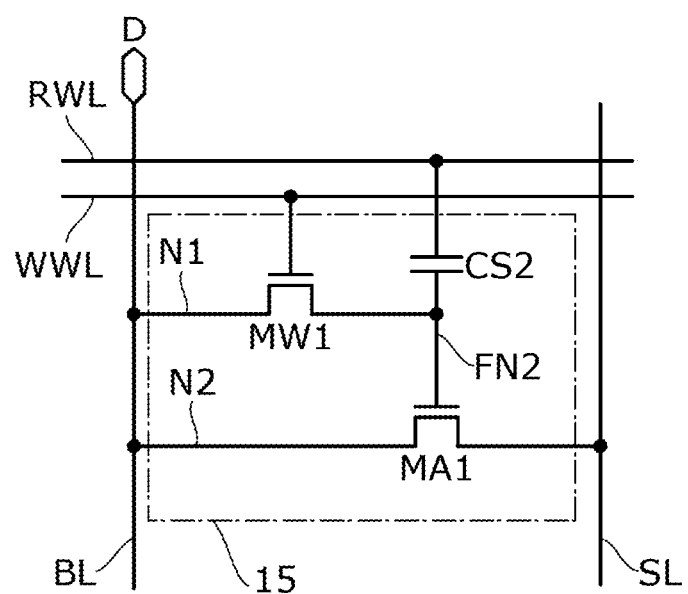
FIG. 15 is a circuit diagram illustrating an example of a memory cell configuration.

In the memory cell 13, the p-channel transistor MA2 is used for a reading (amplifying) transistor; however, an n-channel transistor MA1 can be used as illustrated in FIG. 15. In a memory cell 15 illustrated in FIG. 15, it is preferable to set the potential of the wiring RWL to a potential which is lower than VSS (a negative potential) so that the transistor MA1 can be kept off in writing operation and reading operation. By thus driving the wiring RWL, the power consumption of the memory cell 15 is larger than that of the memory cell 13. Therefore, it is advantageous to use a p-channel transistor as the reading (amplifying) transistor in the 2T cell configuration in terms of power saving.

<Configuration Example 9: 2T Cell>

In each of the memory cells 13 to 15, the wiring BL can be divided into the writing wiring WBL and the reading wiring RBL as in the memory cell 11 (FIGS. 3A and 3B).

Embodiment 2

In this embodiment, an OS transistor will be described as an example of a semiconductor device.

<<Structure Example 1 of OS Transistor>>

Figure 17A:
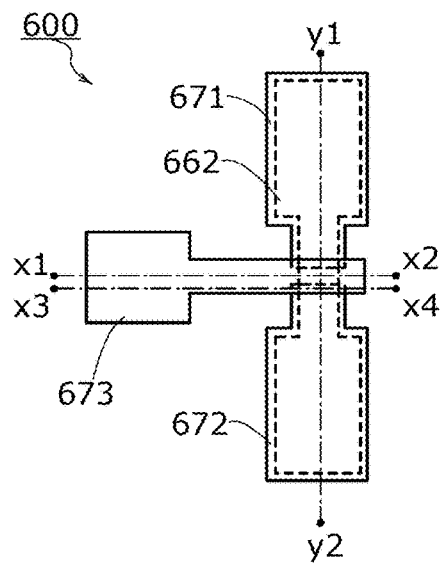
FIGS. 17A to 17D illustrate an example of a structure of an OS transistor (FIG. 17A is a top view, FIG. 17B is a cross-sectional view taken along the line y1-y2, FIG. 17C is a cross-sectional view taken along the line x1-x2, and FIG. 17D is a cross-sectional view taken along the line x3-x4).
Figure 17B:
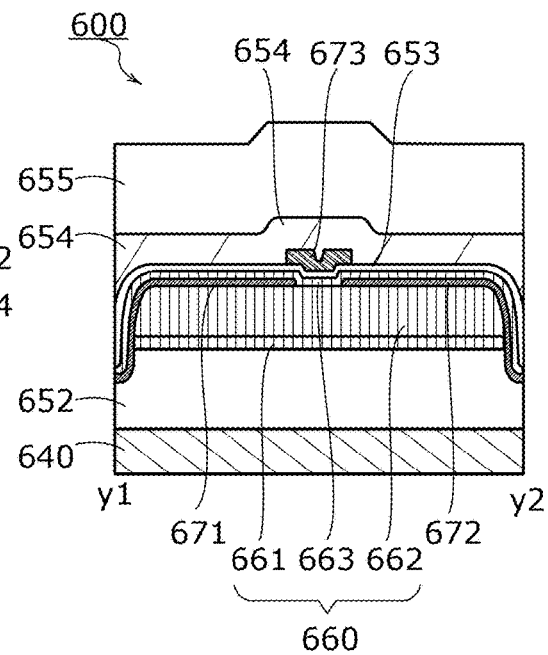
Figure 17C:
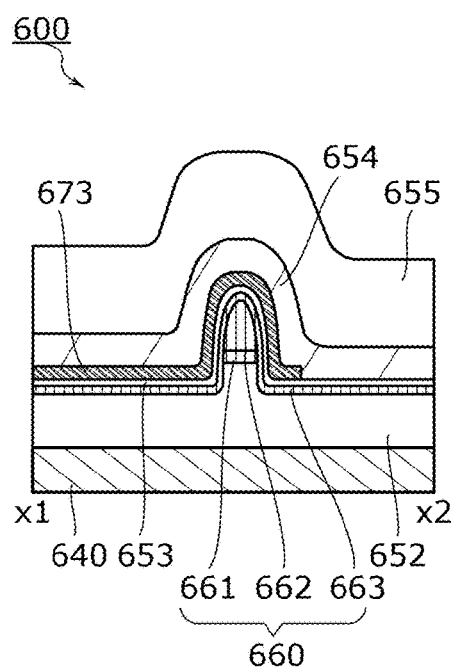
Figure 17D:
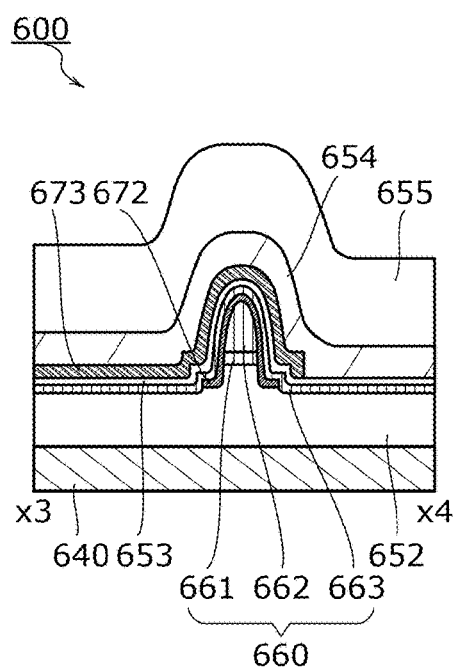

FIGS. 17A to 17D illustrate a structure example of an OS transistor. FIG. 17A is a top view illustrating a structure example of an OS transistor. FIG. 17B is a cross-sectional view taken along a line y1-y2, FIG. 17C is a cross-sectional view taken along a line x1-x2, and FIG. 17D is a cross-sectional view taken along a line x3-x4. Here, in some cases, the direction of the line y1-y2 is referred to as a channel length direction, and the direction of the line x1-x2 is referred to as a channel width direction. Accordingly, FIG. 17B illustrates a cross-sectional structure of the OS transistor in the channel length direction, and FIGS. 17C and 17D each illustrate a cross-sectional structure of the OS transistor in the channel width direction. Note that to clarify the device structure, FIG. 17A does not illustrate some components.

As illustrated in FIGS. 17A to 17D, an OS transistor 600 is formed over a substrate 640 and is covered with an insulating layer 654 and an insulating layer 655. The OS transistor includes an insulating layer 652, a gate insulating layer 653, oxide semiconductor (OS) layers 661 to 663, electrodes 671 and 672, and a gate electrode 673. Here, the OS layers 661, 662, and 663 are collectively referred to as an OS layer 660.

Over the insulating layer 652, an oxide semiconductor stack in which the OS layers 661 and 662 are stacked in this order is formed. The electrodes 671 and 672 are electrically connected to part of the stack. The OS layer 663 covers the stack and the electrodes 671 and 672. The gate insulating layer 653 is stacked over the OS layer 663. The gate electrode 673 overlaps with the stack of the OS layers 661 to 663 with the gate insulating layer 653 provided therebetween. The gate electrode 673 overlaps with part of the electrode 671 and part of the electrode 672 with the gate insulating layer 653 and the OS layer 663 provided therebetween.

The electrodes 671 and 672 each function as a source electrode or a drain electrode of the OS transistor 600. At least part (or all; the same applies to the following description) of the electrode 671 and/or the electrode 672 is in contact with at least part of a surface, side surfaces, a top surface, and/or a bottom surface of a semiconductor layer such as the OS layer 662 (and/or the OS layer 661).

Alternatively, at least part of the electrode 671 and/or the electrode 672 is in contact with at least part of a surface, side surfaces, a top surface, and/or a bottom surface of a semiconductor layer such as the OS layer 662 (and/or the OS layer 661). Alternatively, at least part of the electrode 671 and/or the electrode 672 is in contact with at least part of a semiconductor layer such as the OS layer 662 (and/or the OS layer 661).

Alternatively, at least part of the electrode 671 and/or the electrode 672 is electrically connected to at least part of a surface, side surfaces, a top surface, and/or a bottom surface of a semiconductor layer such as the OS layer 662 (and/or the OS layer 661). Alternatively, at least part of the electrode 671 and/or the electrode 672 is electrically connected to at least part (or all) of a semiconductor layer such as the OS layer 662 (and/or the OS layer 661).

Alternatively, at least part of the electrode 671 and/or the electrode 672 is provided near at least part of a surface, side surfaces, a top surface, and/or a bottom surface of a semiconductor layer such as the OS layer 662 (and/or the OS layer 661). Alternatively, at least part of the electrode 671 and/or the electrode 672 is provided near at least part (or all) of a semiconductor layer such as the OS layer 662 (and/or the OS layer 661).

Alternatively, at least part of the electrode 671 and/or the electrode 672 is provided on a side of at least part of a surface, side surfaces, a top surface, and/or a bottom surface of a semiconductor layer such as the OS layer 662 (and/or the OS layer 661). Alternatively, at least part of the electrode 671 and/or the electrode 672 is provided on a side of at least part (or all) of a semiconductor layer such as the OS layer 662 (and/or the OS layer 661).

Alternatively, at least part of the electrode 671 and/or the electrode 672 is provided obliquely above at least part of a surface, side surfaces, a top surface, and/or a bottom surface of a semiconductor layer such as the OS layer 662 (and/or the OS layer 661). Alternatively, at least part of the electrode 671 and/or the electrode 672 is provided obliquely above at least part (or all) of a semiconductor layer such as the OS layer 662 (and/or the OS layer 661).

Alternatively, at least part of the electrode 671 and/or the electrode 672 is provided above at least part of a surface, side surfaces, a top surface, and/or a bottom surface of a semiconductor layer such as the OS layer 662 (and/or the OS layer 661). Alternatively, at least part of the electrode 671 and/or the electrode 672 is provided above at least part (or all) of a semiconductor layer such as the OS layer 662 (and/or the OS layer 661).

<<Structure Example 2 of OS Transistor>>

Figure 18A:
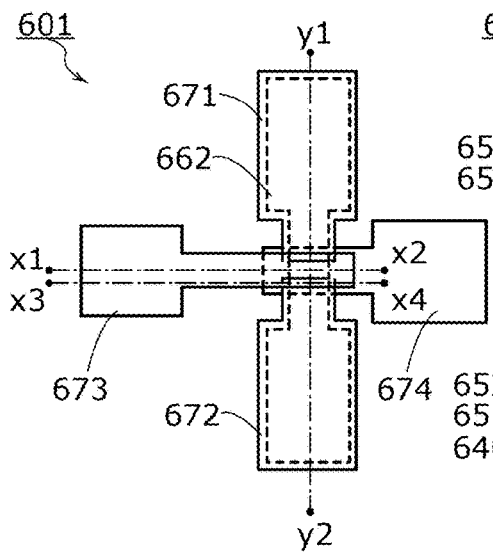
FIGS. 18A to 18D illustrate an example of a structure of an OS transistor (FIG. 18A is a top view, FIG. 18B is a cross-sectional view taken along the line y1-y2, FIG. 18C is a cross-sectional view taken along the line x1-x2, and FIG. 18D is a cross-sectional view taken along the line x3-x4).
Figure 18B:
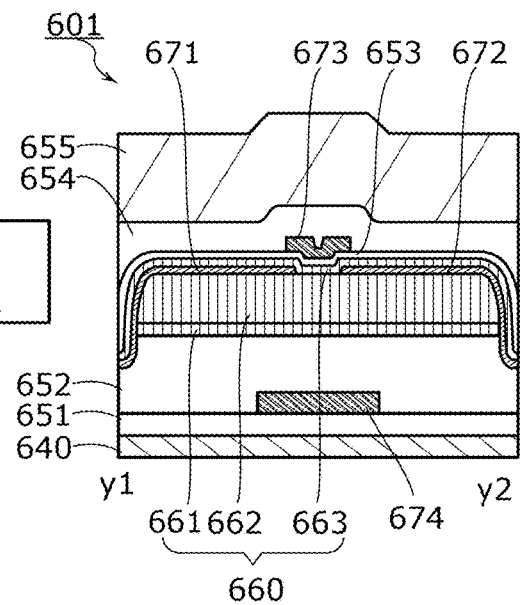
Figure 18C:
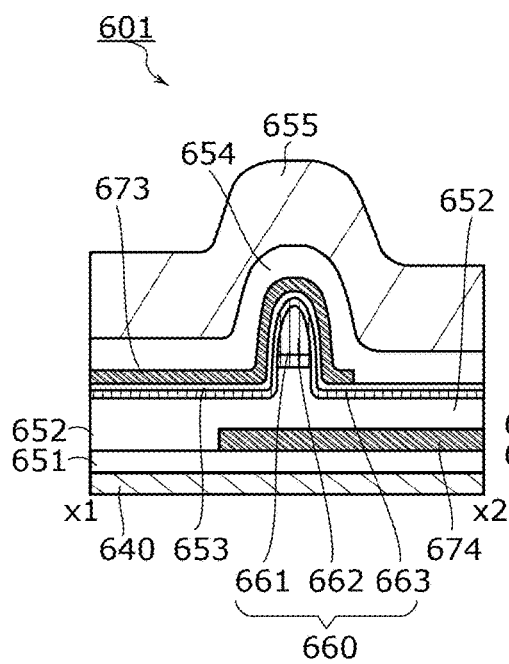
Figure 18D:
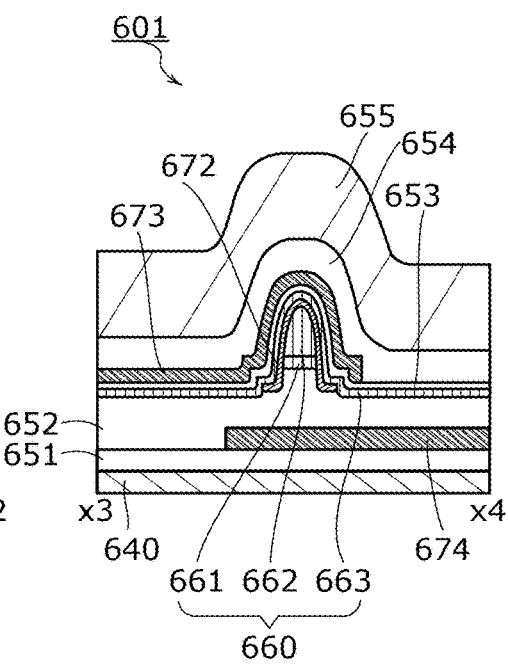

FIGS. 18A to 18D illustrate another structure example of an OS transistor. FIG. 18A is a top view illustrating a structure example of an OS transistor. FIG. 18B is a cross-sectional view taken along a line y1-y2, FIG. 18C is a cross-sectional view taken along a line x1-x2, and FIG. 18D is a cross-sectional view taken along a line x3-x4. Note that to clarify the device structure, FIG. 18A does not illustrate some components.

An OS transistor 601 illustrated in FIGS. 18A to 18D corresponds to the OS transistor 600 provided with a second gate electrode. A conductive film 674 is formed over the substrate 640 with an insulating layer 651 provided therebetween. The conductive film 674 functions as a gate electrode layer. The conductive film 674 may be supplied with a constant potential, or a potential or a signal that is the same as that supplied to the gate electrode 673.

An OS transistor with a technology node shorter than or equal to 60 nm or much shorter than or equal to 30 nm can be provided by employing a three-dimensional transistor structure as in the cases of the OS transistors 600 and 601. The components of the OS transistors 600 and 601 are described below.

<<Oxide Semiconductor Layer>>

As the semiconductor material of the OS layers 661 to 663, typically, an In—Ga oxide, an In—Zn oxide, or an In-M-Zn oxide (M is Ti, Ga, Y, Zr, La, Ce, Nd, Sn, or Hf) is used. In particular, the OS layer 660 is preferably formed using an In-M-Zn oxide. Needless to say, the OS layers 661 to 663 are not limited to the oxide layers containing indium. The OS layers 661 to 663 can be a Zn—Sn oxide layer or a Ga—Sn layer, for example.

In the case where the OS layers 661 to 663 are each an In-M-Zn oxide film formed by a sputtering method, it is preferable that the atomic ratio of metal elements of a target used for forming the In-M-Zn oxide film satisfy In M and Zn M. As the atomic ratio of metal elements of such a target, In:M:Zn=1:1:1, In:M:Zn=1:1:1.2, In:M:Zn=3:1:2, and In:M:Zn=2:1:3 are preferable. Note that the atomic ratios of metal elements in the oxide semiconductor films formed by a sputtering method vary within a range of ±40% as an error from the above atomic ratio of metal elements of the sputtering target which is used.

(Energy Band Structure)

Figure 19A:
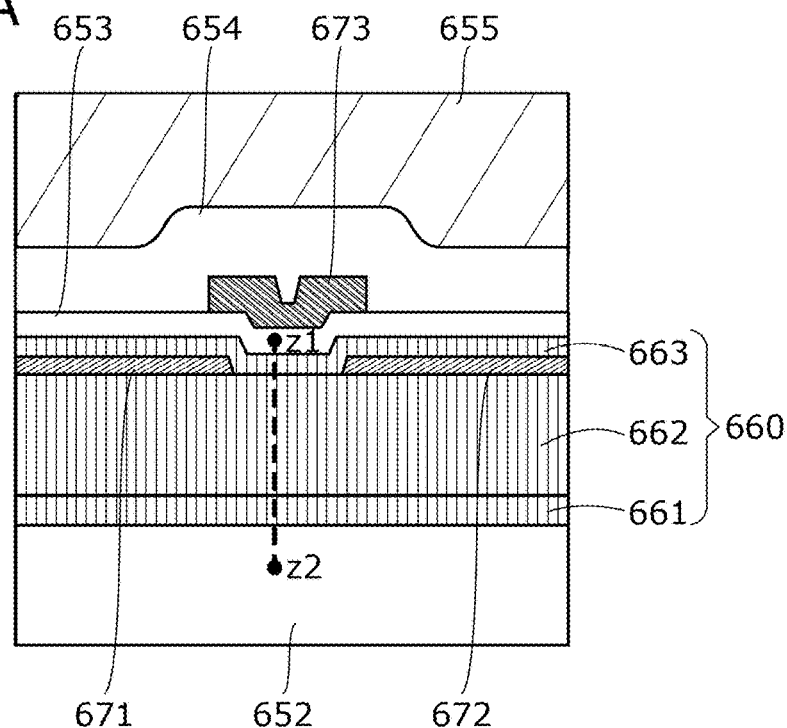
FIG. 19A is a partial enlarged view of FIG. 17B.
Figure 19B:
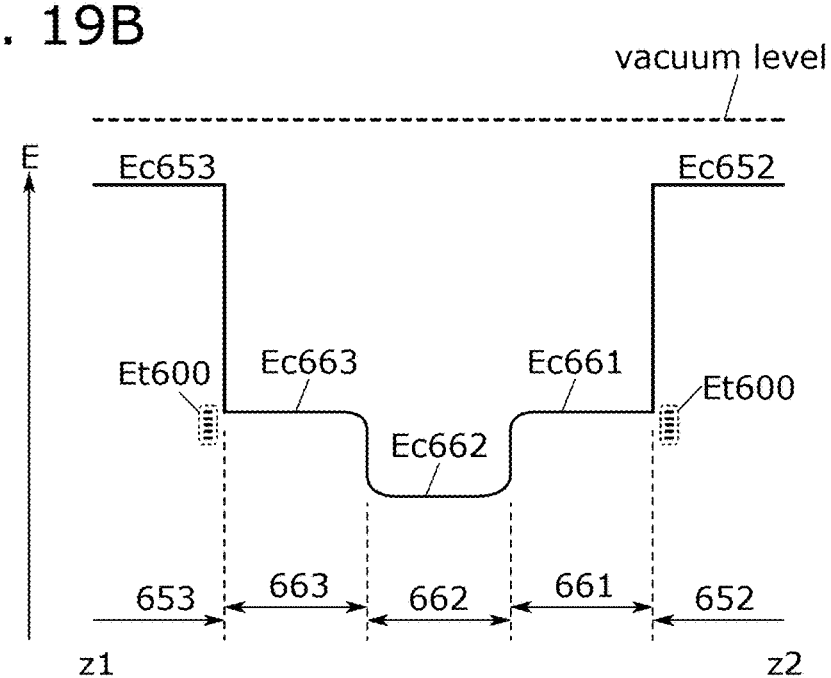
FIG. 19B is an energy band diagram of an OS transistor.

Next, a function and an effect of the OS layer 660 in which the OS layers 661, 662, and 663 are stacked are described using an energy band diagram in FIG. 19B. FIG. 19A is an enlarged view of a channel formation region of the OS transistor 600, which is illustrated in FIG. 17B. FIG. 19B shows an energy band diagram of a portion taken along a dotted line z1-z2 (the channel formation region of the OS transistor 600) in FIG. 19A.

In FIG. 19B, Ec652, Ec661, Ec662, Ec663, and Ec653 indicate the energy at the bottom of the conduction band of the insulating layer 652, the OS layer 661, the OS layer 662, the OS layer 663, and the gate insulating layer 653, respectively.

Here, a difference in energy between the vacuum level and the bottom of the conduction band (the difference is also referred to as "electron affinity") corresponds to a value obtained by subtracting an energy gap from a difference in energy between the vacuum level and the top of the valence band (the difference is also referred to as an ionization potential). Note that the energy gap can be measured using a spectroscopic ellipsometer (UT-300 manufactured by HORIBA JOBIN YVON S.A.S.). The energy difference between the vacuum level and the top of the valence band can be measured using an ultraviolet photoelectron spectroscopy (UPS) device (VersaProbe manufactured by ULVAC-PHI, Inc.).

Note that an In—Ga—Zn oxide which is formed using a sputtering target having an atomic ratio of In:Ga:Zn=1:3:2 has an energy gap of approximately 3.5 eV and an electron affinity of approximately 4.5 eV. An In—Ga—Zn oxide which is formed using a sputtering target having an atomic ratio of In:Ga:Zn=1:3:4 has an energy gap of approximately 3.4 eV and an electron affinity of approximately 4.5 eV. An In—Ga—Zn oxide which is formed using a sputtering target having an atomic ratio of In:Ga:Zn=1:3:6 has an energy gap of approximately 3.3 eV and an electron affinity of approximately 4.5 eV. An In—Ga—Zn oxide which is formed using a sputtering target having an atomic ratio of In:Ga:Zn=1:6:2 has an energy gap of approximately 3.9 eV and an electron affinity of approximately 4.3 eV. An In—Ga—Zn oxide which is formed using a sputtering target having an atomic ratio of In:Ga:Zn=1:6:8 has an energy gap of approximately 3.5 eV and an electron affinity of approximately 4.4 eV. An In—Ga—Zn oxide which is formed using a sputtering target having an atomic ratio of In:Ga:Zn=1:6:10 has an energy gap of approximately 3.5 eV and an electron affinity of approximately 4.5 eV. An In—Ga—Zn oxide which is formed using a sputtering target having an atomic ratio of In:Ga:Zn=1:1:1 has an energy gap of approximately 3.2 eV and an electron affinity of approximately 4.7 eV. An In—Ga—Zn oxide which is formed using a sputtering target having an atomic ratio of In:Ga:Zn=3:1:2 has an energy gap of approximately 2.8 eV and an electron affinity of approximately 5.0 eV.

Since the insulating layer 652 and the gate insulating layer 653 are insulators, Ec652 and Ec653 are closer to the vacuum level than Ec661, Ec662, and Ec663 (i.e., the insulating layer 652 and the gate insulating layer 653 have a smaller electron affinity than the OS layers 661, 662, and 663).

Ec661 is closer to the vacuum level than Ec662. Specifically, Ec661 is preferably located closer to the vacuum level than Ec662 by 0.05 eV or more, 0.07 eV or more, 0.1 eV or more, or 0.15 eV or more and 2 eV or less, 1 eV or less, 0.5 eV or less, or 0.4 eV or less.

Ec663 is closer to the vacuum level than Ec662. Specifically, Ec663 is preferably located closer to the vacuum level than Ec662 by 0.05 eV or more, 0.07 eV or more, 0.1 eV or more, or 0.15 eV or more and 2 eV or less, 1 eV or less, 0.5 eV or less, or 0.4 eV or less.

Mixed regions are formed in the vicinity of the interface between the OS layer 661 and the OS layer 662 and the interface between the OS layer 662 and the OS layer 663; thus, the energy at the bottom of the conduction band changes continuously. In other words, no state or few states exist at these interfaces.

Accordingly, electrons transfer mainly through the OS layer 662 in the stacked-layer structure having the above energy band structure. Therefore, even if an interface state exists at the interface between the OS layer 661 and the insulating layer 652 or the interface between the OS layer 663 and the gate insulating layer 653, the interface state hardly influences the transfer of electrons. In addition, since no interface state or few interface states exist at the interface between the OS layer 661 and the OS layer 662 and the interface between the OS layer 663 and the OS layer 662, the transfer of electrons is not interrupted in the region. Consequently, the transistor 600 including the above stacked OS layers 661 to 663 can have high field-effect mobility.

Although trap states Et600 due to impurities or defects might be formed in the vicinity of the interface between the OS layer 661 and the insulating layer 652 and the interface between the OS layer 663 and the gate insulating layer 653 as illustrated in FIG. 19B, the OS layer 662 can be separated from the trap states owing to the existence of the OS layers 661 and 663.

In the transistor 600 described in this embodiment as an example, in the channel width direction, the top surface and side surfaces of the OS layer 662 are in contact with the OS layer 663, and the bottom surface of the OS layer 662 is in contact with the OS layer 661 (see FIG. 17C). Surrounding the OS layer 662 by the OS layers 661 and 663 in this manner can further reduce the influence of the trap states.

However, when the energy difference between Ec662 and Ec661 or Ec663 is small, an electron in the OS layer 662 might reach the trap state by passing over the energy difference. Since the electron is trapped at the trap state, a negative fixed charge is generated at the interface with the insulating film, causing the threshold voltage of the transistor to be shifted in the positive direction.

Therefore, each of the energy gaps between Ec661 and Ec662 and between Ec662 and Ec663 is preferably 0.1 eV or more, or further preferably 0.15 eV or more, in which case a change in the threshold voltage of the transistor can be reduced and the transistor can have favorable electrical characteristics.

The band gap of each of the OS layers 661 and 663 is preferably wider than that of the OS layer 662.

For the OS layers 661 and 663, a material containing Al, Ti, Ga, Ge, Y, Zr, Sn, La, Ce, or Hf with a higher atomic ratio than that used for the OS layer 662 can be used, for example. Specifically, any of the above metal elements in an atomic ratio 1.5 times or more, preferably 2 times or more, or further preferably 3 times or more as much as a metal element of the OS layer 662 is contained. Any of the above metal elements is strongly bonded to oxygen and thus has a function of suppressing generation of an oxygen vacancy in the oxide semiconductor. That is, an oxygen vacancy is less likely to be generated in the OS layers 661 and the 663 than in the OS layer 662.

When each of the OS layers 661, 662, and 663 is an In-M-Zn oxide containing at least indium, zinc, and M (M is a metal such as Al, Ti, Ga, Ge, Y, Zr, Sn, La, Ce, or Hf) and the atomic ratio of In to M and Zn of the OS layer 661 is $x_1:y_1:z_1$, that of the OS layer 662 is $x_2:y_2:z_2$, and that of the OS layer 663 is $x_3:y_3:z_3$, each of $y_1/x_1$ and $y_3/x_3$ is preferably larger than $y_2/x_2$. Each of $y_1/x_1$ and $y_3/x_3$ is one and a half times or more as large as $y_2/x_2$, preferably twice or more as large as $y_2/x_2$, or further preferably three times or more as large as $y_2/x_2$. In this case, the transistor can have stable electrical characteristics when $y_2$ is greater than or equal to $x_2$ in the OS layer 662. However, when $y_2$ is three times or more as large as $x_2$, the field-effect mobility of the transistor is reduced; accordingly, $y_2$ is preferably smaller than three times $x_2$.

In the case where Zn and O are not taken into consideration, the proportion of In and the proportion of M in the OS layer 661 and the OS layer 663 are preferably less than 50 atomic % and greater than or equal to 50 atomic %, respectively, or further preferably less than 25 atomic % and greater than or equal to 75 atomic %, respectively. In the case where Zn and O are not taken into consideration, the proportion of In and the proportion of M in the OS layer 662 are preferably greater than or equal to 25 atomic % and less than 75 atomic %, respectively, or further preferably greater than or equal to 34 atomic % and less than 66 atomic %, respectively.

The thickness of each of the OS layers 661 and 663 is greater than or equal to 3 nm and less than or equal to 100 nm, or preferably greater than or equal to 3 nm and less than or equal to 50 nm. The thickness of the OS layer 662 is greater than or equal to 3 nm and less than or equal to 200 nm, preferably greater than or equal to 3 nm and less than or equal to 100 nm, or further preferably greater than or equal to 3 nm and less than or equal to 50 nm. The OS layer 662 is preferably thicker than the OS layers 661 and 663.

Note that stable electrical characteristics can be effectively imparted to a transistor in which an oxide semiconductor serves as a channel by reducing the concentration of impurities in the oxide semiconductor to make the oxide semiconductor intrinsic or substantially intrinsic. The term "substantially intrinsic" refers to the state where an oxide semiconductor has a carrier density lower than $1\times10^{17}/cm^3$, preferably lower than $1\times10^{15}/cm^3$, or further preferably lower than $1\times10^{13}/cm^3$.

In the oxide semiconductor, hydrogen, nitrogen, carbon, silicon, and a metal element other than a main component are impurities. For example, hydrogen and nitrogen form donor levels to increase the carrier density, and silicon forms impurity levels in the oxide semiconductor. The impurity level becomes a trap, which might deteriorate the electrical characteristics of the transistor. Therefore, it is preferable to reduce the concentration of the impurities in the OS layers 661, 662, and 663 and at interfaces between the OS layers.

In order to make the oxide semiconductor intrinsic or substantially intrinsic, for example, the concentration of silicon at a certain depth of the oxide semiconductor or in a region of the oxide semiconductor, which is measured by in secondary ion mass spectrometry (SIMS), is lower than $1\times10^{19}$ atoms/cm$^3$, preferably lower than $5\times10^{18}$ atoms/cm$^3$, or further preferably lower than $1\times10^{18}$ atoms/cm$^3$. The concentration of hydrogen at a certain depth of the oxide semiconductor or in a certain region of the oxide semiconductor is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, or still further preferably lower than or equal to $5\times10^{18}$ atoms/cm$^3$. The concentration of nitrogen at a certain depth of the oxide semiconductor or in a certain region of the oxide semiconductor is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, or still further preferably lower than or equal to $5\times10^{17}$ atoms/cm$^3$.

In addition, in the case where the oxide semiconductor includes a crystal, the crystallinity of the oxide semiconductor might be decreased if silicon or carbon is included at high concentration. In order not to lower the crystallinity of the oxide semiconductor, for example, the concentration of silicon at a certain depth of the oxide semiconductor or in a certain region of the oxide semiconductor is lower than $1\times10^{19}$ atoms/cm$^3$, preferably lower than $5\times10^{18}$ atoms/cm$^3$, or further preferably lower than $1\times10^{18}$ atoms/cm$^3$. Furthermore, the concentration of carbon at a certain depth of the oxide semiconductor or in a certain region of the oxide semiconductor is lower than $1\times10^{19}$ atoms/cm$^3$, preferably lower than $5\times10^{18}$ atoms/cm$^3$, or further preferably lower than $1\times10^{18}$ atoms/cm$^3$, for example.

A transistor in which a highly purified oxide semiconductor is used for a channel formation region as described above has an extremely low off-state current. In the case where the voltage between a source and a drain is set at approximately 0.1 V, 5 V, or 10 V, for example, the off-state current standardized on the channel width of the transistor can be as low as several yoctoamperes per micrometer to several zeptoamperes per micrometer.

In the transistor 600 described in this embodiment, the gate electrode 673 is formed to electrically surround the OS layer 660 in the channel width direction; consequently, a gate electric field is applied to the OS layer 660 in the side surface direction in addition to the perpendicular direction (see FIG. 17C). In other words, a gate electric field is applied to the whole oxide semiconductor, so that current flows through the entire OS layer 662 serving as a channel, leading to a further increase in on-state current. Note that the same applies to the OS transistor 601. The components and the like of the OS transistors 600 and 601 are described below.

<<Crystal Structure of Oxide Semiconductor>>

First, a structure of an oxide semiconductor forming the OS layer 660 is described.

Oxide semiconductors are classified roughly into a single-crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. In addition, examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor film that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

An oxide semiconductor layer of an OS transistor may be a stacked film including two or more of an amorphous oxide semiconductor film, an a-like OS film, an nc-OS film, and a CAAC-OS film, for example. In the case where the oxide semiconductor layer has a plurality of structures, electron diffraction using an electron beam having a beam diameter approximately greater than or equal to 1 nm and less than or equal to 30 nm (also referred to as nanobeam electron diffraction) enables analysis of the structures in some cases.

<CAAC-OS>

A CAAC-OS is one of oxide semiconductors having a plurality of c-axis aligned crystal parts (also referred to as pellets). In a combined analysis image (also referred to as a high-resolution TEM image) of a bright-field image and a diffraction pattern of a CAAC-OS, which is obtained using a transmission electron microscope (TEM), a plurality of crystal parts can be observed. However, in the high-resolution TEM image, a boundary between crystal parts, that is, a grain boundary is not clearly observed. Thus, in the CAAC-OS, a reduction in electron mobility due to the grain boundary is less likely to occur.

According to the TEM image of the CAAC-OS observed in a direction substantially parallel to a sample surface (cross-sectional TEM image), metal atoms are arranged in a layered manner in the crystal parts. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

In the high-resolution cross-sectional TEM image of the CAAC-OS observed in a direction substantially parallel to the sample surface, metal atoms arranged in a layered manner are seen in the crystal parts. In the high-resolution planar TEM image of the CAAC-OS observed in a direction substantially perpendicular to the sample surface, metal atoms arranged in a triangular or hexagonal configuration are seen in the crystal parts. However, there is no regularity of arrangement of metal atoms between different crystal parts. The results of the high-resolution cross-sectional TEM image and the high-resolution plan TEM image show that the crystal parts in the CAAC-OS have alignment.

Note that in an electron diffraction pattern of the CAAC-OS, spots (bright spots) having alignment are shown. For example, when electron diffraction with an electron beam having a diameter greater than or equal to 1 nm and less than or equal to 30 nm (such electron diffraction is also referred to as nanobeam electron diffraction) is performed on the top surface of the CAAC-OS, spots are observed.

Most of the crystal parts included in the CAAC-OS each fit inside a cube whose one side is less than 100 nm. Thus, there is a case where a crystal part included in the CAAC-OS fits inside a cube whose one side is less than 10 nm, less than 5 nm, or less than 3 nm. Note that when a plurality of crystal parts included in the CAAC-OS are connected to each other, one large crystal region is formed in some cases. For example, a crystal region with an area of 2500 $nm^2$ or more, 5 $\mu m^2$ or more, or 1000 $\mu m^2$ or more is observed in some cases in the plan high-resolution TEM image.

A CAAC-OS is subjected to structural analysis with an X-ray diffraction (XRD) apparatus. For example, when the CAAC-OS including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

On the other hand, when the CAAC-OS is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2φ fixed at around 56°. In the case where the sample is a single-crystal oxide semiconductor of $InGaZnO_4$, six peaks appear. The six peaks are derived from crystal planes equivalent to the (110) plane. On the other hand, in the case of a CAAC-OS, a peak is not clearly observed even when φ scan is performed with 2θ fixed at around 56°.

According to the above results, in the CAAC-OS having c-axis alignment, while the directions of a-axes and b-axes are irregularly oriented between crystal parts, the c-axes are aligned in a direction parallel to a normal vector of a formation surface or a normal vector of a top surface. Thus, each metal atom layer arranged in a layered manner observed in the high-resolution cross-sectional TEM image corresponds to a plane parallel to the a-b plane of the crystal.

Note that the crystal part is formed concurrently with deposition of the CAAC-OS or is formed through crystallization treatment such as heat treatment. As described above, the c-axis of the crystal is aligned in a direction parallel to a normal vector of a formation surface or a normal vector of a top surface of the CAAC-OS. Thus, for example, in the case where a shape of the CAAC-OS is changed by etching or the like, the c-axis might not be necessarily parallel to a normal vector of a formation surface or a normal vector of a top surface of the CAAC-OS.

Distribution of c-axis aligned crystal parts in the CAAC-OS is not necessarily uniform. For example, in the case where crystal growth leading to the crystal parts of the CAAC-OS occurs from the vicinity of the top surface of the CAAC-OS, the proportion of the c-axis aligned crystal parts in the vicinity of the top surface is higher than that in the vicinity of the formation surface in some cases. Furthermore, when an impurity is added to the CAAC-OS, a region to which the impurity is added is altered, and the proportion of the c-axis aligned crystal parts in the CAAC-OS varies depending on regions, in some cases.

Note that when the CAAC-OS with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS. It is preferable that in the CAAC-OS, a peak of 2θ appear at around 31° and a peak of 2θ not appear at around 36°.

The CAAC-OS is an oxide semiconductor film having low impurity concentration. The impurity is an element other than the main components of the oxide semiconductor, such as hydrogen, carbon, silicon, or a transition metal element. In particular, an element that has higher bonding strength to oxygen than a metal element included in the oxide semiconductor, such as silicon, disturbs the atomic arrangement of the oxide semiconductor by depriving the oxide semiconductor of oxygen and causes a decrease in crystallinity. Furthermore, a heavy metal such as iron or nickel, argon, carbon dioxide, or the like has a large atomic radius (or molecular radius), and thus disturbs the atomic arrangement of the oxide semiconductor film and causes a decrease in crystallinity when it is contained in the oxide semiconductor film. Note that the impurity contained in the oxide semiconductor might serve as a carrier trap or a carrier generation source.

The CAAC-OS is an oxide semiconductor film having a low density of defect states. In some cases, oxygen vacancies in the oxide semiconductor serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor has few carrier generation sources, and thus can have a low carrier density. Thus, a transistor including the oxide semiconductor rarely has negative threshold voltage (is rarely normally on). The highly purified intrinsic or substantially highly purified intrinsic oxide semiconductor has few carrier traps. Accordingly, the transistor including the oxide semiconductor has little variation in electrical characteristics and high reliability. Electric charge trapped by the carrier traps in the oxide semiconductor takes a long time to be released, and might behave like fixed electric charge. Thus, the transistor which includes the oxide semiconductor having high impurity concentration and a high density of defect states has unstable electrical characteristics in some cases.

With the use of the CAAC-OS film in an OS transistor, variation in the electrical characteristics of the transistor due to irradiation with visible light or ultraviolet light is small. Furthermore, a transistor including the CAAC-OS film is more resistant to external force, such as deformation due to substrate bending, than a polysilicon transistor and a single crystal silicon transistor and thus is suitable for a highly flexible substrate such as a plastic substrate.

For the deposition of the CAAC-OS film by a sputtering method, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, and nitrogen) that exist in the treatment chamber may be reduced. Furthermore, the concentration of impurities in a deposition gas may be reduced. Specifically, a deposition gas whose dew point is −80° C. or lower, or preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., or preferably higher than or equal to 200° C. and lower than or equal to 500° C. By increasing the substrate heating temperature during the deposition, when the flat-plate-like or pellet-like sputtered particle reaches the substrate, migration occurs on the substrate, so that a flat plane of the sputtered particle is attached to the substrate.

Furthermore, it is preferable that the proportion of oxygen in the deposition gas be increased and the power be optimized in order to reduce plasma damage at the deposition. The proportion of oxygen in the deposition gas is higher than or equal to 30 vol %, or preferably 100 vol %.

As an example of the target, an In—Ga—Zn-based oxide target is described below.

The In—Ga—Zn-based oxide target, which is polycrystalline, is made by mixing InO$_X$ powder, GaO$_Y$ powder, and ZnO$_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of InO$_X$ powder to GaO$_Y$ powder and ZnO$_Z$ powder is, for example, 2:2:1, 8:4:3, 3:1:1, 1:1:1, 4:2:3, 1:4:4, 3:1:2, or 2:1:3. The kinds of powder and the molar ratio for mixing powder is determined as appropriate depending on the desired target.

<nc-OS>

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 100 nm, or greater than or equal to 1 nm and less than or equal to 10 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS. Thus, the orientation of the whole film is not observed. Accordingly, in some cases, the nc-OS cannot be distinguished from an amorphous oxide semiconductor depending on an analysis method. For example, when the nc-OS is analyzed by an out-of-plane method using an X-ray beam having a diameter larger than the size of a crystal part, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a crystal part. Meanwhile, spots appear in a nanobeam electron diffraction pattern of the nc-OS when an electron beam having a probe diameter close to or smaller than the size of a crystal part is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

The nc-OS is an oxide semiconductor that has high regularity as compared with an amorphous oxide semiconductor. Therefore, the nc-OS is likely to have a lower density of defect states than an amorphous oxide semiconductor. Note that there is no regularity of crystal orientation between different crystal parts in the nc-OS. Therefore, the nc-OS has a higher density of defect states than the CAAC-OS.

<a-like OS>

An a-like OS has a structure intermediate between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed. The a-like OS has an unstable structure because it includes a void. To verify that an a-like OS has an unstable structure as compared with a CAAC-OS and an nc-OS, a change in structure caused by electron irradiation is described below.

<Substrate>

The substrate 640 is not limited to a simple supporting substrate and may be a substrate where a device such as a transistor is formed. In that case, one of the gate electrode 673 and the electrodes 671 and 672 of the OS transistor 600 may be electrically connected to the device.

<Base Insulating Film>

The insulating layer 652 can have a function of supplying oxygen to the OS layer 660 as well as a function of preventing diffusion of impurities from the substrate 640. For this reason, the insulating layer 652 preferably contains oxygen and further preferably has an oxygen content higher than that in the stoichiometric composition. For example, the insulating layer 652 is a film in which the amount of released oxygen converted into oxygen atoms is $1.0 \times 10^{19}$ atoms/cm$^3$ or more in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C. When the substrate 640 is a substrate where a device is formed as described above, the insulating layer 652 is preferably subjected to planarization treatment such as chemical mechanical polishing (CMP) treatment so as to have a flat surface.

The insulating layer 652 can be formed using an oxide insulating film of aluminum oxide, aluminum oxynitride, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like, a nitride insulating film of silicon nitride, silicon nitride oxide, aluminum nitride oxide, or the like, or a film in which any of the above materials are mixed.

<Gate Electrode>

The gate electrode 673 can be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), cobalt (Co), and ruthenium (Ru); an alloy containing any of these metal element as its component; an alloy containing a combination of any of these metal elements; or the like. The gate electrode 673 may have a single-layer structure or a stacked-layer structure of two or more layers.

For example, any of the following structures can be employed: a single-layer structure of an aluminum film containing silicon; a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a three-layer structure in which a titanium film, an aluminum film, and a titanium film are stacked in this order; a single-layer structure of a Cu—Mn alloy film; a two-layer structure in which a Cu film is stacked over a Cu—Mn alloy film; and a three-layer structure in which a Cu—Mn alloy film, a Cu film, and a Cu—Mn alloy film are stacked in this order. A Cu—Mn alloy film is preferably used because of its low electrical resistance and because it forms manganese oxide at the interface with an insulating film containing oxygen and manganese oxide can prevent Cu diffusion.

The gate electrode 673 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

<Gate Insulating Layer>

The gate insulating layer 653 is formed using an insulating film having a single-layer structure or a stacked-layer structure. The gate insulating layer 653 can be formed using an insulating film containing at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The gate insulating layer 653 may be a stack including any of the above materials. The gate insulating layer 653 may contain lanthanum (La), nitrogen, or zirconium (Zr) as an impurity. The insulating layer 651 can be formed in a manner similar to that for the gate insulating layer 653.

An example of a stacked-layer structure of the gate insulating layer 653 is described. The gate insulating layer 653 contains oxygen, nitrogen, silicon, or hafnium, for example. Specifically, the gate insulating layer 653 preferably includes hafnium oxide, and silicon oxide or silicon oxynitride.

Hafnium oxide has a higher dielectric constant than silicon oxide and silicon oxynitride. Therefore, by using hafnium oxide, a physical thickness can be made larger than an equivalent oxide thickness; thus, even in the case where the equivalent oxide thickness is less than or equal to 10 nm or less than or equal to 5 nm, leakage current due to tunnel current can be small. That is, a transistor with a low off-state current can be provided. Moreover, hafnium oxide with a crystal structure has a higher dielectric constant than hafnium oxide with an amorphous structure. Therefore, it is preferable to use hafnium oxide with a crystal structure in order to provide a transistor with a low off-state current. Examples of the crystal structure include a monoclinic crystal structure and a cubic crystal structure. Note that one embodiment of the present invention is not limited to the above examples.

<Source Electrode, Drain Electrode, and Second Gate Electrode>

The electrodes 671 and 672 and the conductive film 674 can be formed in a manner similar to that of the gate electrode 673. A Cu—Mn alloy film is preferably used for the electrodes 671 and 672 because of its low electrical resistance and because it forms manganese oxide at the interface with the OS layer 660 and manganese oxide can prevent Cu diffusion.

<Protective Insulating Film>

The insulating layer 654 has a function of blocking oxygen, hydrogen, water, an alkali metal, an alkaline earth metal, and the like. The provision of the insulating layer 654 can prevent outward diffusion of oxygen from the OS layer 660 and entry of hydrogen, water, or the like into the OS layer 660 from the outside. The insulating layer 654 can be a nitride insulating film, for example. The nitride insulating film is formed using silicon nitride, silicon nitride oxide, aluminum nitride, aluminum nitride oxide, or the like. Note that instead of the nitride insulating film having a blocking effect against oxygen, hydrogen, water, an alkali metal, an alkaline earth metal, and the like, an oxide insulating film having a blocking effect against oxygen, hydrogen, water, and the like may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

An aluminum oxide film is preferably used as the insulating layer 654 because it is highly effective in preventing transmission of both oxygen and impurities such as hydrogen and moisture. Thus, during and after the manufacturing process of the transistor, the aluminum oxide film can suitably function as a protective film that has effects of preventing entry of impurities such as hydrogen and moisture, which cause variations in the electrical characteristics of the transistor, into the OS layer 660, preventing release of oxygen, which is the main component of the OS layer 660, from the oxide semiconductor, and preventing unnecessary release of oxygen from the insulating layer 652. In addition, oxygen contained in the aluminum oxide film can be diffused into the oxide semiconductor.

<Interlayer Insulating Film>

The insulating layer 655 is preferably formed over the insulating layer 654. The insulating layer 655 can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The oxide insulating film may be a stack of any of the above materials.

<<Film Formation Method>>

A sputtering method and a plasma-enhanced chemical vapor deposition (PECVD) method are typical examples of a method of forming an insulating film, a conductive film, a semiconductor film, and the like. The insulating film, the conductive film, the semiconductor film, and the like may be formed by another method, for example, a thermal CVD method. A metal organic chemical vapor deposition (MOCVD) method or an atomic layer deposition (ALD) method can be employed as a thermal CVD method, for example.

A thermal CVD method does not generate plasma and thus has an advantage that no defect due to plasma damage is caused. Deposition by a thermal CVD method may be performed in such a manner that the pressure in a chamber is set to an atmospheric pressure or a reduced pressure, and a source gas and an oxidizer are supplied to the chamber at the same time and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). In such a case, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at the same time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed. The sequence of the gas introduction is repeated more than once until desired thickness is obtained, so that a thin film with excellent step coverage can be formed. The thickness of the thin film can be adjusted by the number of repetition times of the sequence of the gas introduction; therefore, an ALD method makes it possible to accurately adjust thickness and thus is suitable for manufacturing a minute FET.

The conductive film and the semiconductor film that are described in the above embodiment can be formed by a thermal CVD method such as a MOCVD method or an ALD method. For example, in the case where an $InGaZnO_X$ (X>0) film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a tungsten film is formed using a deposition apparatus employing ALD, a $WF_6$ gas and a $B_2H_6$ gas are sequentially introduced more than once to form an initial tungsten film, and then a $WF_6$ gas and an $H_2$ gas are introduced at the same time, so that a tungsten film is formed. Note that an $SiH_4$ gas may be used instead of a $B_2H_6$ gas.

For example, in the case where an oxide semiconductor film, for example, an $InGaZnO_X$ (X>0) film is formed using a deposition apparatus employing ALD, an $In(CH_3)_3$ gas and an $O_3$ gas are sequentially introduced more than once to form an $InO_2$ layer, a $Ga(CH_3)_3$ gas and an $O_3$ gas are introduced at the same time to form a GaO layer, and then a $Zn(CH_3)_2$ gas and an $O_3$ gas are introduced at the same time to form a ZnO layer. Note that the order of these layers is not limited to this example. A mixed compound layer such as an $InGaO_2$ layer, an $InZnO_2$ layer, a GaInO layer, a ZnInO layer, or a GaZnO layer may be formed by mixing these gases. Note that although an H$_2$O gas that is obtained by bubbling with an inert gas such as Ar may be used instead of an O$_3$ gas, it is preferable to use an O$_3$ gas, which does not contain H. Instead of an In(CH$_3$)$_3$ gas, an In(C$_2$H$_5$)$_3$ gas may be used. Instead of a Ga(CH$_3$)$_3$ gas, a Ga(C$_2$H$_5$)$_3$ gas may be used. Furthermore, a Zn(CH$_3$)$_2$ gas may be used.

Embodiment 3

In this embodiment, a semiconductor device structure will be described. As described in Embodiment 1, a semiconductor device can be formed with a Si transistor and an OS transistor. The semiconductor device with such a structure can be reduced in size by stacking a Si transistor and an OS transistor. A structure example of the semiconductor device with such a stacked-layer structure is described with reference to FIG. 20 and FIG. 21.

Figure 20:
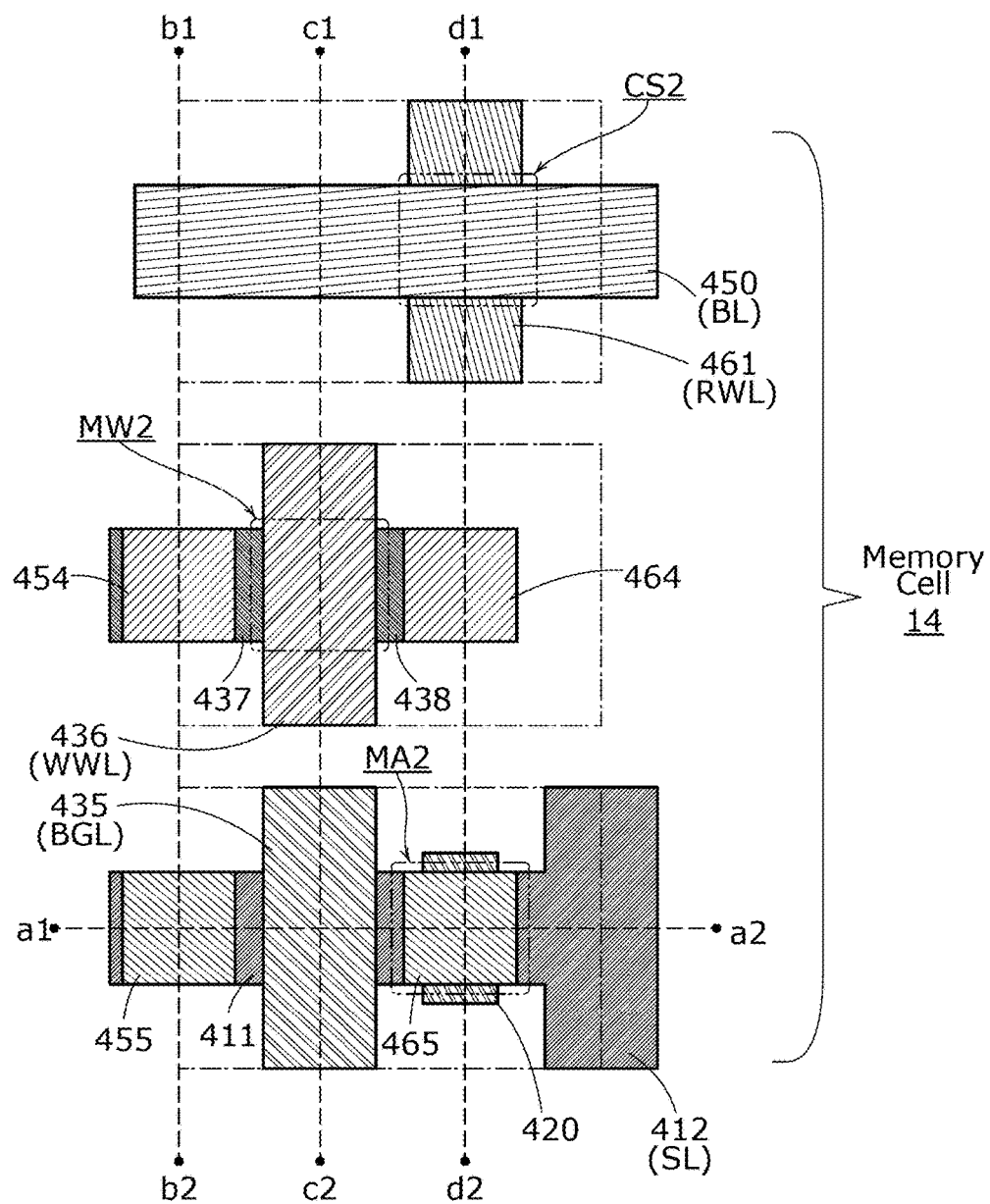
FIG. 20 is a plan view illustrating a layout example of a memory cell.
Figure 21:
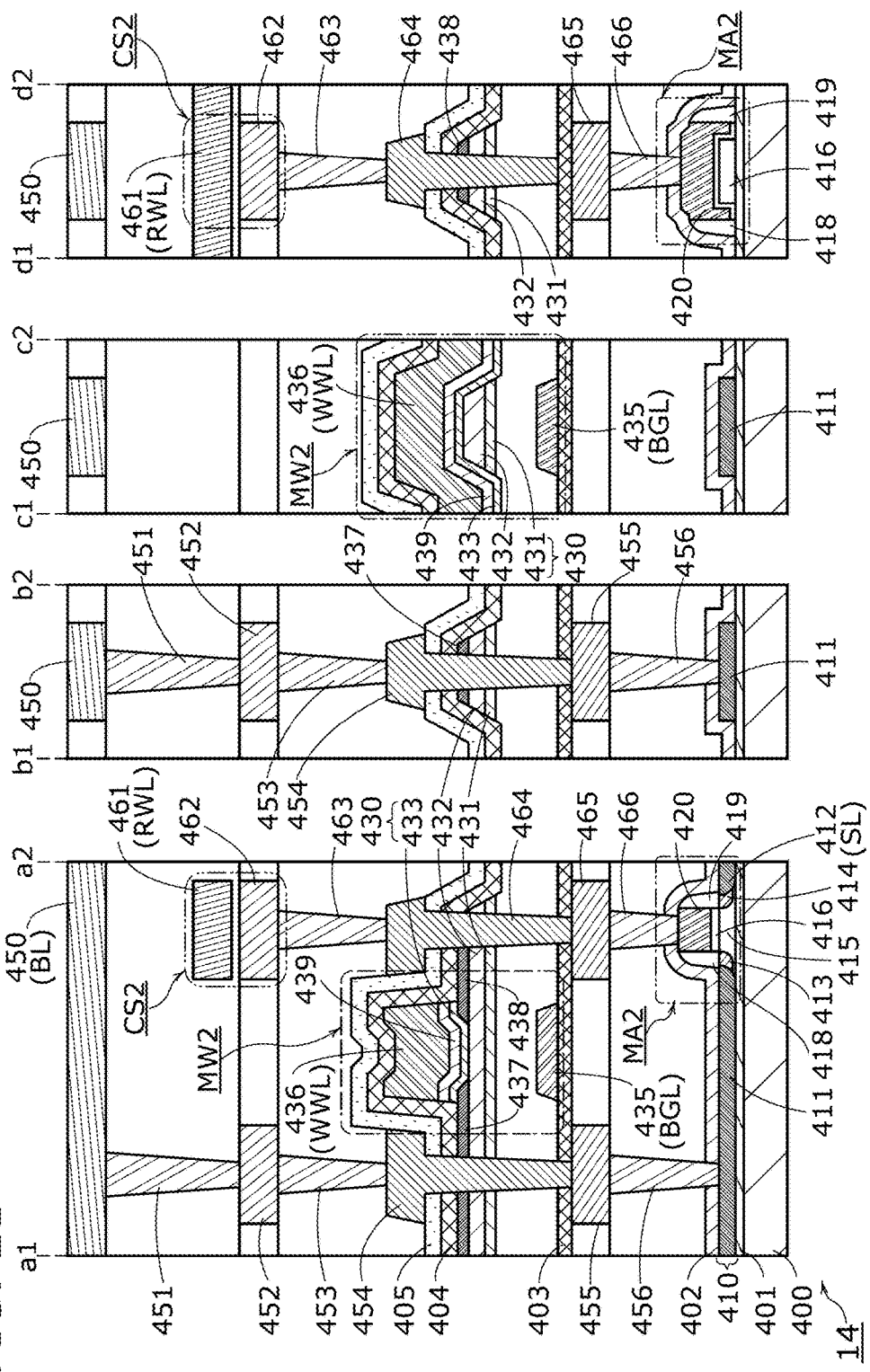
FIG. 21 is a cross-sectional view taken along the lines a1-a2, b1-b2, c1-c2, and d1-d2 of FIG. 20.

As an example of the semiconductor device, the device structure of the semiconductor memory device 200 is described. As described in Embodiment 1, a combination of an OS transistor and a Si transistor is used to configure a memory cell having a 2T cell configuration or a 3T cell configuration which can be used in the semiconductor memory device 200. The device structure of the memory cell is described using the memory cell 14 (FIG. 14) as an example. FIG. 20 and FIG. 21 are a top view and a cross-sectional view, respectively, each illustrating a structure example of the memory cell 14.

In FIG. 20, the circuit layout of the memory cell 14 is divided into three plan views for clarity, and some components (e.g., an insulating layer) are omitted. FIG. 21 illustrates a cross-sectional structure of FIG. 20 taken along the lines a1-a2, b1-b2, c1-c2, and d1-d2. The cross-sectional view taken along the line a1-a2 is a cross-sectional view of the transistors MW1 and MA2 in the channel length direction. The cross-sectional view taken along the line c1-c2 is a cross-sectional view of the transistor MW1 in the channel width direction. The cross-sectional view taken along the line d1-d2 is a cross-sectional view of the transistor MA2 in the channel width direction. In FIG. 21, regions where reference numerals and hatching patterns are not given show regions formed using an insulator. The region can be formed using an insulator containing one or more of aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Alternatively, in these regions, an organic resin such as a polyimide resin, a polyamide resin, an acrylic resin, a siloxane resin, an epoxy resin, or a phenol resin can be used.

The transistor MW2 of the memory cell 14 in FIG. 20 and FIG. 21 can also be formed in a manner similar to that of the transistor 600 in FIGS. 19A and 19B. FIG. 20 and FIG. 21 illustrate a layout example and a device structure example in which a technology node of an OS transistor can be set to be shorter than or equal to 60 nm or shorter than or equal to 30 nm. FIG. 20 illustrates an example in which the memory cell is designed so that the widths of the wiring and electrode are set to the minimum feature size F.

<Transistor MA2>

Here, a planar-type field-effect transistor is used as the transistor MA2. The transistor MA2 is manufactured using an SOI semiconductor substrate including a single crystal silicon layer. A substrate 400 is a substrate (e.g., a single crystal silicon substrate) that supports the single crystal silicon layer. An insulating layer 401 is a buried oxide layer (BOX layer) for insulating the single crystal silicon layer from the substrate 400. Needless to say, a Si transistor such as the transistor MA2 can be manufactured using a bulk-type single crystal silicon substrate. Moreover, the device structure of the transistor MA2 is not limited to the example of FIG. 21. For example, a 3D transistor (e.g., a fin-type transistor or a Tri-gate type transistor) can be employed.

The transistor MA2 includes a Si layer 410, a gate insulating layer 416, and a conductor 420. In the Si layer 410, impurity regions 411, 412, 413, and 414 and a channel formation region 415 are formed. The impurity regions 411 and 412 each function as a source region or a drain region. The impurity regions 413 and 414 each function as a lightly doped drain (LDD) region or an extension region. Here, the conductivity type of each of the impurity regions 411 to 414 is an p-type. The impurity region 412 has a region functioning as a wiring SL. The conductor 420 has a region functioning as a gate electrode of the transistor MA2. Insulating layers 418 and 419 are formed on the side surfaces of the conductor 420. The impurity regions 411 to 414 can be formed in the Si layer 410 in a self-aligned manner by the formation of the insulating layers 418 and 419. The transistor MA2 is covered with an insulating layer 402.

<Transistor MW2>

The transistor MW2 is formed over an insulating layer 403. The transistor MW2 includes an OS layer including a channel formation region, a conductor 435, a conductor 436, conductors 437 and 438, and a gate insulating layer 439. The transistor MW2 is covered with an insulating layer 404 and an insulating layer 405. The OS layer 430 of the transistor MW2 has a three-layer structure of OS layers 431 to 433, which is similar to a three-layer structure of the OS transistor 600 (FIGS. 17A to 17D). The conductor 435 has a region functioning as a back gate electrode of the transistor MW2 and the wiring BGL. The conductor 436 has a region functioning as a gate electrode of the transistor MW2 and the wiring WWL. The conductors 437 and 438 each function as a source electrode or a drain electrode of the transistor MW2. In the steps of forming the conductors 437 and 438, a conductive film for forming these conductors can function as a hard mask for forming a stack of the OS layers 431 and 432.

Oxide semiconductor films for forming the OS layers 431 and 432 are stacked. The conductive film for forming the conductors 437 and 438 (e.g., a tungsten film) is formed over these oxide semiconductor films. The conductive film is etched using a resist mask to form a hard mask. The oxide semiconductor films are etched using the hard mask to form the OS layers 431 and 432. Then, part of a region of the hard mask overlapping with the OS layer 432 is removed to form the conductors 437 and 438.

In the example of FIG. 21, an oxide semiconductor film for forming the OS layer 433 and an insulating film for forming the gate insulating layer 439 as well as a conductive film for forming the conductor 436 are etched using the same resist mask in the steps of forming the conductor 436. Consequently, the OS layer 433 and the gate insulating layer 439 are to be formed in the same region as the conductor 436 when the substrate 400 is seen from the above (FIG. 20).

The insulating layer 403 serving as a base insulating layer of the transistor MW2 is preferably formed using an insulator having a function of preventing diffusion of hydrogen from a lower layer to the OS layer 430. This has an effect of improving reliability of the Si transistor by terminating dangling bonds of silicon in the Si layer by hydrogen. In contrast, as described above, hydrogen serves as an impurity that reduces reliability of the OS layer in the OS transistor. Thus, the insulating layer 403 confines hydrogen in the lower layer and diffuses hydrogen from the lower layer to an upper layer, so that reliability of both the transistor MA2 (Si transistor) and the transistor MW2 (OS transistor) can be improved. The insulating layer 403 can be formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ), for example. In particular, an aluminum oxide film is preferably used because the aluminum oxide film has a high shielding (blocking) effect of preventing penetration of both oxygen and impurities such as hydrogen and moisture.

The device structure of the transistor MA2 is not limited to the example of FIG. 21. For example, the transistor MA2 can be a 3D transistor which is similar to the OS transistor 601 in FIGS. 18A to 18D.

A conductor 450 has a region functioning as a wiring BL. The conductor 450 is electrically connected to the conductor 437 of the transistor MW2 through conductors 451, 452, and 453. The conductor 450 is also electrically connected to the impurity region 411 of the transistor MA2 through the conductors 451 to 453 and conductors 454, 455, and 456.
<Capacitor CS2>

A region in which a conductor 461 and a conductor 462 overlap with each other with a dielectric provided therebetween functions as a capacitor CS2. The conductor 461 has a region functioning as a wiring RWL. The conductor 462 is electrically connected to the gate electrode (the conductor 420) of the transistor MA2 through the conductors 451 to 453. In the layout example of FIG. 20, the area of the capacitor CS2 can be $1F^2$.

According to FIG. 21, it is possible to form the peripheral circuit 210 that controls the memory cell array 214 in the manufacturing process of the transistor MA1 of the memory cell 14 (memory cell array 214). Thus, according to one embodiment of the present invention, a combined memory (combined RAM) which is capable of writing data at low voltage and which has reduced frequency of refresh operation or is refresh free can be provided.

Embodiment 4

In this embodiment, a semiconductor memory device as an example of a semiconductor device and a processing unit that processes data stored in the semiconductor memory device will be described.
<<CPU>>

Figure 22:
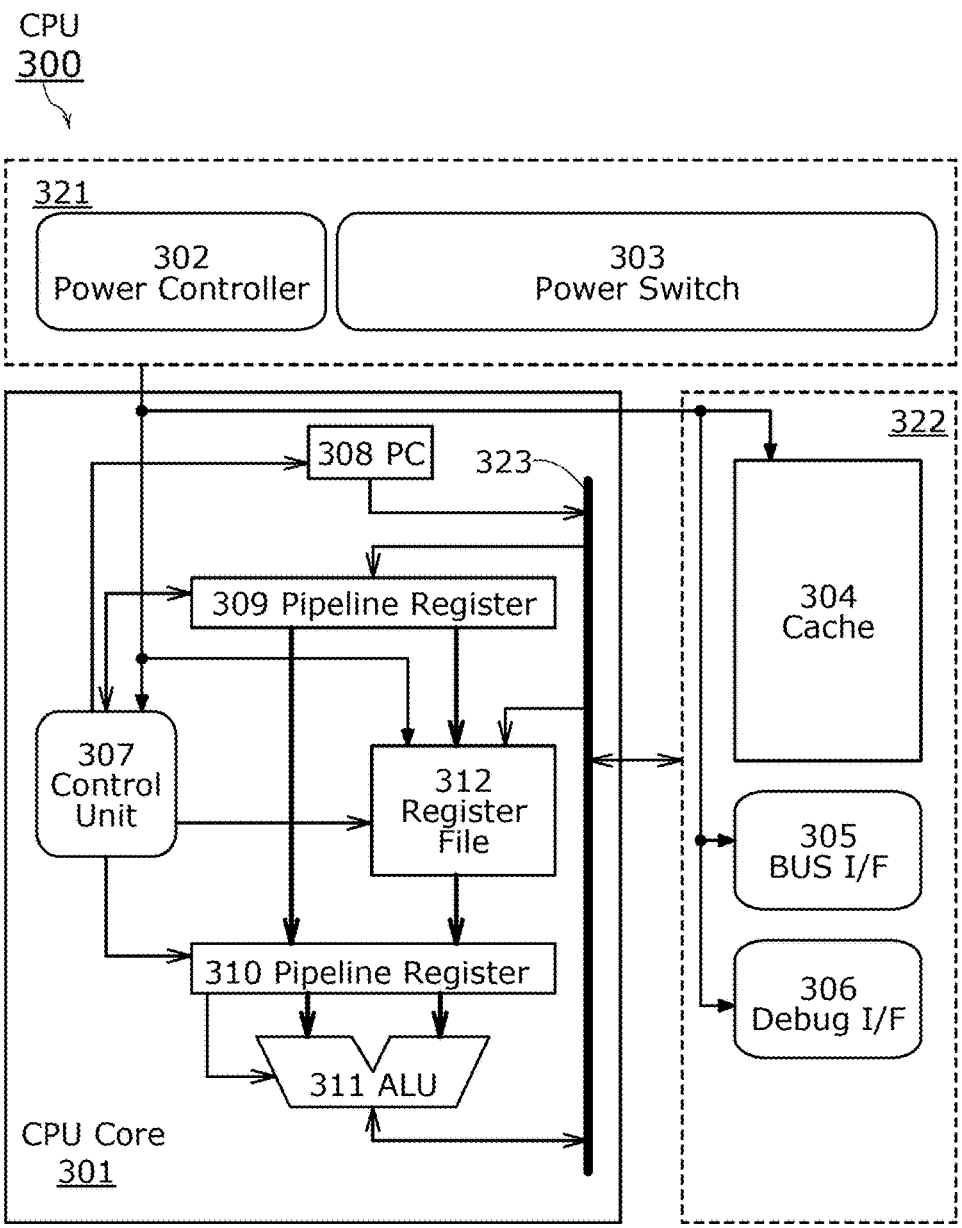
FIG. 22 is a block diagram illustrating an example of a processing unit (CPU).

FIG. 22 illustrates a CPU configuration example. A CPU 300 illustrated in FIG. 22 includes a CPU core 301, a power management unit 321, and a peripheral circuit 322. The power management unit 321 includes a power controller 302 and a power switch 303. The peripheral circuit 322 includes a cache 304 including cache memory, a bus interface (BUS UF) 305, and a debug interface (Debug UF) 306. The CPU core 301 includes a data bus 323, a control unit 307, a program counter (PC) 308, a pipeline register 309, a pipeline register 310, an arithmetic logic unit (ALU) 311, and a register file 312. Data is transmitted between the CPU core 301 and the peripheral circuit 322 such as the cache 304 via the data bus 323.

A semiconductor memory device according to one embodiment of the present invention can be used for the cache 304. Consequently, high-speed operation and low power consumption of the cache can be achieved and thus a semiconductor device that operates more rapidly or a semiconductor device with low power consumption can be provided.

The control unit 307 has functions of decoding and executing instructions contained in a program such as inputted applications by controlling the overall operations of the PC 308, the pipeline registers 309 and 310, the ALU 311, the register file 312, the cache 304, the bus interface 305, the debug interface 306, and the power controller 302.

The ALU 311 has a function of performing a variety of arithmetic operations such as four arithmetic operations and logic operations.

The cache 304 has a function of temporarily storing frequently used data. The PC 308 is a register having a function of storing an address of an instruction to be executed next. Although not illustrated in FIG. 22, the cache 304 includes a cache controller for controlling the operation of the cache memory.

The pipeline register 309 has a function of temporarily storing instruction data.

The register file 312 includes a plurality of registers including a general purpose register and can store data that is read from the main memory, data obtained as a result of arithmetic operations in the ALU 311, or the like.

The pipeline register 310 has a function of temporarily storing data used for arithmetic operations performed in the ALU 311, data obtained as a result of arithmetic operations in the ALU 311, or the like.

The bus interface 305 functions as a path for data between the CPU 300 and devices outside the CPU 300. The debug interface 306 functions as a path of a signal for inputting an instruction to control debugging to the CPU 300.

The power switch 303 has a function of controlling supply of the power supply voltage to circuits other than the power controller 302 in the CPU 300. These circuits belong to several different power domains. The power switch 303 controls whether the power supply voltage is supplied to circuits in the same power domain. The power controller 302 has a function of controlling the operation of the power switch 303. With such a configuration, the CPU 300 can perform power gating. An example of the flow of the power gating operation will be described.

First, the CPU core 301 sets the timing for stopping the supply of the power supply voltage in a register of the power controller 302. Next, an instruction to start power gating is sent from the CPU core 301 to the power controller 302. Then, the registers and the cache 304 in the CPU 300 start data storing. Subsequently, the power switch 303 stops the supply of the power supply voltage to the circuits other than the power controller 302 in the CPU 300. Then, an interrupt signal is input to the power controller 302, thereby starting the supply of the power supply voltage to the circuits included in the CPU 300. Note that a counter may be provided in the power controller 302 to be used to determine the timing of starting the supply of the power supply voltage regardless of input of an interrupt signal. Next, the registers and the cache 304 start data restoration. After that, execution of an instruction is resumed in the control unit 307.

This power gating can be performed in the entire processor or one or more logic circuits included in the processor. The supply of power can be stopped even for a short time. Accordingly, power consumption can be reduced at a fine granularity in space or time.

In the case where the semiconductor memory device of one embodiment of the present invention is used in the cache 304, the cache 304 can retain data for a certain period even when the supply of a power supply voltage is stopped.

Therefore, when power gating is performed, a period during which data of the cache 304 is stored can be secured easily. Even when the supply of the power supply voltage is suddenly stopped, data in the cache 304 can be stored. In the case where data is stored outside the semiconductor memory device 200, the time and power necessary for storing and restoring data is required, while in the case of using the semiconductor memory device of one embodiment of the present invention, such time and power are not required.

<RFID Tag>

An RFID tag is described as an example of a processing unit. The RFID tag is referred to as a wireless tag, an RFID, an RF tag, an ID tag, an IC tag, an IC chip, an electronic tag, a wireless IC tag, and the like. The RFID tag includes a memory circuit, stores necessary data in the memory circuit, and transmits and receives data to/from the outside by using contactless means, for example, wireless communication. With these features, the RFID tag can be used for an individual authentication system in which an object or the like is recognized by reading the individual information, for example.

Figure 23:
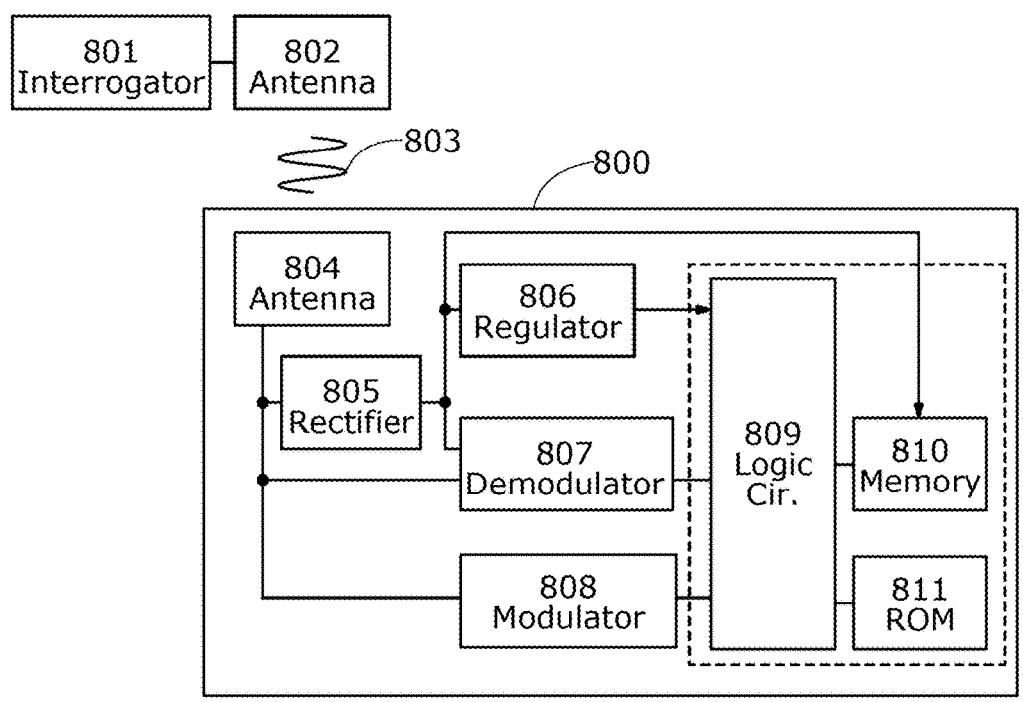
FIG. 23 is a block diagram illustrating an example of a processing unit (RFID tag).

FIG. 23 is a block diagram illustrating an example of an RFID tag. An RFID tag 800 illustrated in FIG. 23 includes an antenna 804, a rectifier circuit 805, a constant voltage circuit 806, a demodulation circuit 807, a modulation circuit 808, a logic circuit 809, a memory circuit 810, and a read-only memory (ROM) 811. Note that decision whether each of these circuits is provided or not can be made as appropriate as needed.

The semiconductor memory device according to one embodiment of the present invention has a device structure capable of employing a combined memory. Therefore, in the RFID tag 800, circuits other than the antenna 804 can be incorporated in one IC chip without complicating the manufacturing process. The antenna 804 whose performance corresponds to the communication zone is mounted on the IC chip. Note that as data transmission methods, the following methods can be given: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RFID tag 800 described in this embodiment. Although the RFID tag 800 in the example of FIG. 23 is a passive tag, it is needless to say that the RFID tag 800 can be an active wireless tag with a built-in battery The semiconductor memory device of one embodiment of the present invention can be used for the memory circuit 810. A writing data potential of the memory circuit 810 can be reduced; therefore, power necessary for the operation of the RFID tag 800 can be reduced, and the communication distance of the RFID tag 800 can be extended.

The antenna 804 exchanges a radio signal 803 with an antenna 802 which is connected to a communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power which is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit which generates a reset signal of the logic circuit 809 by utilizing rise of the stable power supply voltage.

The demodulation circuit 807 demodulates the input alternating signal by envelope detection and generates the demodulated signal. Furthermore, the modulation circuit 808 performs modulation in accordance with data to be output from the antenna 804.

The logic circuit 809 decodes and processes the demodulated signal. The memory circuit 810 holds the input data and includes a row decoder, a column decoder, a memory region, and the like. Furthermore, the ROM 811 stores an identification number (ID) or the like and outputs it in accordance with processing.

In the circuits other than the memory circuit 810, the OS transistors described in Embodiment 2 can be used as n-channel transistors. Since the OS transistors have low off-state currents and high on-state currents, both a low leakage current and high-speed operation can be achieved. Furthermore, the OS transistors may be used as elements having a rectifying function included in the demodulation circuit 807. Since the OS transistors have low off-state currents, the reverse currents of the elements having a rectifying function can be made low, leading to excellent rectification efficiency. Furthermore, since the OS transistors can be formed through the same process, high performance of the RFID tag 800 can be achieved without an increase in process cost.

<Application Examples of RFID>

Figure 24A:
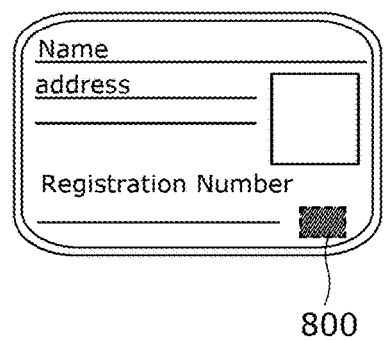
FIGS. 24A to 24F illustrate usage examples of an RFID tag.
Figure 24B:
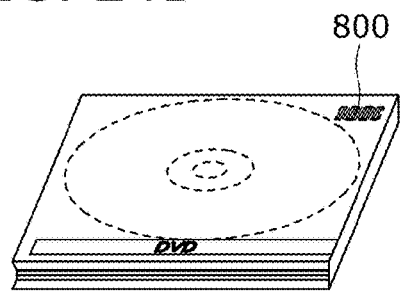
Figure 24C:
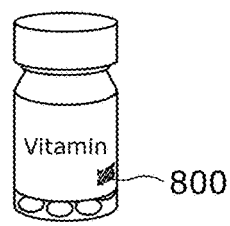
Figure 24D:
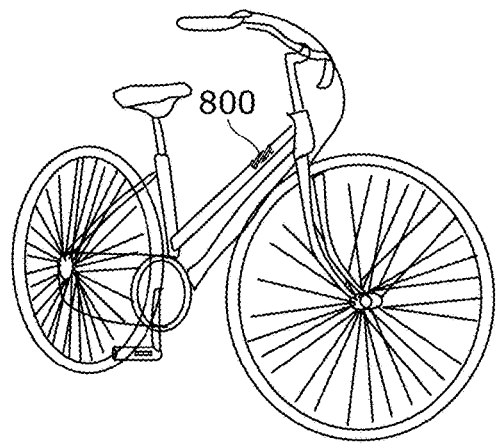
Figure 24E:
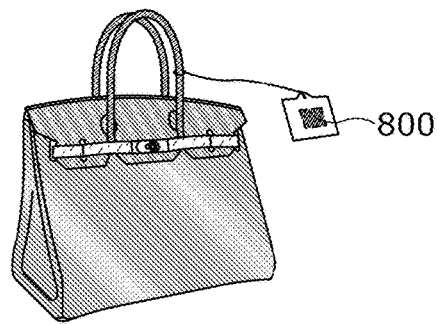
Figure 24F:
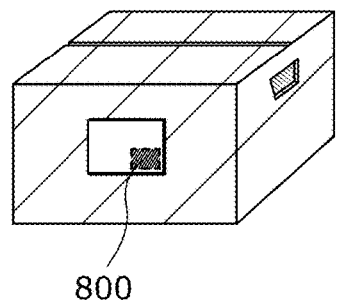

The RFID tag can be used in a wide range of fields. For example, the RFID tag 800 can be provided in objects such as bills, coins, securities, bearer bonds, documents (e.g., driver's licenses or resident's cards, see FIG. 24A), packaging containers (e.g., wrapping paper or bottles, see FIG. 24C), recording media (e.g., DVDs or video tapes, see FIG. 24B), vehicles (e.g., bicycles, see FIG. 24D), personal belongings (e.g., bags or glasses), foods, plants, animals, human bodies, clothing, household goods, medical supplies such as medicine and chemicals, and electronic devices (e.g., liquid crystal display devices, EL display devices, smartphones, cellular phones, clocks, or watches), or tags on objects (see FIGS. 24E and 24F).

The RFID tag 800 is fixed to an object by being attached to a surface of the object or being embedded in the object. For example, the RFID tag 800 is fixed to an object by being embedded in paper of a book, or embedded in an organic resin of a package. Since the RFID tag 800 can be reduced in size, thickness, and weight, it can be fixed to an object without spoiling the design of the object. When the RFID tag 800 is provided in bills, coins, securities, bearer bonds, documents, or the like, an authentication function can be provided to the objects. The use of the authentication function can prevent forgery. Furthermore, when the RFID tag 800 is attached to packaging containers, recording media, personal belongings, foods, clothing, household goods, electronic devices, or the like, a system such as an inspection system or an inventory management system can be used efficiently. When the RFID tag 800 is attached to vehicles, the level of security can be raised.

A variety of kinds of information can be obtained wirelessly by incorporating a sensor unit in the RFID tag 800.

The RFID tag 800 including a temperature sensor circuit and/or a humidity sensor circuit can be used for controlling temperature and/or humidity of the cultural properties, for example.

Although the CPU and the RFID tag are described here as examples of a processing unit, the semiconductor memory device of one embodiment of the present invention can be used for a variety of processing units. For example, the semiconductor memory device of one embodiment of the present invention can also be used for a graphics processing unit (GPU), a programmable logic device (PLD), a digital signal processor (DSP), a microcontroller unit (MCU), and a custom LSI.

Embodiment 5

In this embodiment, examples in which a semiconductor device is used in an electronic component, examples in which a semiconductor device is used in an electronic device including the electronic component, and the like will be described.

<Example of Manufacturing Method of Electronic Component>

Figure 25A:
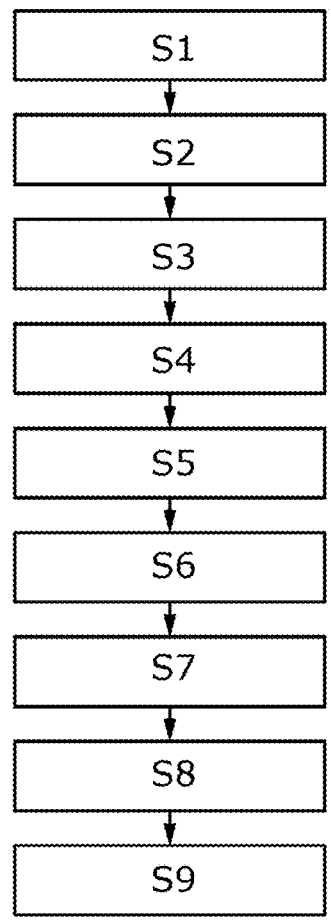
FIG. 25A is a flow chart showing an example of a method of manufacturing an electronic component.

FIG. 25A is a flow chart showing an example of a method for manufacturing a semiconductor device used in an electronic component. The electronic component is also referred to as a semiconductor package or an IC package. This electronic component has a plurality of standards and names depending on a terminal extraction direction and a terminal shape. Thus, examples of the electronic component are described in this embodiment.

A semiconductor device including a transistor can be completed after an assembly process (post-process) by using a plurality of components that can be detached and attached from and to a printed wiring board in combination. The post-process can be finished through each step in FIG. 25A. Specifically, after an element substrate obtained in the preceding process is completed (Step S1), a rear surface of the substrate is ground (Step S2). By thinning the substrate at this stage, the warpage or the like of the substrate in the preceding process is reduced and the component is downsized.

The rear surface of the substrate is ground so that the substrate is divided into a plurality of chips in a dicing process. Then, the divided chips are separately picked up to be mounted on and bonded to a lead frame in a die bonding process (Step S3). In this die bonding process, the chip is bonded to the lead frame by an appropriate method depending on a product, for example, bonding with a resin or a tape. Note that in the die bonding process, the chip may be mounted on an interposer to be bonded.

Then, wire bonding is performed to electrically connect lead of the lead frame to an electrode on the chip with a metal fine line (wire) (Step S4). A silver line or a gold line can be used as the metal fine line. Ball bonding or wedge bonding can be used as the wire bonding.

A molding process is performed to seal the wire bonded chip with an epoxy resin or the like (Step S5). With the molding process, the electronic component is filled with the resin, so that damage to a mounted circuit portion or wire due to mechanical external force can be reduced. Furthermore, deterioration in characteristics due to moisture or dust can be reduced.

Next, plate processing is performed on the lead of the lead frame. After that, the lead is cut and processed (Step S6). This plate processing prevents rust of the lead and facilitates soldering at the time of mounting the chip on a printed wiring board in a later step.

Next, printing (marking) is performed on a surface of the package (Step S7). Through the final inspection process (Step S8), the electronic component is completed (Step S9).

The above electronic component can include the semiconductor device described in the above embodiment. Thus, the electronic component can consume less power and have smaller size.

Figure 25B:
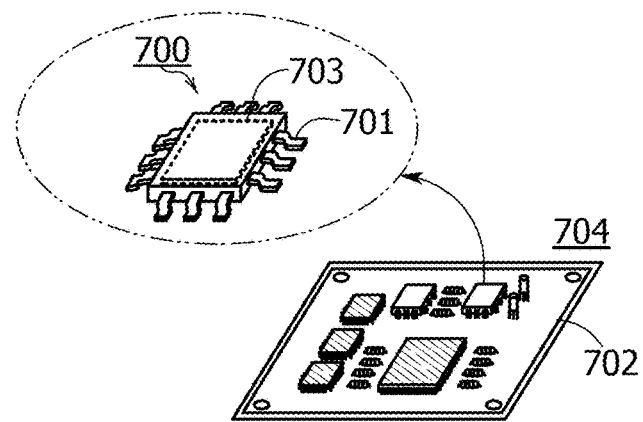
FIG. 25B is a perspective schematic diagram illustrating an example of a structure of the electronic component.

FIG. 25B is a schematic perspective view of the completed electronic component. FIG. 25B illustrates a schematic perspective view of a quad flat package (QFP) as an example of the electronic component. As illustrated in FIG. 25B, an electronic component 700 includes a lead 701 and a circuit portion 703. The electronic component 700 is mounted on a printed wiring board 702, for example. When a plurality of electronic components 700 are used in combination and electrically connected to each other over the printed wiring board 702, the electronic components 700 can be mounted on an electronic device. A completed circuit board 704 is provided in the electronic device or the like. For example, the electronic component 700 can be used as a random access memory storing data and a processing unit that executes a variety of processings, such as a microcontroller unit (MCU) or an RFID tag.

Figure 26:
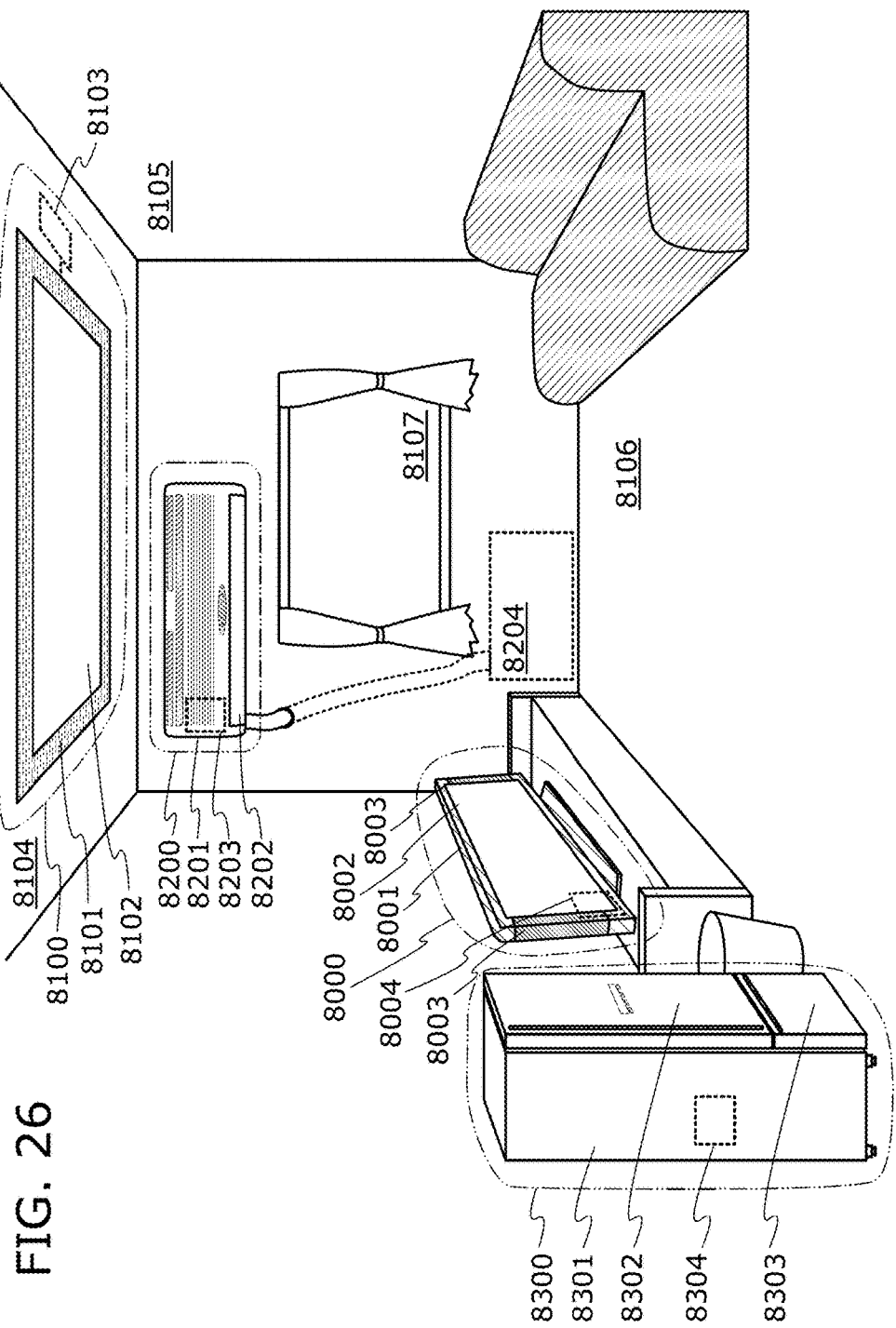
FIG. 26 illustrates examples of electronic devices.

The electronic component 700 can be used as electronic component (an IC chip) of electronic devices in a wide variety of fields, such as digital signal processing, software-defined radio systems, avionic systems (electronic devices used in aircraft, such as communication systems, navigation systems, autopilot systems, and flight management systems), ASIC prototyping, medical image processing, voice recognition, encryption, bioinformatics, emulators for mechanical systems, and radio telescopes in radio astronomy. Specific examples of the electronic devices are illustrated in FIG. 26.

<Electronic Device>

A display device 8000 corresponds to a display device for TV broadcast reception and includes a housing 8001, a display portion 8002, speaker portions 8003, an electronic component 8004, and the like. The electronic component 8004 of one embodiment of the present invention is provided in the housing 8001.

A semiconductor display device such as a liquid crystal display device, a light-emitting device in which a light-emitting element such as an organic EL element is provided in each pixel, an electrophoretic display device, a digital micromirror device (DMD), a plasma display panel (PDP), or a field emission display (FED) can be used for the display portion 8002. Note that the display device includes, in its category, all of information display devices for personal computers, advertisement displays, and the like besides TV broadcast reception. Specific examples of other electronic devices which are provided with a display portion like the display device 8000 are illustrated in FIGS. 28A to 28F.

As illustrated in FIG. 26, a lighting device 8100 is an installation lighting device including a housing 8101, a light source 8102, an electronic component 8103, and the like. As the light source 8102, an artificial light source which emits light artificially by using power can be used. Specifically, an incandescent lamp, a discharge lamp such as a fluorescent lamp, and light-emitting elements such as an LED and an organic EL element are given as examples of the artificial light source. Although FIG. 26 illustrates an example where the lighting device 8100 is provided on a ceiling 8104, the lighting device 8100 may be provided on, for example, a sidewall 8105, a floor 8106, or a window 8107. The lighting device is not limited to an installation lighting device and may be a tabletop lighting device, a portable lighting device, or the like.

An air conditioner including an indoor unit 8200 and an outdoor unit 8204 illustrated in FIG. 26 is an example of an electronic device including an electronic component 8203 of one embodiment of the present invention. Specifically, the indoor unit 8200 includes a housing 8201, an air outlet 8202, the electronic component 8203, and the like. Although FIG. 26 illustrates the case where the electronic component 8203 is provided in the indoor unit 8200, the electronic component 8203 may be provided in the outdoor unit 8204. Alternatively, the electronic component 8203 may be provided in each of the indoor unit 8200 and the outdoor unit 8204. For example, an infrared light sensor or a temperature sensor unit is incorporated in the electronic component 8203 as a sensor unit.

Although FIG. 26 illustrates a separated air conditioner including the indoor unit and the outdoor unit as an example, it may be an air conditioner in which the functions of an indoor unit and an outdoor unit are integrated in one housing.

An electric refrigerator-freezer 8300 includes a housing 8301, a door for a refrigerator 8302, a door for a freezer 8303, an electronic component 8304, and the like. The electronic component 8304 is provided in the housing 8301.

Figure 27A:
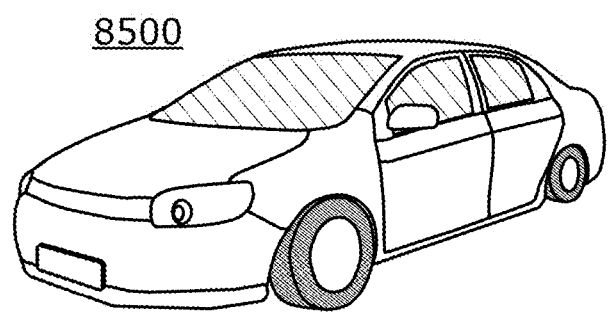
FIGS. 27A and 27B illustrate an example of application to an electric vehicle.
Figure 27B:
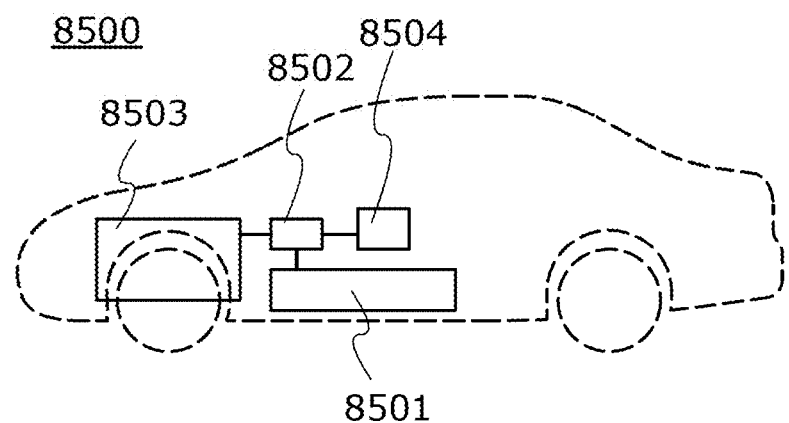

FIG. 26 illustrates examples of household appliances using the electronic component 700. The electronic component 700 can be incorporated in a variety of household appliances such as a microwave oven, a dishwasher, a washing machine, or a vacuum cleaner. Electronic devices in which the electronic component 700 can be incorporated are not limited to household appliances. As described above, the electronic component 700 can be used in a variety of electronic devices used in, for example, industrial robots, assistive robots, planes, ships, and automobiles. FIGS. 27A and 27B illustrate an example of an electric vehicle as an example of such an electronic device.

<Electric Vehicle>

FIG. 27A is an external view illustrating an example of an electric vehicle 8500. The electric vehicle 8500 is equipped with a lithium-ion secondary battery 8501 as illustrated in FIG. 27B. The output of the electric power of the lithium-ion secondary battery 8501 is adjusted by a control circuit 8502 and the electric power is supplied to a driving device 8503. The control circuit 8502 is controlled by a processing unit 8504. For example, the semiconductor memory device of one embodiment of the present invention can be used for a memory circuit such as the control circuit 8502 or the processing unit 8504.

The driving device 8503 includes a DC motor or an AC motor either alone or in combination with an internal-combustion engine. The processing unit 8504 outputs a control signal to the control circuit 8502 based on input data such as data on operation (e.g., acceleration, deceleration, or stop) by a driver of the electric vehicle 8500 or data on driving the electric vehicle 8500 (e.g., data on an upgrade or a downgrade, or data on a load on a driving wheel). The control circuit 8502 adjusts the electric energy supplied from the lithium-ion secondary battery 8501 in accordance with the control signal of the processing unit 8504 to control the output of the driving device 8503.

<Electronic Devices Including Display Portion>

Electronic devices each including a display portion are given below as examples of semiconductor devices. The examples of the electronic device include television sets, laptop personal computers (PCs), tablet PCs, image reproducing devices provided with recording media (typically, devices which reproduce the content of recording media such as digital versatile discs (DVDs) and have displays for displaying reproduced images), mobile phones, smartphones, portable game consoles, portable information terminals (e.g., tablet information terminals), wearable (e.g., glasses-type, goggle-type, watch-type, and bangle-type) information terminals, e-book readers, cameras (e.g., video cameras and digital still cameras), navigation systems, audio reproducing devices (e.g., car audio systems and digital audio players), copiers, facsimiles, printers, multifunction printers, automated teller machines (ATM), and vending machines. FIGS. 28A to 28F illustrate specific examples of these electronic devices.

Figure 28A:
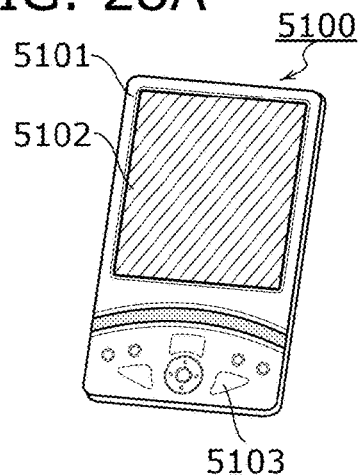
FIGS. 28A to 28F illustrate examples of electronic devices.

FIG. 28A illustrates an example of a portable information terminal. An information terminal 5100 includes a housing 5101, a display portion 5102, operation keys 5103, and the like.

Figure 28B:
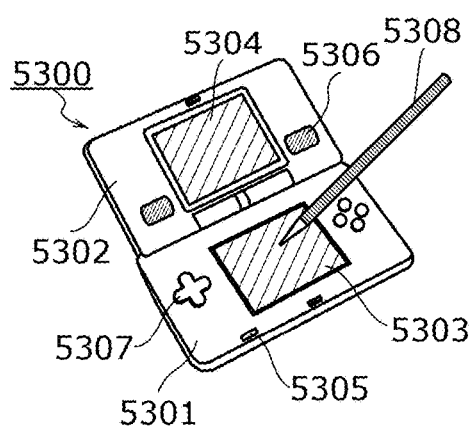

FIG. 28B illustrates an example of a portable game console. A portable game console 5300 includes a housing 5301, a housing 5302, a display portion 5303, a display portion 5304, a microphone 5305, a speaker 5306, an operation key 5307, a stylus 5308, and the like. Although the portable game console 5300 includes two display portions (5303 and 5304), the number of display portions are not limited to two, and may be one or three or more.

Figure 28C:
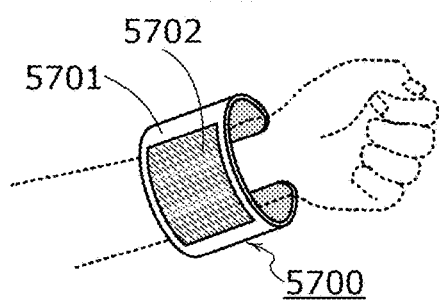

FIG. 28C illustrates an example of a bangle-type information terminal An information terminal 5700 includes a housing 5701, a display portion 5702, and the like. The display portion 5702 is supported by the housing 5701 with a curved surface. A display panel formed with a flexible substrate is provided in the display portion 5702, whereby the information terminal 5700 can be a user-friendly information terminal that is flexible and lightweight.

Figure 28D:
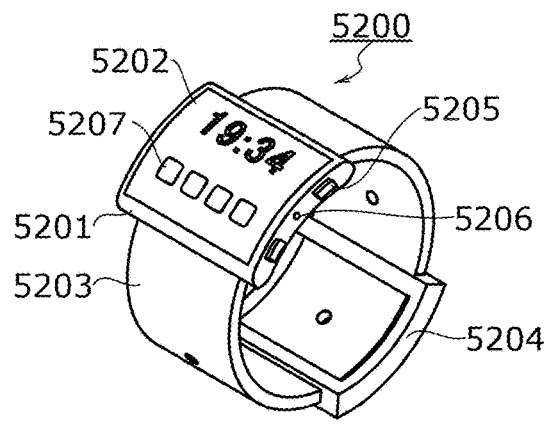

FIG. 28D illustrates an example of a watch-type information terminal. An information terminal 5200 includes a housing 5201, a display portion 5202, a band 5203, a buckle 5204, operation buttons 5205, an input output terminal 5206, and the like. The information terminal 5200 is capable of executing a variety of applications such as mobile phone calls, e-mailing, viewing and editing texts, music reproduction, Internet communication, and computer games.

The display surface of the display portion 5202 is bent, and images can be displayed on the bent display surface. The display portion 5202 includes a touch sensor, and operation can be performed by touching the screen with a finger, a stylus, or the like. For example, by touching an icon 5207 displayed on the display portion 5202, an application can be started. With the operation button 5205, a variety of functions such as time setting, ON/OFF of the power, ON/OFF of wireless communication, setting and cancellation of a manner mode, and setting and cancellation of a power saving mode can be performed. For example, the functions of the operation button 5205 can be set by setting the operation system incorporated in the information terminal 5200.

The information terminal 5200 can employ near field communication conformable to a communication standard. In that case, for example, mutual communication between the information terminal 5200 and a headset capable of wireless communication can be performed, and thus hands-free calling is possible. Moreover, the information terminal 5200 includes the input output terminal 5206, and data can be directly transmitted to and received from another information terminal via a connector. Charging via the input output terminal 5206 is possible. Note that the charging operation may be performed by wireless power feeding without using the input output terminal 5206.

Figure 28E:
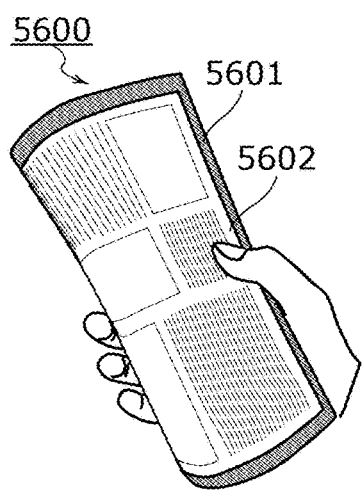

FIG. 28E illustrates an example of an e-book reader. An e-book reader 5600 includes a housing 5601, a display portion 5602, and the like. A display panel formed with a flexible substrate is provided in the display portion 5602. Thus, the e-book reader 5600 can be a user-friendly e-book reader that is flexible and lightweight.

Figure 28F:

FIG. 28F illustrates an example of an information terminal. An information terminal 5900 includes a housing 5901, a display portion 5902, a microphone 5907, a speaker portion 5904, a camera 5903, an external connection portion 5906, an operation button 5905, and the like. A display panel formed with a flexible substrate is provided in the display portion 5902. The information terminal 5900 can be used as, for example, a smartphone, a mobile phone, a tablet information terminal, a tablet PC, or an e-book reader.

Example 1

Embodiment 1 and the like show that the use of the OS transistor as a writing transistor achieves a memory cell having excellent performance such as high speed writing, low power consumption, or favorable retention characteristics. This example shows specific performance of a memory cell based on measurement results of OS transistor characteristics and characteristic data of an OS transistor, which were obtained by simulation to describe capability of achieving the memory cell having excellent performance.

FIGS. 16A and 16B show Id-Vg characteristics of an OS transistor. The horizontal axis indicates the gate potential Vg of the OS transistor, and the vertical axis indicates the drain current Id thereof. In FIG. 16A, the solid curve indicates a measured value, and the dotted curve indicates a calculated value obtained from a simulation program with integrated circuit emphasis (SPICE) model. The OS transistor has a channel length L of 60 nm, a channel width W of 40 nm, a drain potential of 0.4 V, and a source potential of 0 V.

FIG. 16B shows measured Id-Vg characteristics of an OS transistor. The measured data in FIG. 16B are those of 250 thousand transistors electrically connected to each other in parallel. Each OS transistor has a channel length L of 50 nm and a channel width W of 40 nm. That is, the Id-Vg characteristics in FIG. 16B corresponds to those of an OS transistor having a channel length L of 60 nm and a channel width W of 10 mm. In FIG. 16B, the measurement was performed at a drain potential Vd of 1 V and a source potential of 0 V.

In each of the OS transistors which obtain measured data shown in FIGS. 16A and 16B, an oxide semiconductor layer is formed under conditions for forming a CAAC-OS.

According to FIG. 16B, an S value is substantially constant up to the lower measurement limit of 100 fA. This indicates that, in Id-Vg characteristics of an OS transistor having a channel width W of 40 nm, an S value is substantially constant until a drain current Id (off-state current) of approximately 40 zA. From the measurement result of Id-Vg characteristics of another OS transistor, the off-state current was much lower and the off-state current per micrometer of the channel length at 85° C. was estimated to be lower than or equal to 1 zA.

Thus, in the Id-Vg curve (solid curve) which was obtained from the measurement result in FIG. 16A, a region in which a drain current Id is lower than or equal to the lower measurement limit can be regarded as a subthreshold region with a substantially constant S value as shown by the SPICE model (dotted curve). On the assumption that such a subthreshold region exists, the on-state current, off-state current, and S value of the OS transistor (channel length L of 60 nm and channel width W of 40 nm) were calculated on the basis of the measured value of FIG. 16A. The on-state current (Id) was 3 nA or more at Vg of 1.2 V and Vd of 0.4 V, and the off-state current (Id) was approximately 1 zA at Vg of 0 V and Vd of 0.4 V. The S value was calculated to be approximately 77 mV/dec. On the basis of these calculated values, the on-state current and off-state current of the OS transistor were calculated in accordance with the driving conditions of the writing transistor and then design specifications of the memory cell were obtained. Tables 3 and 4 show the results. Note that for easy understanding of this example, Tables 3 and 4 show the design specifications of the memory cell 11 (FIGS. 4A and 4B) which are similar to those of Tables 1 and 2; however, these design specifications can be used as those of another memory cell (e.g., the memory cell 10, 12, 13, 14, or 15).

TABLE 3

|  |  | E1 |
|---|---|---|
| Writing time Twr1 |  | ≤10 ns |
| Retention time Trt1 |  | ≥1 s |
| Coupling capacitor CCfn1 |  | ≤300 aF |
|  |  | ≥5 aF |
| Transistor MW1 | On-state current Iw$_{on}$ | ≥0.5 nA |
|  | On/off ratio | ≥1 × 10$^9$ |

(Design Specifications E1)

Design specifications E1 shown in Table 3 are values calculated in such a manner that the memory cell 11 operates with required writing time Twr1 and retention time Trt1 on the basis of the characteristics of the OS transistor obtained from the measured value and calculated value of the Id-Vg characteristics in FIG. 16A. A potential in the writing operation of the wiring WWL (hereinafter the potential is referred to as "VH$_{ww}$") is a potential for turning on the transistor MW1. The on-state current Iw$_{on}$ represents a minimum value of a drain current Iw that flows through the transistor MW1 during a period in which the potential of the wiring WWL is VH$_{ww}$ (a writing operation period). Specifically, it is a minimum value of the on-state current Iw$_{on}$ of the transistor MW1 immediately after termination of the writing operation. In the design specifications E1, the on-state current Iw$_{on}$ of the transistor MW1 immediately after termination of the writing operation is required to be 0.5 nA or more. To achieve the retention time Trt1 of one second or longer, the on/off ratio is required to be higher than or equal to 1×10$^9$.

To shorten the writing time Twr1, the coupling capacitance CCfn1 is reduced. For example, in the case of Twr1≤5 ns, 5 aF≤CCfn1≤50 aF may be satisfied, and to charge the coupling capacitance CCfn1 of 50 aF within 5 ns, the on-state current Iw$_{on}$ may be set to 3 nA or more.

To lengthen the retention time Trt1, the on/off ratio may be increased. For example, the on/off ratio may be higher than or equal to 1×10$^{11}$ to satisfy Trt1≥1 s and may be higher than or equal to 1×10$^{12}$ to satisfy Trt1≥1 h.

As described in Embodiment 1 and the like, one embodiment of the present invention is made in view of the following technical idea: the potential VH$_{ww}$ is lowered without decreasing the writing speed data by writing data to a small capacitor (coupling capacitance CCfn1) with a low on-state current Iw$_{on}$, resulting in reducing power consumption of a memory cell. Therefore, the potential VH$_{ww}$ is preferably lower than or equal to 2 V. The potential $VH_{ww}$ can be lower than or equal to 1.9 V, lower than or equal to 1.8 V, or lower than or equal to 1.7 V and higher than or equal to 1 V, higher than or equal to 1.2 V, or higher than or equal to 1.5 V. For example, the power supply system can be simplified when the potential $VH_{ww}$ is the same as the high power supply potential VDD of the semiconductor memory device in which the memory cell 11 is incorporated.

To drive the semiconductor memory device with the potential $VH_{ww}$ of lower than or equal to 2 V, the technology node of the transistor MW1 is set to be shorter than 100 nm. Thus, the channel length L of the transistor MW1 is shorter than 100 nm. The channel length L of the transistor MW1 is preferably shorter than or equal to 60 nm, shorter than or equal to 50 nm, or shorter than or equal to 30 nm. The channel width W of the transistor MW1 is shorter than 100 nm. The channel width W is preferably shorter than or equal to 60 nm, shorter than or equal to 40 nm, or shorter than or equal to 30 nm. The lower limits of the channel length and the channel width of the transistor MW1 depend on the manufacturing technique of the OS transistor, which can be longer than or equal to 15 nm and longer than or equal to 18 nm, respectively.

The higher the on-state current $Iw_{on}$ is, the larger the allowable capacitance of the coupling capacitance CCfn1 is, as long as the writing time Twr1 is the same. In contrast, the larger the capacitance of the coupling capacitance CCfn1 is, the longer the writing time Twr1 and the retention time Trt1 are, as long as the same condition applies to the on-state current $Iw_{on}$ and the on/off ratio.

The capacitance of 300 aF which is ten times as large as that of a general DRAM (30 aF) can be allowed when the writing time Twr1 is 10 ns. The capacitance of the coupling capacitance CCfn1 depends on the size of the parasitic capacitance of the node FN1 and further on the layout or the like of the memory cell 11; therefore, it is considered to be difficult to set the coupling capacitance CCfn1 to be less than 5 aF. Therefore, in the memory cell 11 having the coupling capacitance CCfn1 which is greater than or equal to 5 aF, the on-state current $Iw_{on}$ is required to be higher than or equal to 0.5 nA to set the writing time Twr1 to be shorter than or equal to 10 ns. Moreover, to set the retention time Tft1 to be longer than or equal to one second, the on/off ratio is estimated to be higher than or equal to $1 \times 10^9$.

As shown in Table 3, the coupling capacitance CCfn1 is set to be greater than or equal to 5 aF and less than or equal to 300 aF to achieve the retention time longer than or equal to one second and the writing time shorter than or equal to 10 ns. To shorten the writing time, the capacitance of the coupling capacitance CCfn1 is preferably reduced as much as possible. The capacitance can be less than or equal to 200 aF, less than or equal to 100 aF, less than or equal to 60 aF, or less than or equal to 50 aF. In the case where the capacitor CS1 is provided intentionally, the capacitance can be less than or equal to 200 aF or less than or equal to 5 aF. To shorten the writing time, the capacitance of the capacitor CS1 is preferably reduced as much as possible. The capacitance can be less than or equal to 150 aF, less than or equal to 80 aF, less than or equal to 40 aF, or less than or equal to 10 aF.

In the case where the capacitor CS1 is intentionally provided, the equivalent oxide (here, $SiO_2$) thickness (EOT) of a dielectric of the capacitor CS1 is greater than or equal to 3 nm. The thinner the dielectric is, the more the capacitor CS1 can be reduced in size. Therefore, the thickness (EOT) of the dielectric is preferably less than or equal to 20 nm, or further preferably less than or equal to 10 nm. Although the size of the capacitor CS1 depends on its capacitance, when the thickness (EOT) of the dielectric is 10 nm, it is 150 nm×150 nm at a capacitance of 80 aF, 100 nm×10 nm at a capacitance of 35.4 aF, and 50 nm×50 nm at a capacitance of 9 aF.

Table 4 shows that the characteristics required for the transistor MW1 in the design specifications E1 ($Iw_{on}$ and on/off ratio) can be achieved by using an OS transistor as the transistor MW1. Table 4 shows three specific specification examples D1, D2, and D3 in the case where the transistor MW1 is an OS transistor with a technology node of 60 nm (a channel length L of 60 nm and a channel width W of 40 nm)

TABLE 4

|  |  | D1 | D2 | D3 |
|---|---|---|---|---|
| Coupling capacitance CCfn1 |  | 80 aF | 35.4 aF | approx. 9 aF |
| Transistor MW1 | Technology node |  | 60 nm |  |
|  | Channel length L |  | 60 nm |  |
|  | Channel width W |  | 40 nm |  |
|  | On-state current $Iw_{on}$ | ≥10 nA (Vgs = 1.2 V, Vd = 0.1 V) | ≥10 nA (Vgs = 1.3 V, Vd = 0.1 V) | ≥10 nA (Vgs = 1.3 V, Vd = 0.1 V) |
|  | Off-state current $Iw_{off}$ | approx. 1 zA (Vgs = 0 V, Vd = 1 V) | approx. 1 zA (Vgs = 0 V, Vd = 1 V) | approx. 1 zA (Vgs = 0 V, Vd = 1 V) |
|  | S value | 77 mV/dec | 77 mV/dec | 77 mV/dec |
|  | On/off ratio | ≥3 × $10^{12}$ (Vgs = 0 V/1.2 V, Vd = 0.1 V) | ≥1 × $10^{13}$ (Vgs = 0 V/1.3 V, Vd = 0.1 V) | ≥1 × $10^{13}$ (Vgs = 0 V/1.3 V, Vd = 0.1 V) |
| VDD |  | 1.8 V | 1.8 V | 1.7 V |
| $VH_{ww}$ |  | 1.8 V | 1.8 V | 1.7 V |
| VH1 |  | 0.5 V | 0.5 V | 0.5 V |
| VH3 |  | 0.3 V | 0.3 V | 0.3 V |
| Writing time Twr1 |  | 4 ns | approx. 2 ns | 3 ns |
| Retention time Trt1 |  | 16000 s | approx. 7000 s | approx. 1800 s |

The potential VDD is a high power supply potential of the semiconductor memory device 200 and can be higher than or equal to 1 V and lower than or equal to 2 V, for example. The potential $VH_{ww}$ is a potential applied to the wiring WW1 in the writing operation and is set to the same potential as VDD. The potential VH1 is a potential of the node FN1 immediately after termination of the writing operation, and the potential VH3 is a potential of the node FN1 at the termination of the retention period (at the start of the reading operation) (see FIG. 5). In the specification examples D1 to D3, the allowable amount of decrease in potential of the node FN1 in the data retention state was set to 0.2 V, and the retention time Trt1 was calculated as time it takes to lower the potential of the node FN1 from 0.5 V to 0.3 V. The on-state current $Iw_{on}$ is a drain current Id when a gate-source voltage Vgs is obtained by $VH_{ww}$–VH1 and a drain potential is 1 V. The off-state current $Iw_{off}$ is a drain current Id when a gate-source voltage Vgs is 0 V and a drain potential is 1 V. The on/off ratio was obtained from $Iw_{off}2/Iw_{on}$. Note that the off-state current $Iw_{off}2$ is a drain current Id when a gate-source voltage Vgs is 0 V and a drain potential is 0.1 V. The writing time Twr1 was obtained from time needed to raise the potential of the node FN1 from 0 V to 0.5 V (=VH1) by charging the coupling capacitance CCfn1 with the on-state current $IW_{on}$.

As shown in Table 4, with the use of an OS transistor with a technology node of 60 nm as the transistor MW1, the writing time can be shorter than or equal to 5 ns (shorter than or equal to 4 ns) and the retention time can be longer than or equal to 30 m. even with a writing operation potential lower than or equal to 2 V (lower than or equal to 1.8 V).

Information about this specification and the like is described below.

In one embodiment of the present invention, a variety of switches can be used as a switch. The switch is conducting or not conducting (is turned on or off) to determine whether current flows. Alternatively, the switch has a function of determining and changing a current path. For example, the switch has a function of determining whether current can flow through a path 1 or a path 2 and switching the paths. Examples of the switch include an electrical switch and a mechanical switch. That is, any element can be used as a switch as long as it can control current, without limitation to a certain element. Examples of the switch include a transistor (e.g., a bipolar transistor or a metal-oxide-semiconductor (MOS) transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined. An example of a mechanical switch is a switch formed using a micro electro mechanical system (MEMS) technology, such as a digital micromirror device (DMD). The switch includes an electrode that can be moved mechanically, and operates to control conduction and non-conduction with the movement of the electrode.

In one embodiment of the present invention, there is no particular limitation on the device structure of a capacitor intentionally provided as an element. For example, either a MIM capacitor or a MOS capacitor can be used.

In this specification and the like, the term "parallel" indicates that an angle formed between two straight lines is −10° to 10°, and accordingly includes the case where the angle is −5° to 5°. In addition, the term "perpendicular" indicates that an angle formed between two straight lines is 80° to 100°, and accordingly includes the case where the angle is 85° to 95°.

For example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to part of Z1 and another part of Z1 is directly connected to X while a drain (or a second terminal or the like) of the transistor is directly connected to part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X the source (or the first terminal or the like) of the transistor, the drain (or the second terminal or the like) of the transistor, and Y are electrically connected to each other in that order," "a source (or a first terminal or the like) of a transistor is electrically connected to X a drain (or a second terminal or the like) of the transistor is electrically connected to Y, and X the source (or the first terminal or the like) of the transistor, the drain (or the second terminal or the like) of the transistor, and Y are electrically connected to each other in that order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are connected in that order." When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, and Z2 each denote an object (e.g., a device, an element, a circuit, a wiring, an electrode, a terminal, a conductive film, and a layer).

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention is clear even when connection portions are not specified. Furthermore, in the case where a connection portion is disclosed in this specification and the like, it can be determined that one embodiment of the invention in which a connection portion is not specified is disclosed in this specification and the like, in some cases. In particular, in the case where the number of portions to which the terminal is connected is plural, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least the function of a circuit is specified. In other words, one embodiment of the present invention is clear when the function of a circuit is specified. Furthermore, it can be determined that one embodiment of the present invention in which a function is specified is disclosed in this specification and the like in some cases. Thus, when the connection portion of a circuit is specified, the circuit is disclosed as one embodiment of the invention even if a function is not specified, and one embodiment of the invention can be constituted. Alternatively, when the function of a circuit is specified, the circuit is disclosed as one embodiment of the invention even when a connection portion is not specified, and one embodiment of the invention can be constituted.

Note that content that is not specified in this specification and the like can be excluded from one embodiment of the invention. Alternatively, when the range of a value that is defined by the maximum and minimum values is described, part of the range is approximately narrowed or part of the range is removed, whereby one embodiment of the invention excluding part of the range can be constituted. In this manner, it is possible to specify the technical scope of one embodiment of the present invention so that a conventional technology is excluded, for example.

As a specific example, a diagram of a circuit including first to fifth transistors is illustrated. In that case, it can be specified that the circuit does not include a sixth transistor in the invention. It can be specified that the circuit does not include a capacitor in the invention. It can be specified that the circuit does not include a sixth transistor with a particular connection in the invention. It can be specified that the circuit does not include a capacitor with a particular connection in the invention. For example, it can be specified that a sixth transistor whose gate is connected to a gate of the third transistor is not included in the invention. It can be specified that a capacitor whose first electrode is connected to the gate of the third transistor is not included in the invention, for example.

As another specific example, when the expression "voltage is preferably higher than or equal to 3 V and lower than or equal to 10 V" is used to describe a given value, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention. Note that, for example, it can be specified that the voltage is higher than or equal to 5 V and lower than or equal to 8 V in the invention. For example, it can be specified that the voltage is approximately 9 V in the invention. For example, it can be specified that the voltage is higher than or equal to 3 V and lower than 9 V and higher than 9 V and lower than or equal to 10 V in the invention. Note that even when the expression "a value is preferably in a certain range" or "a value preferably satisfies a certain condition" is used, for example, the value is not limited to the description. In other words, the description of a value that includes a term "preferable", "preferably", or the like does not necessarily limit the value.

As another specific example, when the expression "voltage is preferably 10 V" is used to describe a given value, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention.

As another specific example, when the expression "a film is an insulating film" is used to describe properties of a material, for example, it can be specified that the case where the insulating film is an organic insulating film is excluded from one embodiment of the invention. For example, it can be specified that the case where the insulating film is an inorganic insulating film is excluded from one embodiment of the invention. For example, it can be specified that the case where the insulating film is a conductive film is excluded from one embodiment of the invention. For example, it can be specified that the case where the insulating film is a semiconductor film is excluded from one embodiment of the invention.

As another specific example, when the expression "a film is provided between an A film and a B film" is used to describe a given stacked-layer structure, for example, it can be specified that the case where the film is a stacked film of four or more layers is excluded from the invention. For example, it can be specified that the case where a conductive film is provided between the A film and the film is excluded from the invention.

Note that various people can implement one embodiment of the invention described in this specification and the like. However, different people may be involved in the implementation of the invention. For example, in the case of a transmission/reception system, the following case is possible: Company A manufactures and sells transmitting devices, and Company B manufactures and sells receiving devices. As another example, in the case of a light-emitting device including a transistor and a light-emitting element, the following case is possible: Company A manufactures and sells semiconductor devices including transistors, and Company B purchases the semiconductor devices, provides light-emitting elements for the semiconductor devices, and completes light-emitting devices.

For example, in the case of a transmission/reception system, even when this specification and the like does not include a description of the case where a transmitting device is used alone or the case where a receiving device is used alone, one embodiment of the invention can be constituted by only the transmitting device and another embodiment of the invention can be constituted by only the receiving device. Those embodiments of the invention are clear and can be regarded as being disclosed in this specification and the like. Another example is as follows: in the case of a light-emitting device including a transistor and a light-emitting element, even when this specification and the like does not include a description of the case where a semiconductor device including the transistor is used alone or the case where a light-emitting device including the light-emitting element is used alone, one embodiment of the invention can be constituted by only the semiconductor device including the transistor and another embodiment of the invention can be constituted by only the light-emitting device including the light-emitting element. Those embodiments of the invention are clear and can be regarded as being disclosed in this specification and the like.

Note that in this specification and the like, in a diagram or a text described in one embodiment, part of the diagram or the text is taken out, and one embodiment of the invention can be constituted. Thus, in the case where a diagram or a text related to a certain portion is described, the content taken out from part of the diagram or the text is also disclosed as one embodiment of the invention, and one embodiment of the invention can be constituted. One embodiment of the invention is clear. Therefore, for example, in a diagram or a text in which one or more active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like are described, part of the diagram or the text is taken out, and one embodiment of the invention can be constituted. For example, M circuit elements (e.g., transistors or capacitors) (M is an integer, where M<N) are taken out from a circuit diagram in which N circuit elements (e.g., transistors or capacitors) (N is an integer) are provided, and one embodiment of the invention can be constituted. As another example, M layers (M is an integer, where M<N) are taken out from a cross-sectional view in which N layers (N is an integer) are provided, and one embodiment of the invention can be constituted. As another example, M elements (M is an integer, where M<N)

are taken out from a flow chart in which N elements (N is an integer) are provided, and one embodiment of the invention can be constituted. As another example, it is possible to take out some given elements from a sentence "A includes B, C, D, E, or F" and constitute one embodiment of the invention, for example, "A includes B and E", "A includes E and F", "A includes C, E, and F", or "A includes B, C, D, and E".

Note that in this specification and the like, in a diagram or a text described in one embodiment, in the case where at least one specific example is described, it will be readily appreciated by those skilled in the art that a broader concept of the specific example can be derived. Thus, in the diagram or the text described in one embodiment, in the case where at least one specific example is described, a broader concept of the specific example is disclosed as one embodiment of the invention, and one embodiment of the invention can be constituted. One embodiment of the invention is clear.

Note that in this specification and the like, content described in at least a diagram (or may be part of the diagram) is disclosed as one embodiment of the invention, and one embodiment of the invention can be constituted. Thus, when certain content is described in a diagram, the content is disclosed as one embodiment of the invention even when the content is not described with a text, and one embodiment of the invention can be constituted. Similarly, part of a diagram that is taken out from the diagram is disclosed as one embodiment of the invention, and one embodiment of the invention can be constituted. One embodiment of the invention is clear.

Note that content (or may be part of the content) described in one embodiment may be applied to, combined with, or replaced by different content (or may be part of the different content) described in the embodiment and/or content (or may be part of the content) described in one or more different embodiments. Note that in each embodiment, content described in the embodiment is content described with reference to a variety of diagrams or content described with a text described in the specification. Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in another embodiment or other embodiments, another diagram can be formed.

This application is based on Japanese Patent Application serial no. 2014-056150 filed with Japan Patent Office on Mar. 19, 2014, the entire contents of which are hereby incorporated by reference.

What is claimed is:

1. A semiconductor memory device comprising:
a first memory cell and a second memory cell adjacent to the first memory cell, each of the first memory cell and the second memory cell comprising:
   a first transistor, a gate of the first transistor being electrically connected to a first wiring, one of a source and a drain of the first transistor being electrically connected to a fourth wiring, and the other of the source and the drain of the first transistor being electrically connected to a node;
   a second transistor, a gate of the second transistor being electrically connected to the node, one of a source and a drain of the second transistor being electrically connected to a third wiring, and the other of the source and the drain of the second transistor being electrically connected to a fifth wiring; and
   a capacitor, one electrode of the capacitor being electrically connected to the node, and the other electrode of the capacitor being electrically connected to a second wiring,
wherein a channel formation region of the first transistor comprises an oxide semiconductor layer,
wherein each of a channel length and a channel width of the first transistor is shorter than 100 nm,
wherein a maximum potential of the first wiring is lower than or equal to 2 V, and
wherein electrostatic capacitance of the capacitor is greater than or equal to 5 aF and less than or equal to 200 aF.

2. The semiconductor memory device according to claim 1, wherein the first transistor comprises a pair of gates with the oxide semiconductor layer provided therebetween.

3. The semiconductor memory device according to claim 1, wherein the second transistor is a p-channel transistor.

4. The semiconductor memory device according to claim 1, wherein the third wiring is shared by the first memory cell and the second memory cell.

5. A semiconductor memory device comprising:
a first memory cell and a second memory cell adjacent to the first memory cell, each of the first memory cell and the second memory cell comprising:
   a first transistor, a gate of the first transistor being electrically connected to a first wiring, one of a source and a drain of the first transistor being electrically connected to a fourth wiring, and the other of the source and the drain of the first transistor being electrically connected to a node;
   a second transistor, a gate of the second transistor being electrically connected to the node, and one of a source and a drain of the second transistor being electrically connected to a third wiring; and
   a third transistor, a gate of the third transistor being electrically connected to a second wiring, and one of a source and a drain of the third transistor being electrically connected to the other of the source and the drain of the second transistor,
wherein a channel formation region of the first transistor comprises an oxide semiconductor layer,
wherein each of a channel length and a channel width of the first transistor is shorter than 100 nm, and
wherein a maximum potential of the first wiring is lower than or equal to 2 V.

6. The semiconductor memory device according to claim 5, wherein the first transistor comprises a pair of gates with the oxide semiconductor layer provided therebetween.

7. The semiconductor memory device according to claim 5, wherein the other of the source and the drain of the third transistor is electrically connected to the fourth wiring.

8. The semiconductor memory device according to claim 5, wherein the other of the source and the drain of the third transistor is electrically connected to a fifth wiring.

9. The semiconductor memory device according to claim 5, wherein each of the second transistor and the third transistor is a p-channel transistor.

10. The semiconductor memory device according to claim 5, wherein the third wiring is shared by the first memory cell and the second memory cell.

11. A semiconductor memory device comprising:
a first memory cell and a second memory cell adjacent to the first memory cell, each of the first memory cell and the second memory cell comprising:
   a first transistor, a gate of the first transistor being electrically connected to a first wiring, one of a source and a drain of the first transistor being electrically connected to a fourth wiring, and the other of the source and the drain of the first transistor being electrically connected to a node;

a second transistor, a gate of the second transistor being electrically connected to the node, and one of a source and a drain of the second transistor being electrically connected to a third wiring;

a third transistor, a gate of the third transistor being electrically connected to a second wiring, and one of a source and a drain of the third transistor being electrically connected to the other of the source and the drain of the second transistor; and a capacitor, one electrode of the capacitor being electrically connected to the node, and the other electrode of the capacitor being electrically connected to a sixth wiring, wherein a channel formation region of the first transistor comprises an oxide semiconductor layer, wherein each of a channel length and a channel width of the first transistor is shorter than 100 nm, wherein a maximum potential of the first wiring is lower than or equal to 2 V, and wherein electrostatic capacitance of the capacitor is greater than or equal to 5 aF and less than or equal to 200 aF.

12. The semiconductor memory device according to claim 11, wherein the first transistor comprises a pair of gates with the oxide semiconductor layer provided therebetween.

13. The semiconductor memory device according to claim 11, wherein the other of the source and the drain of the third transistor is electrically connected to the fourth wiring.

14. The semiconductor memory device according to claim 11, wherein the other of the source and the drain of the third transistor is electrically connected to a fifth wiring.

15. The semiconductor memory device according to claim 11, wherein each of the second transistor and the third transistor is a p-channel transistor.

16. The semiconductor memory device according to claim 11, wherein the third wiring is shared by the first memory cell and the second memory cell.

* * * * *